(12) United States Patent
Maki et al.

(10) Patent No.: US 7,361,865 B2
(45) Date of Patent: Apr. 22, 2008

(54) HEATER FOR HEATING A WAFER AND METHOD FOR FABRICATING THE SAME

(75) Inventors: Seiichirou Maki, Kokubu (JP); Hiroshi Takenouchi, Kokubu (JP); Hiroyuki Masuyama, Kokubu (JP); Tsunehiko Nakamura, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 11/138,943

(22) Filed: May 25, 2005

(65) Prior Publication Data

US 2005/0252903 A1 Nov. 17, 2005

(30) Foreign Application Priority Data

| May 26, 2004 | (JP) | ............................. P2004-156188 |
| Jun. 28, 2004 | (JP) | ............................. P2004-190556 |
| Jun. 28, 2004 | (JP) | ............................. P2004-190558 |
| Aug. 12, 2004 | (JP) | ............................. P2004-235515 |
| Aug. 27, 2004 | (JP) | ............................. P2004-249295 |
| Jan. 27, 2005 | (JP) | ............................. P2005-020256 |

(51) Int. Cl.
*H05B 3/68* (2006.01)
*H05B 3/16* (2006.01)

(52) U.S. Cl. .................................... 219/444.1; 219/544

(58) Field of Classification Search .. 219/443.1–468.2, 219/544–553; 338/280, 281, 306–314
See application file for complete search history.

(56) References Cited

U.S. PATENT DOCUMENTS 6,084,208 A * 7/2000 Okuda et al. ................ 219/216

FOREIGN PATENT DOCUMENTS

| JP | 2001-203156 | 7/2001 |
| JP | 2001-244059 | 9/2001 |
| JP | 2001-313249 | 11/2001 |
| JP | 2002-043031 | 2/2002 |
| JP | 2002-141159 | 5/2002 |
| JP | 2002-151235 | 5/2002 |
| JP | 2002-203666 | 7/2002 |

* cited by examiner

*Primary Examiner*—Sang Y. Paik
(74) *Attorney, Agent, or Firm*—Hogan & Hartson LLP

(57) ABSTRACT

Provided is a heater capable of having a high uniform heating characteristic and substantially equally heating a wafer etc. mounted thereon, and a wafer heating device using the same, as well as a method thereof. The heater comprises a plate shaped body, a belt-like resistance heating element formed on the plate shaped body and having a channel for adjusting the resistance value, and a positioning mark formed on the plate shaped body, which serves as a reference for positioning the channel.

30 Claims, 24 Drawing Sheets

HEATER FOR HEATING A WAFER AND METHOD FOR FABRICATING THE SAME

BACKGROUND OF THE INVENTION

1. Field of the Invention

The present invention generally relates to a heater for heating a wafer, for example, a heater which is suitable for forming a thin film formed on a semiconductor wafer or a wafer of a liquid crystal display and a circuit board or the like, or for forming a resist film by drying and baking a resist solution applied on the wafer.

2. Description of the Related Art

In forming of a semiconductor thin film, etching, baking of a resist film, etc. in a process for fabricating a semiconductor, there is used a heater made of ceramics for heating a semiconductor wafer (hereinafter, abbreviated as a "wafer").

A conventional device for fabricating a semiconductor may be classified into a batch mode wherein a plurality of wafers are heated en bloc and a single mode wherein a plurality of wafers are heated one by one. In the single mode, since temperature controllability is excellent, a heater made of ceramics is widely used as a wiring of a semiconductor element gets finer and it is required to enhance accuracy of the heat treatment temperature.

As such the heater made from ceramics, for example, in the following Japanese Patent Kokai No. 2001-203156 or No. 2001-313249, heaters made from ceramics as shown in FIG. 18 are proposed.

This heater 71 is essentially composed of a plate shaped ceramics body 72 and a metal case 79, wherein the metal case 79 is made of a metal such as aluminum, etc. and takes a shape with a bottom. The plate shaped ceramics body 72 is made of nitride ceramic or carbide ceramic. The plate shaped ceramics body 72 is fixed in an opening of the metal case 79 by a bolt 80 with an adiabatic connection member 74 made of a resin interposed therebetween. An upper surface of the plate shaped ceramics body 72 is adapted to serve as a mounted surface 73 on which a wafer W is loaded, and at the same time, a lower surface of the plate shaped ceramics body 72 is adapted to be provided with a concentric circle shaped resistance heating element 75, for example, as shown in FIG. 19.

Moreover, the resistance heating element 75 has a terminal, to which a power supply terminal 77 is brazed. The power supply terminal 77 is electrically connected with a lead 78 that is inserted through a hole 76, wherein the hole 76 is used for drawing out the lead and is formed on a bottom 79a of the metal case 79.

Meanwhile, in the case of such heaters 71, it is important to make temperature distribution of the wafer uniform, in order either to form a homogeneous film throughout the surface of the wafer W or to make a heating reaction of the resist film homogeneous. For this reason, in order to lessen an in-plane temperature difference of the wafer, it has been carried out up to now to adjust resistance distribution of the resistance heating element 75 or to control a temperature of the resistance heating element 75 in a divided manner. However, the resistance heating element fabricated by a printing method has a problem that a film thickness becomes uneven and thus a resistance value is not obtained just as it is designed. So, there is disclosed a method for adjusting the resistance distribution, wherein a channel is formed by use of a laser beam as described in Japanese Patent Kokai No. 2001-244059 No. 2002-141159 or No. 2002-151235 and thereby the resistance is adjusted.

Further, there is a method for corrugating the resistance heating element to trim the corrugated part with a laser, as described in Japanese Patent Kokai No. 2002-043031. As shown in FIG. 10, there is a method for forming a plurality of channels m on an edge of a belt of the resistance heating element by use of a laser, and thereby lessening the in-plane temperature difference of the wafer W by means of the heater whose resistance is adjusted, which is disclosed in Japanese Patent Kokai No. 2002-203666.

However, the in-plane temperature difference of the wafer is lessened, but it is still insufficient to form the homogeneous film throughout the surface of the wafer W. Therefore, it is required a heater capable of more uniformly heating the temperature distribution.

SUMMARY OF THE INVENTION

However, in the methods as described in the latter two Patent Documents, it is possible to improve the temperature distribution to a certain extent, but it is difficulty to lessen the in-plane temperature difference of the wafer up to 0.3° C. or lower.

Further, the heater formed in the above-mentioned method had a problem that the resistance value is varied during repetition of heating and cooling, and thereby a uniform heating balance of the wafer surface is not maintained to increase the temperature difference.

Therefore, the main object of the present invention is to provide a heater capable of having a high uniform heating characteristic and substantially equally heating a wafer, etc. mounted thereon, for example a wafer heating device using the same, and a method thereof.

The present invention was made on the basis of the following discovery.

The present inventors have made extensive studies, and as a result, it has been found that a resistance heating element is provided with positioning marks at predetermined positions corresponding to a channel, and thereby a channel for adjusting the resistance value can be formed on the basis of the positioning mark, thus it is possible to form the channel at a predetermined position of a belt with good accuracy as well as to form the resistance heating element that has a substantially equal resistance value in its entirety.

Further, it has been also found that, when a laser beam is irradiated to a resistance heating element, conductive particles in the resistance heating element are agglomerated to lower the density, and thus a channel irradiated by the laser has a surface current less than a surface of the resistance heating element having no channel, and that no crack is generated from the channel even when a rapid heating/cooling cycle is repeated, and there is no fear that generation of such a crack causes the resistance heating element to be cut off and varies resistance of the resistance heating element. Thus, it is possible to obtain a resistance heating element having excellent characteristics.

Moreover, it has been found that when a channel formed at a resistance heating element is provided in the middle of the resistance heating element and is also unevenly distributed on the center or outer side of the resistance heating element with respect to the center of a circular plate shaped body, and thereby it is possible to obtain a heater having better uniform heating characteristic and when an edge of the channel is formed in an arc shape and furthermore is arranged in succession perpendicular to an axis of the resistance heating element, and thereby it is possible to obtain a heater having better uniform heating characteristic, thus the invention being completed.

According to a first aspect of the present invention, there is provided a heater comprising a plate shaped body and a belt-like resistance heating element formed on a surface of the plate shaped body, wherein the belt-like resistance heating element is provided with channels, wherein the plate shaped body is provided with positioning marks on the surface thereof, and wherein the positioning marks are formed on a position corresponding to the channels. As such the positioning mark is provided at a position corresponding to a channel and the channel can be formed on the basis of the positioning mark as set forth above, the channel can be formed at a predetermined position of a belt with high accuracy. Thus, it is possible to obtain a heater having a uniform heating characteristic.

Further, the channels are provided in the belt-like resistance for adjusting a resistance value of the resistance heating element.

Further, the plate shaped body is preferably made of ceramics. It is preferable that the ceramics can heat a wafer, etc. up to higher temperatures due to its heat resistance.

In the heater according to the first aspect of the present invention, the positioning mark may be formed as a protrusion protruded from the belt-like resistance heating element in a lateral direction. This protruded protrusion can enhance position accuracy at the position where it is adjacent to the resistance heating element.

According to a first aspect of the invention, a preferred heater includes a plate shaped body, and a belt-like resistance heating element formed on the plate shaped body and having a channel, wherein the belt-like resistance heating element has a protrusion protruded from the resistance heating element in a lateral direction.

Further, in the preferred heater according to the aspect of the invention, the resistance heating element may be made of a composite material of an insulating composition and a conductive composition, and the conductive composition on the surface of the channel has a density less than that at the inside of the resistance heating element. The channel may be formed using a laser beam, because when the laser beam is irradiated, conductive particles are agglomerated to lower the density on the surface of the channel. For this reason, the channel irradiated by the laser has a surface current less than the surface of the resistance heating element having no channel (the parts where the conductive particles are not agglomerated), and that no crack occurs at the channel even when a rapid heating/cooling cycle is repeated. Consequently, there is no fear that generation of such a crack causes the resistance heating element to be cut off and to vary resistance of the resistance heating element, so that it is possible to obtain the resistance heating element having excellent characteristics.

In the preferred heater according to the present invention, preferably, an average particle size of the conductive composition is in a range of 1 to 20 µm on the surface of the channel. When the average particle size of the conductive composition is less than 1 µm, stress relaxation of the conductive composition is reduced, and thereby there is a possibility that a crack is increased from the surface of the channel to the inside of the resistance heating element. In contrast, when the average particle size of the conductive composition is greater than 20 µm, it becomes too increased, and thereby there is a possibility that the crack occurs at an interface between the insulating composition and the conductive composition.

The resistance heating element is preferably shaped in a manner that the insulating composition is enclosed by conductive particles of the conductive composition. In this manner, when a conglomerate of the insulating composition enclosed with a number of the conductive particles exists, formation of the channel by the laser beam causes a conglomerate of the conductive composition on the surface of the channel to be increased in diameter, so that it is possible to lower the density as well as the current density of the surface of the channel. Accordingly, it is possible to prevent cracks from occurring.

Further, according to the first aspect of the present invention, a resistance heating element may be preferably formed in a shape of a concentric circle on a circular plate shaped body, wherein the resistance heating element has a group consisting of a plurality of channels at its center in its width direction. In this manner, at least a part of the resistance heating element is provided with the channel, thereby forming a resistance adjustment part to thus adjust a calorific value of the resistance heating element. Accordingly, a temperature of the heating plate can be made uniform. Consequently, it is possible to lessen an in-plane temperature difference of the wafer W.

In the heater according to another aspect of the present invention, the resistance heating element may be formed in a shape of a concentric circle on a circular plate shaped body, and that a channel may be unevenly distributed on an inner or outer side in a radial direction of the plate shaped body on the resistance heating element. Even when the resistance heating element is arranged on the plate shaped body with good symmetry, a heating region of the resistance heating element can be slightly varied depending on a position of the channel when the channel for adjusting a resistance value is irregularly formed at the resistance heating element, thus increasing an in-plane temperature difference of the wafer. With this regard, when the channel formed at the resistance heating element is formed to be unevenly distributed on a center or outer circumference side of the plate shaped body, it is possible to arrange the channel with good symmetry, thus to keep the heating region of the resistance heating element at a substantially uniform temperature.

In a preferred heater according to another aspect of the present invention, the channels may be extended along a length direction of resistance heating element and arranged in a direction perpendicular substantially to the length direction (the width direction of the resistance heating element). Thereby, the heater becomes good in uniform heating characteristic, so that it is possible to shorten a speed of going up and down the temperature.

In the heater according to the aspect of the present invention, it is preferable that some of a plurality of channels have a length different from the other. The channel formed at the last of the plurality of channels formed on each region has a length shorter than the others, so that it is possible to more delicately adjust a resistance value of the region.

Further, among the plurality of channels, the channel located on the outer side in the width direction of the resistance heating element may be formed to have a length different from the others. These channels are so formed that the first channel is formed at the center of the belt-like resistance heating element and then outward left and right in sequence, and the last channel is formed on the outer side of and in a length shorter than the others, so that it is possible to precisely adjust a resistance.

In another preferred heater according to the present invention, an edge of the channel may be preferably formed in an arc shape. Generation/increase of the cracks caused by a thermal expansion difference can be restrained when the resistance heating element is subjected to a heating/cooling cycle, so that it is possible to prevent variation of the resistance, abnormal heating and cutting off of the resistance element, and thus to get long-life use.

In a preferred heater, the arc shaped part on the edge of the channel may have a radius of curvature corresponding to the circle diameter of 0.5 to 3 times as wide as a width of the channel. This is preferable in that the arc shaped part of the channel makes generation of the crack reduced.

Further, in a preferred heater, it is preferable to form a passivation layer on the edge of the channel. It is possible to restrain the crack from proceeding at the edge of the channel, and thus durability becomes better.

Furthermore, the resistance heating element preferably comprises a plurality of groups consisting of a plurality of channels that are formed in a substantially equal length along a length direction of the resistance heating element and also arranged in a direction perpendicular substantially to the length direction, wherein an interval between adjacent groups is formed to be smaller than a width of the resistance heating element. Thereby, left and right belts of the resistance heating element are small in variation of a calorific value. Further, a part of the interval Gg becomes a bypass of the left and right belts divided by the channel. Thus, a flow of an electric current is free from deviation, so that heat generation becomes uniform. Meanwhile, when the interval Gg is greater than a width Wh of the belt, the calorific value of its position Gg becomes small, so that the heating position becomes a cool spot when being heated, and a temperature of the wafer W is lowered only at the position, and thus an entire uniform heating characteristic can be deteriorated. For this reason, the interval Gg between one group (g) and another group (g) is preferably smaller than the width Wh of the belt.

In the heater, the interval between the adjacent groups may be preferably 1 mm or less. When the interval is less than 1 mm, it is possible to prevent deviation of the current, and simultaneously there is a small chance of generating the cool spot.

In the preferred heater according to the present invention, the channel may be formed by a laser. A beam of the laser is preferable because it is easy to form the narrow channel with high accuracy.

According to the present invention, there is provided a wafer heating device includes the heater according to the first aspect of the invention having a plate shaped body having one main surface with a plurality of resistance heating elements provided thereon and the other main surface serving as a mounting surface for mounting a wafer, a power supply part for independently supplying electric power to the plurality of resistance heating elements, and a metal case for enclosing the power supply part. The plurality of resistance heating elements has a circular resistance heating element zone formed at the center of a plate shaped body, and a plurality of annular resistance heating element zones formed in a shape of a concentric circle on an outer side thereof. The annular resistance heating element zones located at least at the outermost circumference have a plurality of positioning marks located on a plurality of straight lines forming a central angle of a substantially equal angle on the concentric circle. By using the above-mentioned heater as the wafer heating device, it is possible to heat the wafer at a substantially same calorific value on the whole, and thus to promote uniform heating characteristics of the wafer.

Furthermore, according to the present invention, there is provided a wafer heating device including the heater according to the second aspect of the invention having a plate shaped body having one main surface with a plurality of resistance heating elements provided thereon and the other main surface serving as a mounting surface for mounting a wafer; a power supply part for independently supplying electric power to the plurality of resistance heating elements; and a metal case for enclosing the power supply part. In the wafer heating device, the resistance heating elements have a circular resistance heating element zone formed at the center of a plate shaped body, and a plurality of annular resistance heating element zones formed in a shape of a concentric circle on an outer side thereof. Further, the annular resistance heating element zones located at least at the outermost circumference have a plurality of protrusions located on a plurality of straight lines forming a central angle of a substantially equal angle on the concentric circle.

Moreover, according to another aspect of the invention, there is provided a method of fabricating a heater including a plate shaped body, and a resistance heating element provided on one main surface of the plate shaped body and having a plurality of channels, which comprises the steps of forming the resistance heating element and a positioning mark serving as a basis of positioning the channel, on the one main surface of the plate shaped body, measuring a resistance value for a certain section of the resistance heating element, and comparing the measured resistance value with a predetermined resistance value in a part of the certain section of the resistance heating element, and forming the channels on the basis of a positioning mark by means of a laser beam such that the resistance value for the certain section is corresponding to the predetermined resistance value.

According to the invention, it is possible to provide a heater in which the in-plane temperature difference of the wafer is favorably as small as ±0.3° C. or less. Moreover, it is possible to provide a heater that is good in production yield, easy in mass production and inexpensive.

In the formation of the channel for resistance adjustment of the above-described resistance heating element, the edge of the channel is formed in an arc shape, and thus the generation/increase of the crack caused by the thermal expansion difference that the resistance heating element is subjected to the heating/cooling cycle is restrained. As a result, it is possible to prevent resistance variation, abnormal heating and cutting off of the resistance element, and thus to endure long-term use.

Further, adjustment of formation output and movement speed of the channel formation causes the number of cracks generated at the channel formation limited to five or less per formed channel, so that it is possible to prevent resistance variation, abnormal heating and cutting off of the resistance element, and thus to keep long-life.

Further, the protective layer formed on the channel forming end can make it possible to prevent proceeding of the crack caused by the thermal expansion difference generated from the resistance heating element by means of the heating/cooling cycle, and the resulting resistance variation, abnormal heating and resistance cutting off, and thus to keep long-term use.

The protective layer formed on the resistance heating element around a cooling air outlet is subjected to a great temperate difference, so that it is possible to prevent proceeding of the crack caused by the thermal expansion difference generated from the resistance heating element by means of the heating/cooling cycle, resistance variation, abnormal heating and being cut off which are caused by erosion of the resistance heating element by an airflow, and thus to endure long-term use.

BRIEF DESCRIPTION OF THE DRAWINGS

FIG. 11 is a diagram showing the channel formed at a resistance heating element in the heater of the invention, wherein

DESCRIPTION OF THE PREFERRED EMBODIMENT

Hereinafter, the embodiments of the invention will be described.

Figure 1:
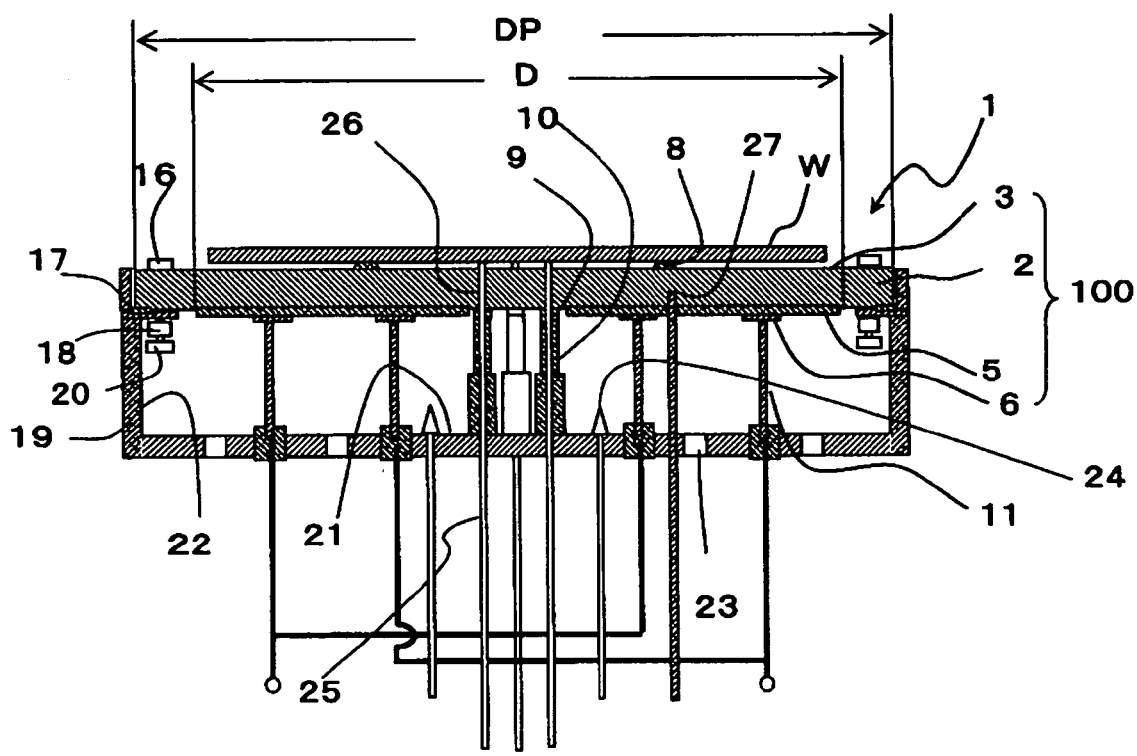
FIG. 1 is a cross-sectional view of the heater of the invention.

FIG. 1 is a cross-sectional view showing an example of a ceramic heater 1 according to the invention. The ceramic heater 1 comprises a plate shaped body 2 of which one main surface is a mounting surface 3 on which a wafer W is mounted and the other main surface has a resistance heating element 5 formed thereon. A power supply part 6 is electrically connected to the resistance heating element 5 and a power supply terminal 11 is connected to the power supply part 6. A metal case 19 for enclosing the power supply part 6 is fixed around the other main surface of the plate shaped body 2 via a connection member 17.

Further, a wafer lift pin 25 can move the wafer W up and down through a hole passing through the plate shaped body 2 to thus load or unload the wafer W on or from the mounting surface 3. And the power supply terminal 11 is connected to the power supply part 6 and thus power is supplied outside, so that the wafer W can be heated while a temperature of the plate shaped body 2 is measured by a temperature measurement element 27.

The wafer W is adapted to prevent temperature variation by piece contact, etc. of the wafer W while being lifted from the mounting surface 3 by a wafer supporting pin 8. Further, when the resistance heating element 5 is divided into a plurality of zones, a temperature of each zone is independently controlled. Thereby, the power is supplied to the power supply terminal 11 of each power supply part 6 and is adjusted so that the temperature of each temperature measurement element 27 reaches each preset value. Thereby, a surface temperature of the wafer W loaded on the mounting surface 3 is adapted to be uniform.

Figure 2A:
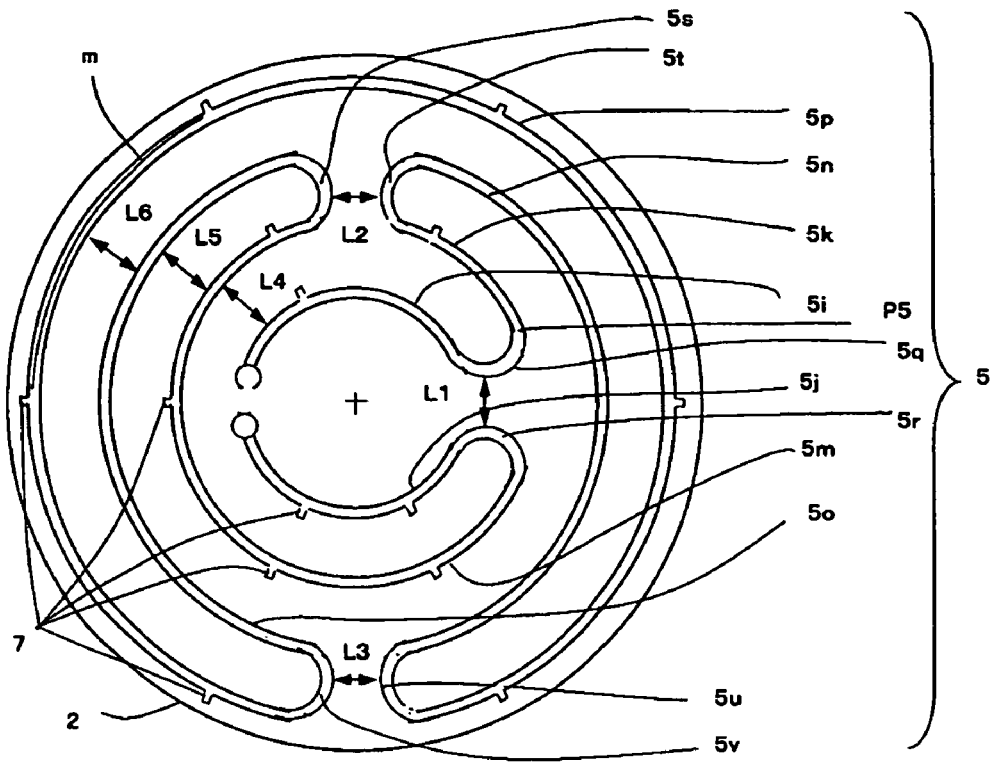
FIGS. 2A and 2B are diagrams showing the positioning mark in the heater of the invention.
Figure 2B:
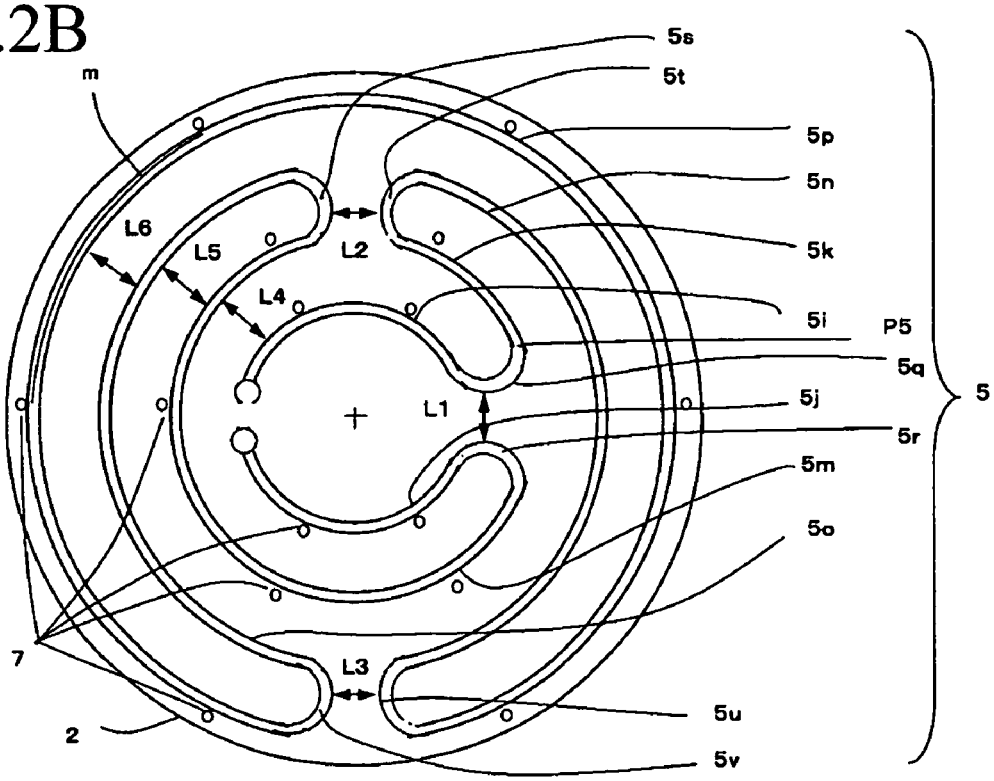

As shown in FIGS. 2A and 2B, a ceramic heater 1 of the invention is characterized in that a belt-like resistance heating element 5 is provided on a plate shaped body 2, and that a positioning mark 7 of a belt of the resistance heating element 5 has a channel m which is substantially parallel to a length direction of the belt. In this manner, at least a part of the resistance heating element 5 is formed with the channel m for the adjustment of a resistance value, thereby forming a resistance adjustment part to thus adjust a calorific value of the resistance heating element 5. Accordingly, a temperature of a heat-uniformity planar body 100 is made uniform, so that an in-plane temperature of the wafer W is lessened. And the channel m is formed on the belt of the resistance heating element 5 in order to adjust a delicate difference of the calorific value generated from a resistance difference caused by partial deviation of a thickness or width of the belt of the resistance heating element 5. Because this channel m adjusts delicate deviation of the dimension of the belt of the resistance heating element 5, it is necessary not only to make a depth or width of the channel constant, but also to form the channel m at a predetermined position of the belt of the resistance heating element 5 with good accuracy. When the channel m is formed on the basis of the positioning mark 7, it is possible to form the channel m at a predetermined position of the belt with good accuracy. And it is proved that the calorific value of each part of the resistance heating element 5 is adjusted, for example, it is possible to fabricate the ceramic heater 1 which has the temperature difference of 0.3° C. or less all over the surface of the wafer W.

Further, the positioning mark 7 is preferably located around an edge of the channel m in that it determines a position forming the channel m. When the positioning mark 7 is formed at this position, this is preferable because an accuracy of a position of starting to form the channel m is enhanced. More preferably, when the channel m, which has a length tens of times as wide as the width of the belt, is formed, the positioning mark 7 is located around the other end, the end terminal, of the channel m. When the positioning mark 7 is located around the other edge of the channel m, a position of the end terminal can be exactly calculated when the channel m is formed. Thus, mislocation of the channel m is small, so that it is possible to exactly adjust the resistance of each part of the belt.

Further, the positioning mark 7 is characterized in that it is formed of a conductor that is not used for resistance heating in the belt of the resistance heating element 5, and the conductor is connected to the belt. The conductor that is not used for resistance heating refers to, in the resistance heating element 5, a part that is protruded in a direction perpendicular to a direction in which an electric current flows along the belt in a region where current density is less than a tenth of average current density.

Typically, the channel m is formed using a laser beam. In order to form the channel m at a predetermined position of the belt with good accuracy, the positioning mark 7 for determining a position of irradiating the laser beam is brought into contact with the belt. In this case, the positioning mark 7 becomes closest to the channel m to lessen a measurement error, so that it is possible to form the channel m in an efficient manner and furthermore with good position accuracy. The positioning mark 7 is preferably located at the channel m as close as possible, and more preferably is brought into direct contact with the belt. Further, the positioning mark 7 is preferably located at a position that has no influence on a heating characteristic. It is preferable that the positioning mark 7 is present because the positional relationship between the channel m and the belt of the resistance heating element 5 can be exactly calculated.

As in the prior art up to now, when the positioning mark 7 does not exist, the positioning is performed on the basis of a contour of the plate shaped body or by image-processing a contour of the resistance heating element. When delicate deviation of left, right, front and rear of the resistance heating element 5 or deformation of the resistance heating element 5 occurs, formation of the plurality of channels m1, m2, m3, . . . has a chance that the channels deviate outward the belt or that the channels m can not be formed at a predetermined position. Accordingly, there is a chance that the resistance is insufficiently adjusted. For this reason, there is a fear that the in-plane temperature difference of the wafer W is not lessened even when the resistance is adjusted.

For example, a plate shaped ceramics body is used as the plate shaped body 2. One main surface of the plate shaped ceramics body serves as the mounting surface 3 loading the wafer W, and the interior or other main surface thereof is disposed with the belt-like resistance heating element 5. Belts of the belt-like resistance heating element 5 are consecutively arranged by arc shaped belts 5$i$, 5$j$, 5$k$, 5$m$, 5$n$, 5$o$, and 5$p$ and folded belts 5$q$, 5$r$, 5$s$, 5$t$, 5$u$, and 5$v$. Thereby, the resistance heating element 5 is formed. In order to adjust resistance of the belt of each part of the resistance heating element 5, the channel m is formed. It is preferable that the positioning mark 7 is formed when the channel m is formed. It is preferable that the positioning mark 7 is formed at the belt forming the channel m because the channel m can be efficiently formed on the basis of the positioning mark 7 with good accuracy.

Further, it is preferable that the positioning mark 7 is formed by a protrusion 7 protruded laterally from the plate shaped resistance heating element 5. The resistance heating element 5 is formed in such a manner that a conductive paste is formed by screen printing or the like, and then a channel is formed using a laser beam, wherein the protrusion 7 is preferable in that it is formed to be adjacent to the resistance heating element 5 and thus enhance position accuracy. The protrusion 7, preferably, takes a rectangular shape. Such a rectangular shape is allowed to adopt two axes of ordinate and abscissa as references matching with a contour side of a straight line. This is preferable because it is possible to set the reference with ease. Preferably, a height protruded from the belt is in a range of 0.3 to 2 mm, and a width is in a range of 0.05 to 0.5 mm. More preferably, the height is in a range of 0.5 to 1.5 mm, and the width is in a range of 0.1 to 0.3 mm. Further, an area of the protrusion 7 is preferably in a range of 0.015 to 1.0 mm$^2$. When the area is less than 0.015 mm$^2$, there is a fear that it is difficult to recognize the protrusion as the positioning mark 7. Further, when the area is more than 1.0 mm$^2$, there is a fear that the protrusion becomes too great to lower the position accuracy.

When the positioning mark 7 is formed in connection to the belt of the arch-like resistance heating element 5 formed on a ring, the positioning mark 7 can be easily detected by line-scanning along the arc when the positioning mark 7 is specifically defined by image processing, etc., the positioning mark 7 can be directly recognized by constantly forming the width of the positioning mark 7. Thus, it is specifically determine an exact position of the belt of the resistance heating element 5 from both a position of determining the width of the positioning mark 7 and a position of a top side of the positioning mark 7. And it is possible to form the channel m at an exact position from the positioning mark 7 with respect to the belt.

Further, the resistance heating element 5 is composed of a composite of an insulating composition 52 and a conductive composition 51, and the resistance heating element 5 is formed such that the density of the conductive composition 51 on the surface of the channel m is less than that of the conductive composition 51 inside of the resistance heating element 5.

Figure 3:
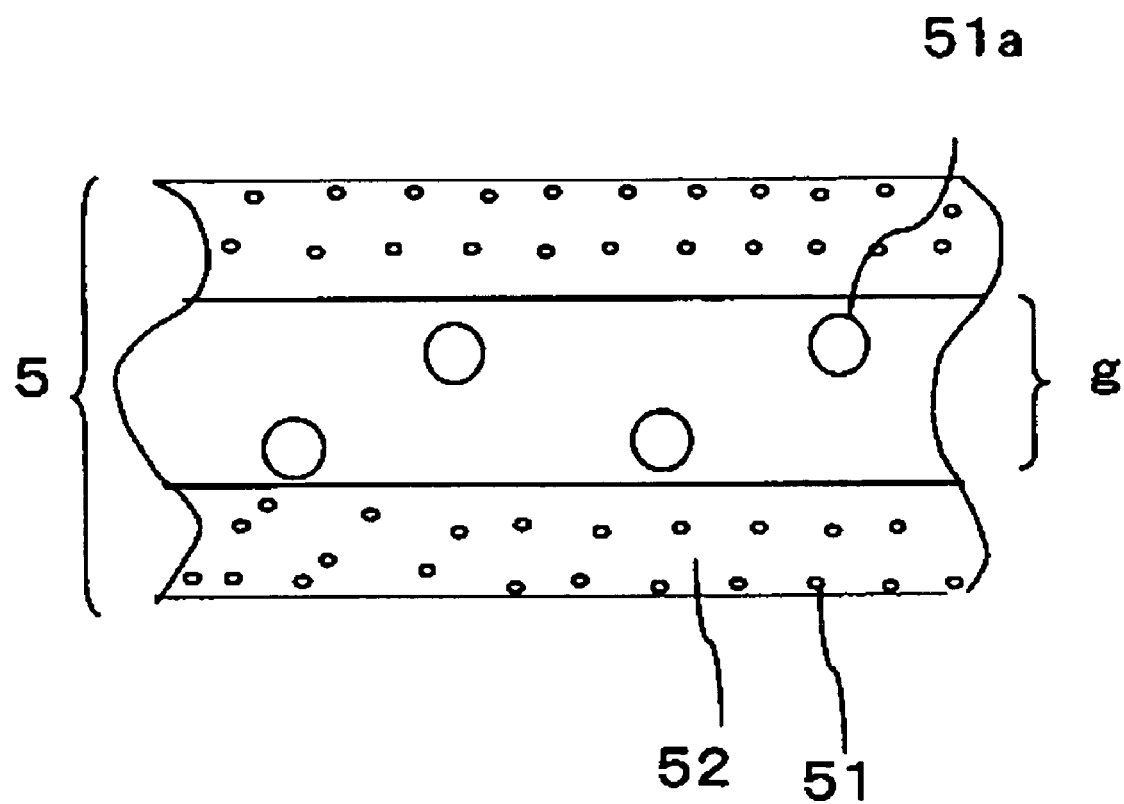
FIG. 3 is an enlarged view of the resistance heating element in the heater of the invention.

As shown in FIG. 3, the density of the conductive composition 51$a$ on the surface of the channel m formed in the resistance heating element 5 is less than that of the conductive composition 51 inside of the resistance heating element 5, and thus the specific resistance value of the surface of the channel m is relatively larger than that of inside of the channel m. As such, an electric current flowing on the surface of the channel m is decreased, so that it is possible to inhibit the growth of a micro-crack of the surface.

There is a chance that, when the channel m is formed by a laser beam, the micro-crack is generated on the surface of the channel m, and thus when the current flows repeatedly to the resistance heating element 5, the micro-crack grows to cause a change of a resistance value, thereby increasing an in-plane temperature difference of the wafer W, so that it is difficult to maintain the uniform heating characteristic. However, when the density of the conductive composition 51$a$ on the surface of the channel m is lessened, it is possible to prevent growth of the micro-crack.

Figure 4:
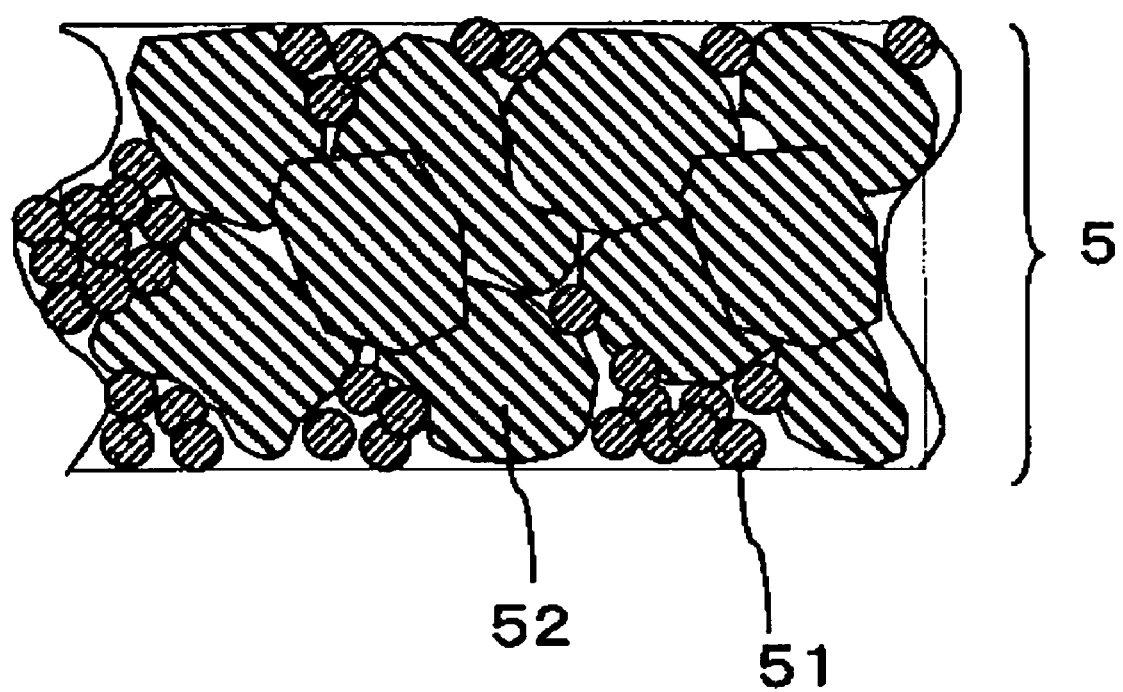
FIG. 4 is an enlarged view of the resistance heating element in the heater of the invention.

In order to lessen the density of the conductive composition 51$a$ on the surface of the channel m, as shown in FIG. 4, deviation is given to dispersion of the conductive composition 51 by making a particle size of the insulating composition 52 of the resistance heating element 5 greater than that of the conductive composition 51, or a paste conglomerating the conductive composition 51 having an average particle size of 0.5 to 1.5 µm is used. In this manner, when the conglomerated paste is used to form the resistance heating element 5 and then the resistance heating element 5 is formed with the channel by the laser beam, it is considered that the conglomerated conductive composition 51 is properly collected to prepare a great particle size of conductive composition.

When the channel m is formed by the laser beam using the conductive composition 51 and the insulating composition 52, the conductive composition 51 and the insulating composition 52 are fused and solidified again. In this case, the conductive composition 51a on the surface of the channel m is preferably formed in a large circle shape by a surface tension as in FIG. 3. When the circle shape is made, this is because a thermal stress generated at an interface between the conductive composition 51a and the insulating composition 52 can be relaxed.

Further, the circle shape means that, in a shape of the conductive composition 51 where the conductive composition 51 on the surface of the channel is observed with a scanning electron microscope (SEM) and then calculated in a direction perpendicular to a surface of the resistance heating element, a difference ((D1−D2)/D2)×100) between a diameter D1 of a circumscribed circle and a diameter D2 of an inscribed circle is within 30% with regard to a contour of the conductive composition 51.

Further, the ceramic heater 1 of the invention is characterized in that a lightness of the surface of the channel m is lower than that of the surface of the resistance heating element 5.

It is characterized that when taking a photograph of the resistance heating element 5 forming the channel m by use of a metallurgical microscope, the lightness of the channel m is lower than that of the resistance heating element 5 at a part free from the channel m.

Since the surface of the channel m of the resistance heating element 5 is low in density of the conductive composition 51, it is considered that a quantity of the light reflected from the conductive composition 51 is reduced, and thus the lightness is lowered compared to the part free from the channel m. When the lightness of the channel m is low, the surface of the channel m has less current than the surface of the resistance heating element 5 free from the channel m. Thus, even when a temperature cycle of rapidly heating and cooling the resistance heating element 5 is repeated, there is no fear that a crack is generated from the surface of the channel m and thus the resistance heating element 5 is varied in resistance or is cut off. As a result, it is possible to obtain an excellent characteristic.

Further, it is preferable that the average particle size of the conductive composition 51 of the surface of the channel m is in a range of 1 to 20 µm. In this manner, when the particle size of the conductive composition 51 of the surface of the channel m is increased, this is preferable in that it is possible to decrease the density of the surface by reducing the number of the conductive composition 51. When the average particle size of the conductive composition 51 is less than 1 µm, there is a chance that an effect of stress relaxation is small, and the crack is propagated from the surface of the channel m to the interior of the resistance heating element 5.

Further, when the average particle size of the conductive composition 51 of the surface is more than 20 µm, there is a chance that the particle size of the conductive composition 51 is excessively increased, and thus the crack is generated at the interface between the conductive composition 51 and the insulating composition 52. More preferably, the average particle size of the conductive composition 51 is in a range of 5 to 10 µm.

Further, the density of the conductive composition 51 on the surface of the channel can be calculated by finding a ratio of an area where the conductive composition 51 occupy from photographs of the surface of the channel which are taken by a reflection electron microscope by use of image analysis, etc. And, the density of the conductive composition 51 of the inside of the channel can be calculated by finding a ratio of an area where the conductive composition 51 occupy from photographs of the inside cross-section of the channel which are taken by a reflection electron microscope by use of image analysis, etc. Further, the average particle size of the conductive composition 51 can be found through image analysis.

Further, in order to lower the density of the conductive composition 51 of the channel m, as set forth above, it is preferable that the conglomerate of the insulating composition 52 enclosed by conductive particle formed of the plurality of conductive composition 51 is present. This is because when the conglomerate of the insulating composition is present in this way, the diameter of the conductive composition 51a on the surface of the channel m is increased when the channel m is formed by the laser beam, and thus it is possible to lower the density.

In addition, as the conductive particles, there can be made use of particles of metals such as gold, platinum, palladium, iridium, rhodium, silver, copper, nickel and the like. Further, if the conductive particles are approximately spherical, they are easily mixed with the glass powders to be an insulation composition, thus it being preferable. As the insulation composition, preferred is crystallized glass at least a part of which includes a crystal phase including at least one kind of Zn, B and Si. The kinds of the crystal phase formed or dispersed in glass can be exemplified by, for example, $Zn_2SiO_4$, $Zn_3B_2O_6$, $Zn_3(BO_3)_2$, $Zn(BO_2)_2$, $SiO_2$ and so forth.

Also, the average particle diameter of the conductive particles is preferably in a range of 0.1 to 5 µm. Since when the average particle diameter is less than 0.1 µm, the particle diameter is too small, thus it being not possible to sufficiently mixing the conductive particles with the insulation composition. Whereas, since when the average particle diameter is greater than 5 µm, the thermal expansion coefficient of the conductive particles is larger than that of the insulation composition, thus the thermal stress at the interface becomes so large that the insulation composition can be destroyed due to the thermal stress.

Further, the average particle diameter of the conductive particles can be determined by taking a SEM photograph using a reflection electron microscope magnified 1500 times, drawing two straight lines of a length of 30 µm thereon, and dividing the length of the conductive particles crossed by the straight lines by the number of crossed particles.

Also, the average particle diameter of agglomerate made of the insulation composition is preferably in a range of 3 to 100 µm. When the average particle diameter is less than 3 µm, the durability of the conductive composition and the plate-shaped ceramic body to the thermal stress may be decreased. Whereas, when the average particle diameter is greater than 100 µm, the agglomerate becomes too larger. From this, the electric resistance of the conductive composition is partly increased and thus, the amount of heat released from the conductive composition may be partly increased when allowing the current to flow the conductive composition.

Further, the average particle diameter of the agglomerate of the insulation composition can be determined by selecting the regions enclosed with the conductive particles from the reflection electron microscopic photograph, defining the regions having the shorter diameter of 3 times or more as large as the diameter of the conductive particles as an agglomerate of the insulation composition, drawing a line of a length of 70 μm on the photograph taken using the reflection electron microscope magnified 1500 times, and dividing the whole length of the agglomerates crossed by the line by the number of agglomerates.

And it is preferable that the agglomerate of the insulation composition has the particles which have a thermal expansion coefficient larger than that of the insulation composition in the inside of the agglomerate. The reason is thought to be that if the agglomerate contains the particles in the inside, the tensile stress acts on the interface with the agglomerate and thus the strength of the agglomerate may be increased. And if the particle diameter of the particles is no more than 0.1 time or so as large as the diameter of the agglomerate, there is obtained an effect that the strength of the agglomerate is considerably enhanced, thus it being preferable.

Further, a component consisting essentially of a noble metal such as Pt, Au or their alloy, which is good in heat resistibility and oxidation resistance is preferably used as a conductive component contained in the resistance heating element 5 because laser trimming is generally carried out in air. As the resistance heating element 5, it is preferable to mix a glass component of 30 to 70% by weight in order to improve adhesion with an insulating layer and sinterability of the resistance heating element itself.

Figure 5A:
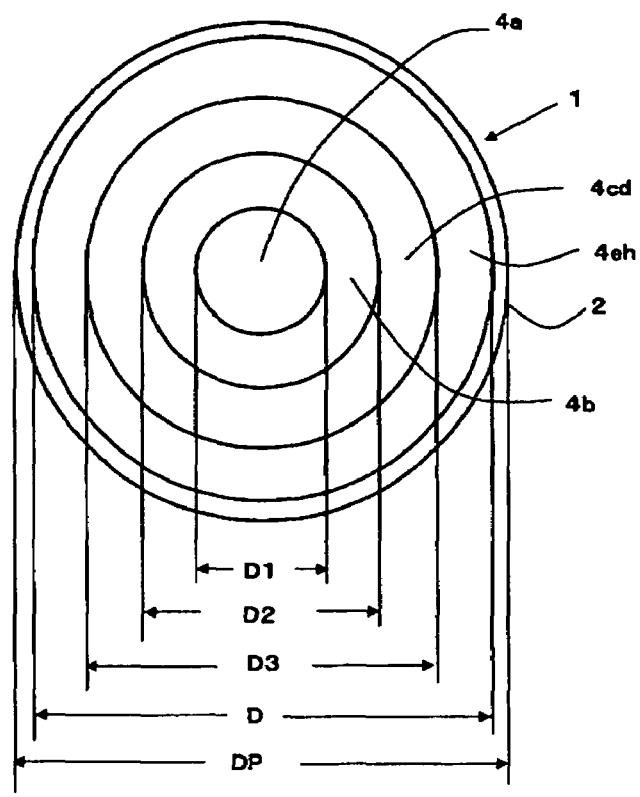
FIG. 5 is a diagram showing the resistance heating element zone in the heater of the invention.

FIG. 5A shows that the resistance heating element 5 located at an outer circumference of the plate shaped body 2 is composed of a resistance heating element zone taking a concentric fan shape and a plurality of central resistance heating element zones taking a concentric circular shape. Both of them are good to take a shape of the resistance heating element zone capable of uniformly heating the mounting surface 3. Further, FIG. 5B shows that the resistance heating element 5 is divided into the total of eight resistance heating element zones consisting of four in the peripheral part and four in the middle part so as to improve a uniform heating characteristic.

Figure 5B:
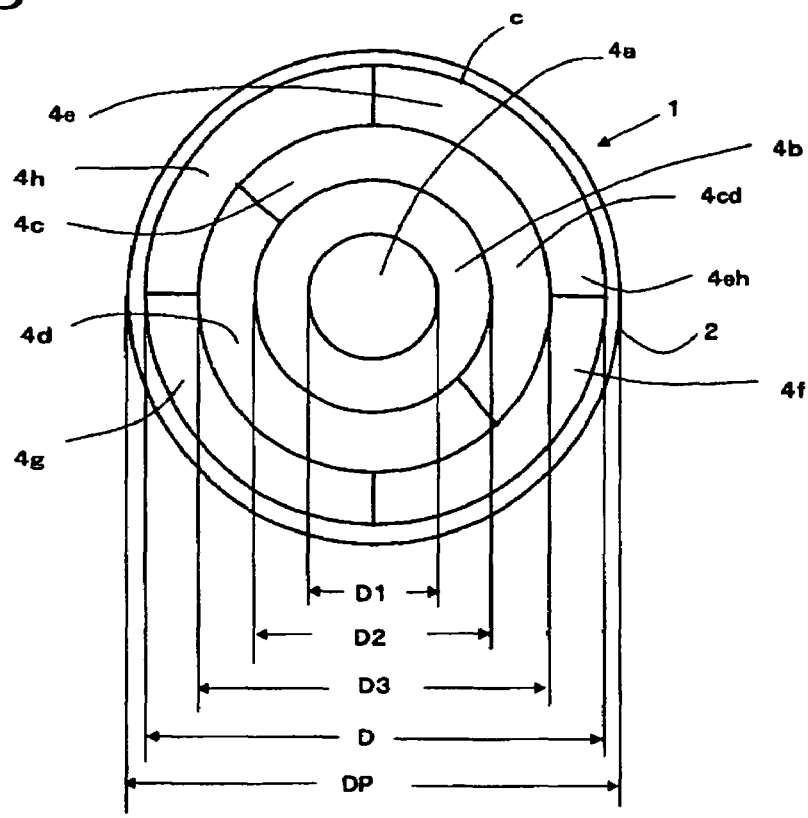

FIG. 6 shows an example of a resistance heating element 5 consisting of the eight resistance heating element zones shown in FIG. 5B.

Any resistance heating element 5 may be formed to have a width of 1 to 20 mm and a thickness of 5 to 80 μm by a screen printing method. Further, a shape of a resistance heating element zone is designed so that the in-plane temperature difference of the wafer W is lessened on the basis of a central line of a belt of a belt-like resistance heating element.

Figure 7:
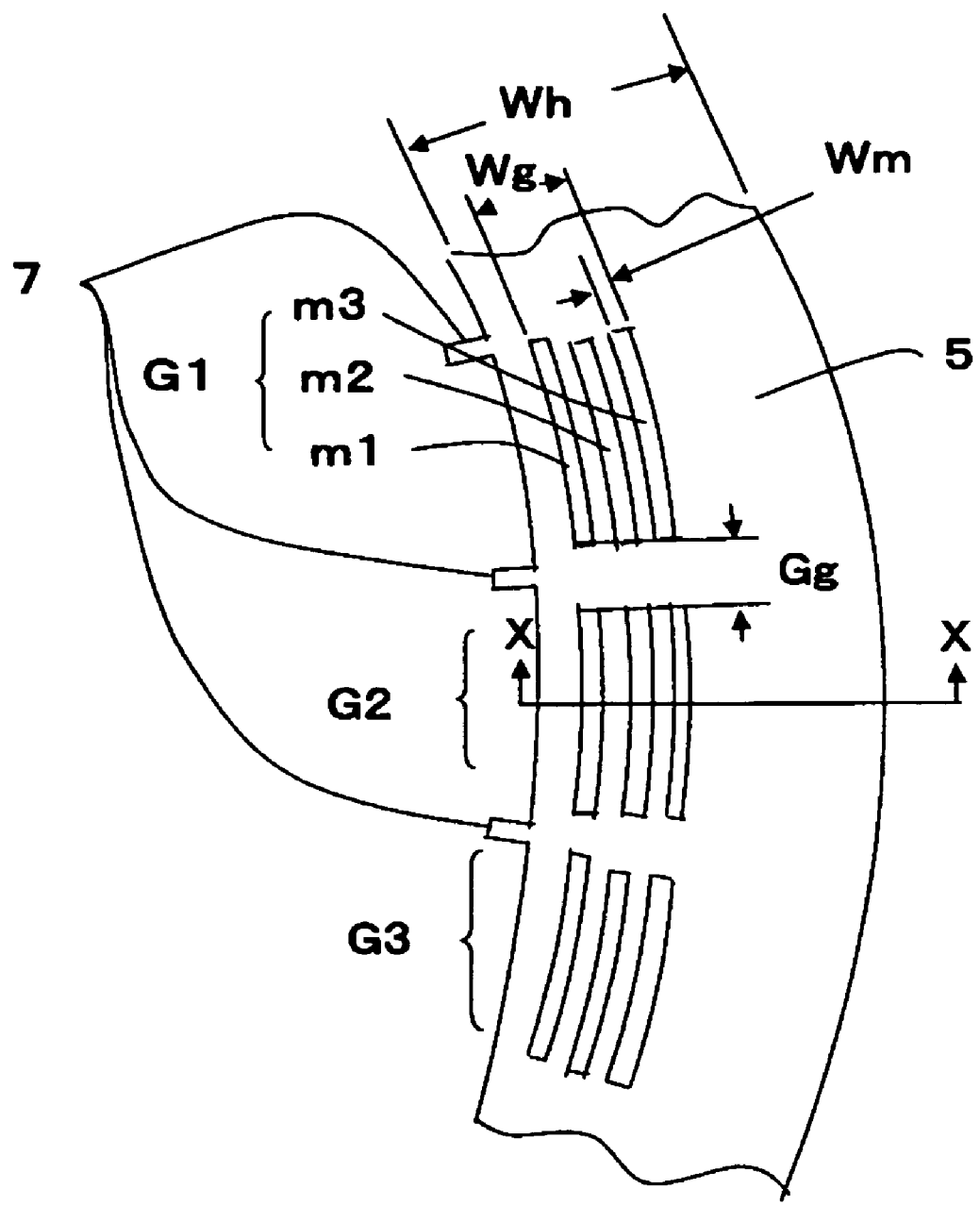
FIG. 7 is a partially enlarged view showing the belt of the resistance heating element in the heater of the invention.
Figure 8:
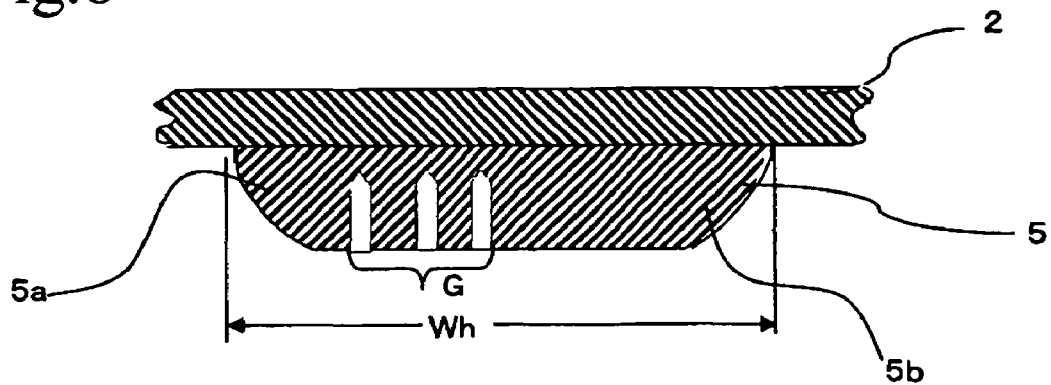
FIG. 8 is a cross-sectional view of the resistance heating element in the heater of the invention.

As shown in FIG. 7, the ceramic heater 1 of the invention is characterized in that a group G is composed of a plurality of channels m1, m2, . . . that are substantially parallel to a length direction of the belt of the resistance heating element 5 and have the same length, and the group G is located in the middle part in the width direction of the belt. Here, as shown in FIG. 8, the group G is located in the middle part of the belt of the resistance heating element 5, and this means that the center in the width direction of the group G is located in the middle of the belt, and more particularly that the center in the width direction of the group G is located on the middle two of the regions quartering the belt in a width direction, in brief, within a range less than the middle part 50%.

In this manner, a group G formed of the channel m is formed at least at a part of the resistance heating element 5, thereby forming the resistance adjustment part to thus adjust the calorific value of the resistance heating element 5. Thereby, a temperature of a heat-uniformity planar body 100 is made uniform, and so the in-plane temperature difference of the wafer W is lessened.

FIG. 7 shows an example of groups G1, G2 and G3 of the invention. FIG. 8 is a cross-sectional view taken along the line X-X of FIG. 7.

Figure 9:
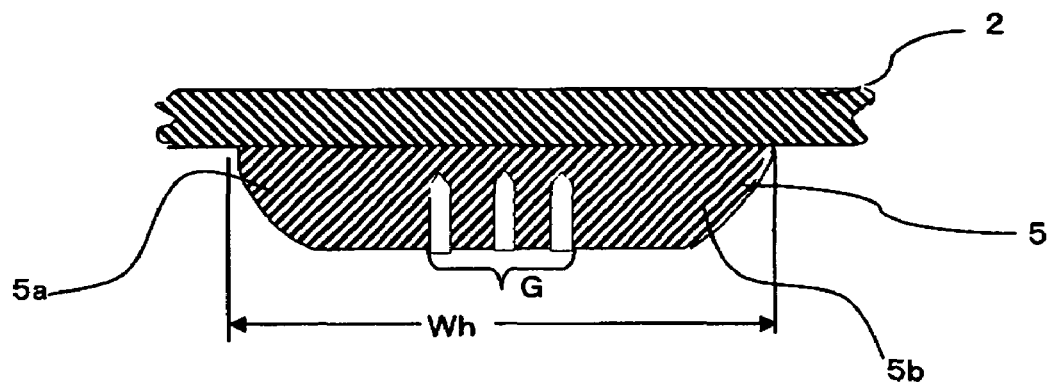
FIG. 9 is a cross-sectional view of the resistance heating element in the heater of the invention.

In the cross-sectional view that is perpendicular to a length direction of a resistance heating element 5 as in FIG. 9, resistance heating elements 5a and 5b that are located on both opposite sides of the resistance heating element 5 and divided by a group G are approximately equal in cross-sectional area. In other words, the resistance heating elements 5a and 5b are approximately equal in resistance value. As such, left and right calorific values are substantially equal in the width direction of the resistance heating elements 5a and 5b. Accordingly, even when the group G is formed to adjust a partial deviation of the resistance value of the resistance heating element 5, a central line in the width direction of the belt of the resistance heating element 5 is not greatly changed from a design position. Further, a channel is formed in a designed resistance heating element zone of the resistance heating element 5 to adjust a resistance. Thereby, a heat-uniformity planar body 100 can be uniformly heated, so that the in-plane temperature difference of the wafer W can be lessened.

Figure 10:
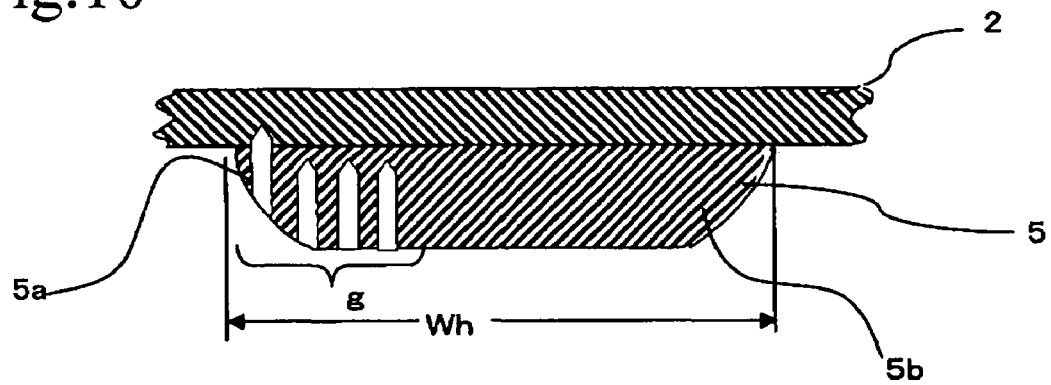
FIG. 10 is a cross-sectional view of the resistance heating element in the conventional heater.

Meanwhile, when the center in the width direction of the group G is deviated from the middle in the width direction of the resistance heating element 5 as in FIG. 8 or 10, a large current flows to a surface where the cross-sectional area of the belt of the resistance heating element 5 is large, and so, that surface generates heat with ease. Hence, a left and right heating balance is not maintained in the width direction of the belt of the resistance heating element 5, and thus a temperature difference takes place in the width direction. However, with respect to an arc shaped belt formed on the plate shaped body 2 in a concentric circular shape, the group G of the channels is formed on any one of the inner and outer sides from the center of the plate shaped body 2. Thereby, the plate shaped body 2 can be heated in central symmetry, so that the in-plane temperature difference of the wafer W can be lessened.

Further, it is preferable that a plurality of channels m1, m2, . . . that are substantially parallel to the length direction of the belt of the resistance heating element 5 and have the same length are formed into a group G, that the group G is provided to the belt in plural number, and that an interval Gg between the group G1 and the group G2 is smaller than a width Wh of the belt.

Since the resistance heating element 5 is formed by screen printing, a thickness of the belt is varied according to a place with respect to a design thickness when the resistance heating element 5 is formed. As such, there is generated a deviation between a preset resistance of the plate shaped body 2 and an actual resistance value of each part of the belt of the resistance heating element 5. Therefore, in order to correct the deviation of the resistance value of each part of the belt, it is efficient to form the channel m. In this case, the channel m is formed in desired number by minutely dividing the belt and then causing the resistance value of the divided belts to approach a design resistance value. However, increase of the divided number requires a time to form the channel m or to measure the resistance, so that efficiency is significantly lowered. For this reason, the divided number is set to several tens in number according to a shape of the plate shaped body 2 or a shape of the heating element zone. Further, the group G consisting of serial channel m is preferably formed in correspondence to the divided belts. Further, the interval Gg between the group G1 and the group G2 is preferably formed between sections. This is because formation of the interval Gg is allowed to connect a terminal for resistance measurement to the interval Gg or to measure a resistance of the section in an easy and exact manner, and thus it is easy to adjust the resistance. Further, this is preferable in that the calorific value of the entire heating surface of the ceramic heater 1 can be adjusted, so that it is easy to lessen the in-plane temperature difference of the wafer W.

Further, the interval Gg between the group G1 and the group G2 is preferably smaller than the width Wh of the belt of the resistance heating element 5. To do in this way is preferable because it is possible to prevent a drop of the in-plane temperature of the wafer W caused by a drop of the calorific value generating from the belt of the interval Gg.

Meanwhile, when the interval Gg is greater than the width Wh of the belt, the calorific value of the place Gg is decreased. Thus, when being heated, the place becomes a cool spot. Consequently, the temperature of the wafer W is lowered at the place alone, so that the entire uniform heating characteristic is deteriorated. As such, the interval Gg between the group G and the group G is preferably smaller than the width Wh of the belt. Further, in order to form the group G consisting of their channels m along the belt of the resistance heating element 5 at a high position accuracy, the positioning mark 7 is preferably formed between the group G and the group G. When the positioning mark 7 is adopted as a reference, the position accuracy in the width direction is enhanced with respect to the channel m and the belt of the group G. Thus, the in-plane temperature difference of the wafer W can be lessened.

Further, if the belt has a width of 1 to 3 mm, the interval between the group G and the group G of the channels m is preferably 1 mm or less. This is because the interval of 1 mm or less can prevent deviation of the current, and simultaneously has a small chance of generating the cool spot.

Further, the channel m is preferably formed by a laser beam. The laser beam can control a diameter of the beam with accuracy, wherein the diameter may be used between 5 and 100 µm, and preferably between 30 and 60 µm. The laser beam may employ, for example, YAG laser. Preferably, the channel m is formed under the conditions: wavelength of 1.06 µm, pulse frequency of 1 KHz, laser output of 0.1 to 2 W, and speed of 1 to 20 mm/sec.

Further, as in FIG. 6, in the case where the resistance heating element 5 is composed of a plurality of resistance heating element zones, each of the resistance heating elements 5a, 5b, 5c, 5d, 5e, 5f, 5g and 5h that can be independently heated is preferably formed with the positioning mark 7 on an outer side thereof. In particular, when the positioning mark 7 is formed at an equiangular position from the center of the plate shaped body 2 around each resistance heating element 5, the respective resistance heating elements 5 are divided at the position of the positioning mark 7, and each resistance value is adjusted, and thereby resistance distribution in the resistance heating element zones can be adjusted delicately. This is preferable in that the wafer heating device capable of adjusting the in-plane temperature difference of the wafer W in very small range, i.e., within 0.3° C. can be obtained.

Further, a width Wg of the group G is preferably within 90% of the width Wh of the belt of the resistance heating element 5. On one hand, this is because, in consideration that the fine and complicated resistance heating element 5 is generally formed by screen printing, a cross-sectional area of the resistance heating element 5 formed by screen printing is decreased due to a thickness of the region of left and right 5% of the width of the belt of the resistance heating element 5 as in FIG. 9. Further, the channel m is formed by a laser beam, etc., wherein a size of the channel m is determined by output and irradiation time of the laser beam. Generally, the output and irradiation time are not changed during forming the channel m, and thus a depth of the channel m is substantially uniform. So, when the channel m is formed at the place that is within 90% of the width of the belt of the resistance heating element 5 except a region where a thickness of its peripheral part is small, this is preferable in that there is no chance that the channel m passes through the resistance heating element 5 and that there is a small chance that a crack is generated on a bottom of the channel m. On the other hand, that is because, when the channel m is formed in excess of 90% of the width of the belt of the resistance heating element 5, the channel m is formed at a place where a film thickness on both ends of the resistance heating element 5 is thin, and thus there is a chance that the channel m passes through the resistance heating element 5 or the laser beam is applied to the plate shaped body 2 to generate a micro-crack.

Further, when the micro-crack is generated, there is a fear that the uniform heating characteristic is deteriorated because repetition of heating and cooling of the ceramic heater 1 causes the temperature difference of the surface of the wafer W to be increased. In the worst case, there is a fear that the plate shaped body 2 is destroyed.

Further, a depth of each of the channels m1, m2, . . . constituting the group G of the channels m is preferably in a range of 20% to 75% of a width Wm of each channel m, wherein depth/width of the channel is 20 to 75%. This is because, in consideration that, when being less than 20%, a change of the resistance value caused by formation of one channel m is small and thus an adjustment range of the resistance value gets small, it is difficult to sufficiently lessen the in-plane temperature difference of the wafer W.

Further, that is because, when the depth of the channel m exceeds 75% of the width Wm, there is a fear that the micro-crack is generated on the bottom of the resistance heating element 5 due to great energy of a first pulse of the laser, that repetition of heating and cooling causes the micro-crack to grow, and thereby the resistance value of the resistance heating element 5 is changed, and that the change of the resistance value causes the in-plane temperature difference of the wafer W to be increased, and thus it is impossible to maintain the uniform heating characteristic.

Figure 11A:
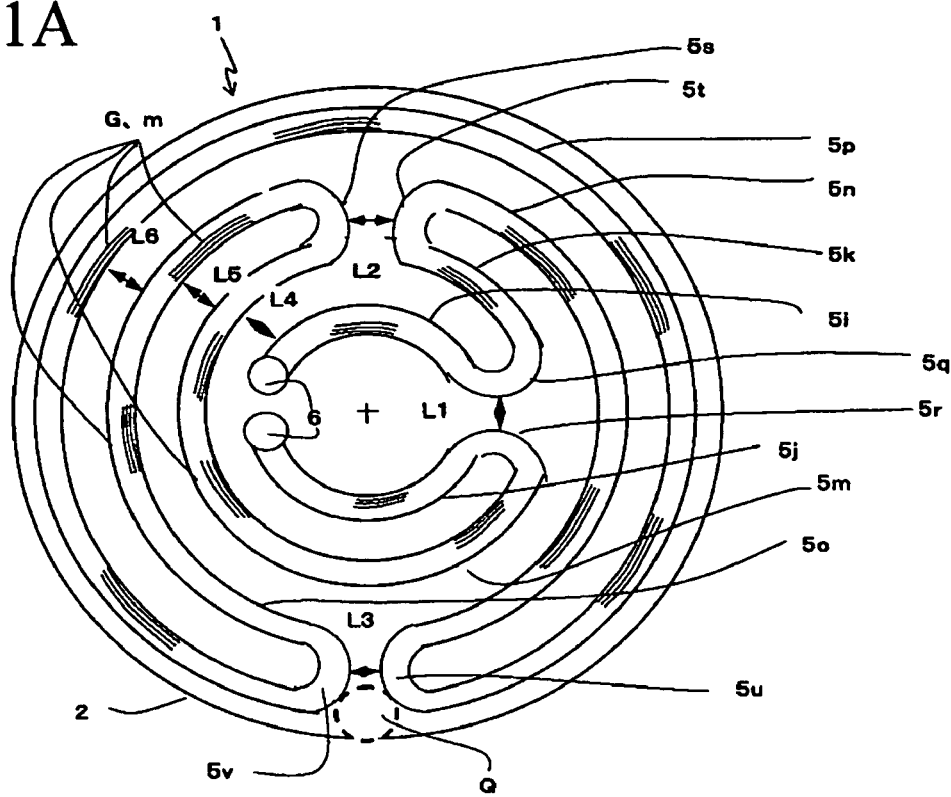
FIG. 11A is a plan view of the resistance heating element where the channels are unilaterally arranged on the side of the center of the plate shaped body.
Figure 11B:
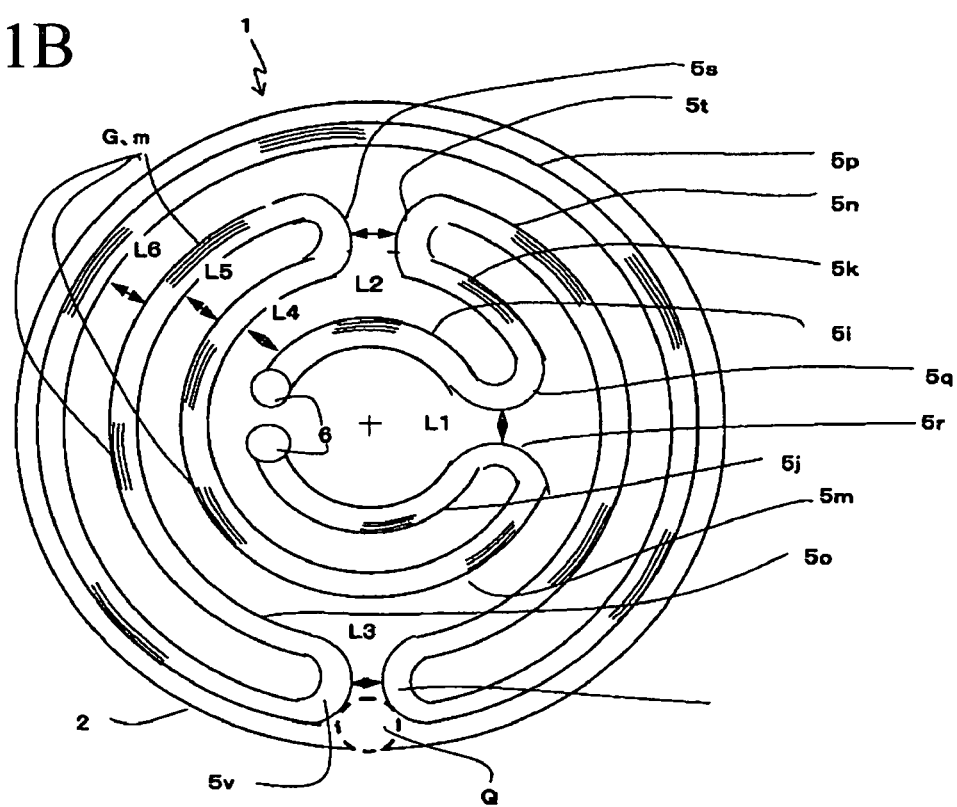
FIG. 11B is a plan view of the resistance heating element where the channels are unilaterally arranged on the side of the outer circumference of the plate shaped body.

Further, as shown in FIG. 11A, the ceramic heater 1 of the invention is characterized in that the resistance heating element 5 has the plurality of channels m parallel substantially to it length direction, and the channels m are unilaterally arranged on the side of the center (inside of the plate shaped body in a radial direction) of the plate shaped body 2. Further, as shown in FIG. 11B, the ceramic heater is characterized in that the channels m are unilaterally arranged on the side of the outer circumference (outside of the plate shaped body in a radial direction) of the plate shaped body 2. This is because, although the resistance heating element 5 is arranged on the surface of the plate shaped body 2 with good symmetry, when the channels m for adjusting the resistance value are formed at an irregular place of the resistance heating element 5, a heating region of the resistance heating element 5 is delicately varied depending on the position of the channels m, and thus the in-plane temperature difference of the wafer W is increased.

In contrast, when the channels m formed on the resistance heating element 5 are formed to be unilaterally located on the side of the center or outer circumference of the plate shaped body 2, the channels m can be arranged with good symmetry. Thus, the heating region of the resistance heating element 5 can be maintained at a nearly uniform temperature, so that it is possible to maintain the in-plane temperature difference of the wafer W at a temperature of 0.3° C. or less.

Here, the meaning that the channels m are unilaterally arranged on the side of the center or outer circumference of the plate shaped body 2 is either to form the channels m nearer the center than the center line on the basis of the length direction of the resistance heating element 5, or form the channels m near the outer circumference. Further, when the width of the channels m is more than a half of the width (short length direction) of the belt of the resistance heating element 5, the channels m is located on the center line, and thus this violates the above-described prescription. However, in this case, a side where the area of the channels m is more occupied on the resistance heating element 5 is determined as a unilaterally arranged direction. Further, although described below in detail, when the channels m constitutes the group G, it is good to apply the same concept.

Figure 12:
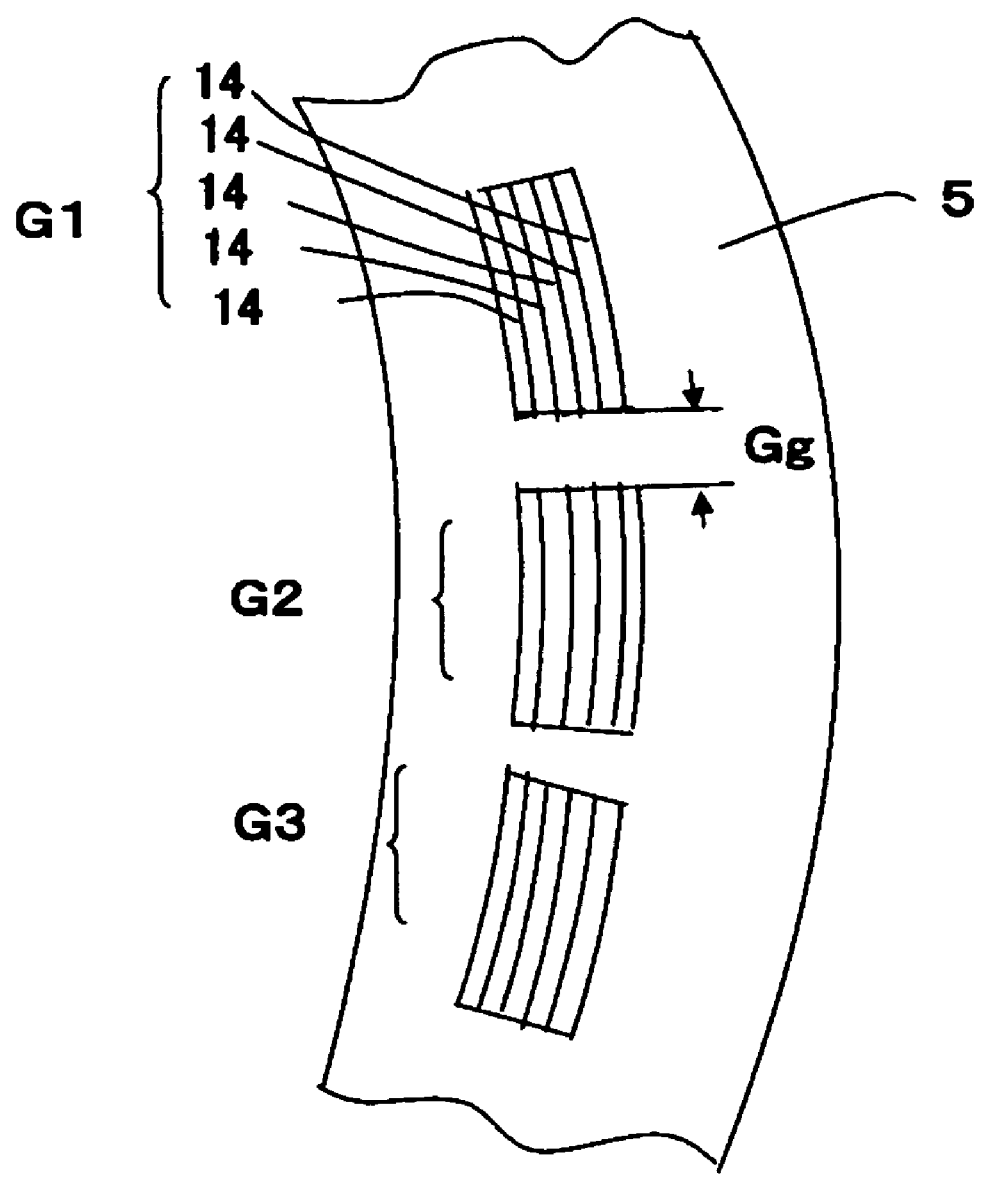
FIG. 12 is a plan view showing the channels formed continuously in the direction perpendicular to the belt of the resistance heating element of the heater of the invention.

Further, the ceramic heater 1 of the invention is characterized in that a plurality of channels 14 that are parallel substantially to a length direction of the belt and are continuous in a direction perpendicular to the belt are provided on the resistance heating element 5. As in FIG. 12, a resistance adjustment range can be efficiently widened by forming the plurality of channels 14 on the resistance heating element 5 in parallel. When the plurality of channels 14 continuous in the direction perpendicular to the belt of the resistance heating element 5 are formed, resistance can be adjusted for the width of the belt to the maximum extent because the channels 14 are connected one another in a width direction. This configuration allows the resistance value of the belt of the resistance heating element 5 to be greatly adjusted, an entire surface of the resistance heating element 5 formed on the mounting surface 3 of the plate shaped body 2 can be adjusted to a predetermined resistance value corresponding to in-plane of the wafer W of a large size. Thus, it is possible to make the in-plane temperature difference of the wafer W very small, i.e., within ±0.20° C. or ±0.10° C.

Since the resistance heating element 5 is formed by screen printing, it has deviation of the thickness or width when being observed on a micro scale and a porous structure. Thus, when the channels are formed to a level capable of adjusting the resistance by the laser beam, a crack may be generated at a bottom of the channels 14 formed by the laser beam. This crack is propagated up to the insulating layer which is provided between the plate shaped body 2 and the resistance heating element 5, or the plate shaped body 2. Specifically, the crack reaches the insulating layer or the plate shaped body 2 by thermal shock during heating and cooling. As in Patent Document 8, in the case that the laser beam is irradiated and begins to move when laser processing is initiated, or that the laser beam is decelerated and stopped when the laser processing is terminated, irradiation energy of the laser beam is increased in a depth direction of channel formation, the depth is increased at a part where the channels overlaps, and the laser beam arrives up to the insulating layer to cause insulation breakdown or the plurality of cracks 17 are generated from the bottoms of the channels 14 of the resistance heating element 5. Thus, the resistance of the resistance heating element 5 is greatly varied by a heating/cooling cycle. Ultimately, there is a fear of evolving into abnormal heating and disconnection.

Figure 13A:
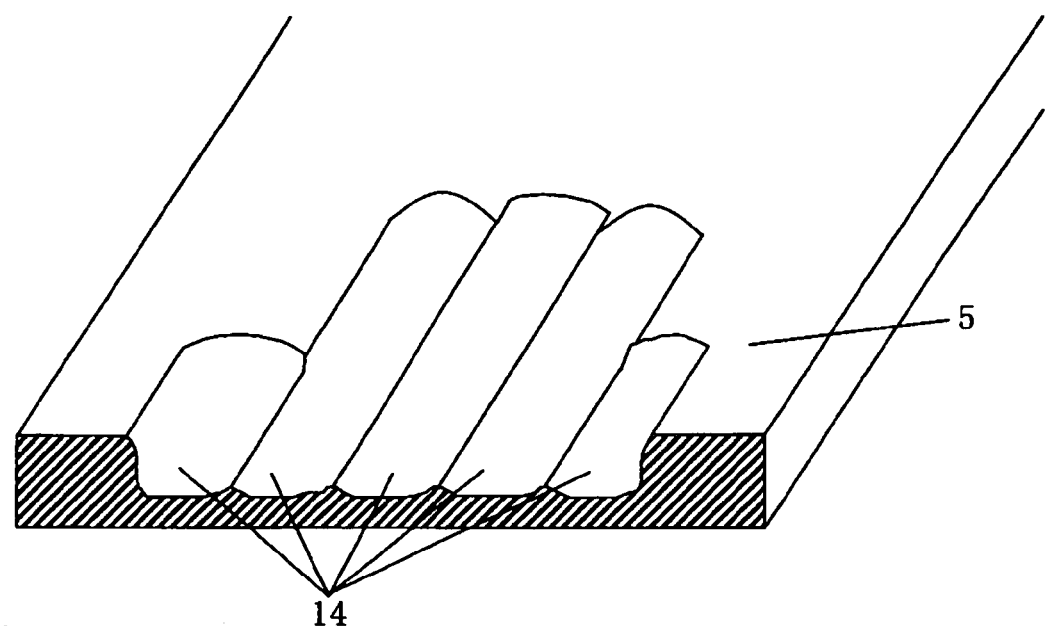
FIG. 13 is a partial cross-sectional perspective view of the belt of the resistance heating element in the heater of the invention.
Figure 13B:
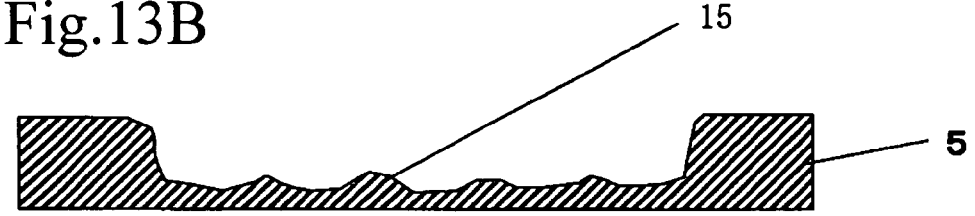

Thus, in the case of the resistance heating element 5 of the ceramic heater 1 of the invention, it is preferable that, as shown in FIG. 13, surfaces of the plurality of channels 14 have a smooth convex-concave surface in the cross section perpendicular to the length direction of the belt forming the resistance heating element 5. When the surfaces of the plurality of channels 14 have the smooth convex-concave surface, this is preferable in that it is possible to suppress increase or generation of the cracks from the channels 14 to the resistance heating element 5. Furthermore, stress of the interior of the resistance heating element 5 which is generated from deformation by formation of the channels 14 can be relaxed, so that it is possible to prevent the cracks from being increased or generated. Further, because it is possible to prevent the cracks, it is possible to suppress the abnormal heating generated at the crack part, so that a uniform heating characteristic is improved. This is considered to has an effect that, when the channels 14 are formed by the laser beam as in the invention, the next irradiation is performed at a position where it overlaps partially with the previously irradiated place, and the resistance heating element 5 between the channels 14 is fused, and thereby the cracks generated by the previous laser processing are removed. In order to form these channels 14, it is necessary to properly match a processing output of the laser beam with a processing speed. The laser is applied once after a laser beam oscillator is tuned to a movable mirror moving the laser beam, and than the movable mirror moves so that the next irradiation is performed at the position where it overlaps partially with the previously irradiated place. In this case, it is preferable that the channels 14 are formed so as to control and irradiate the next laser beam to form the individual channel 14 and make the plurality of channels 14 continuous.

Figure 14:
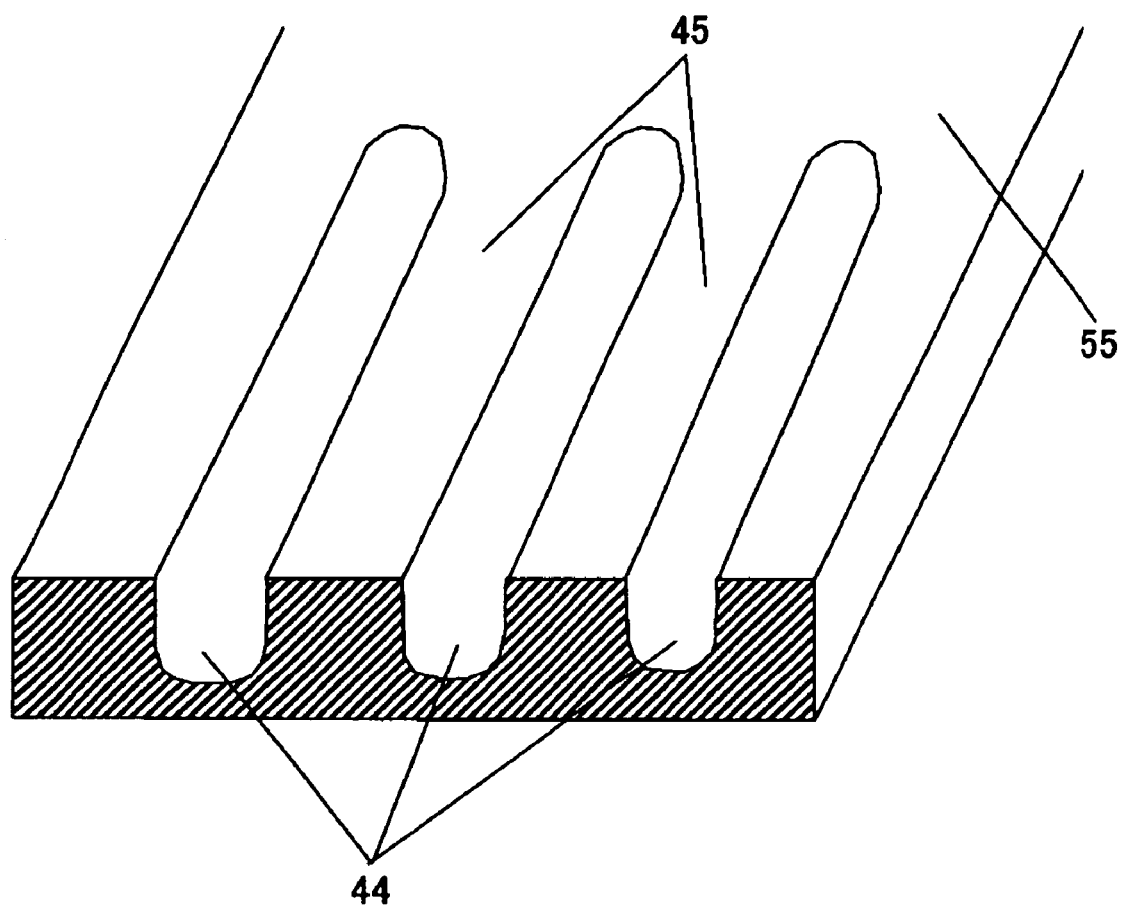
FIG. 14 is a partial cross-sectional perspective view showing a conventional channel.

As in FIG. 14, when the channel 44 and the channel 44 are separated without continuity, this is not desirable in that, a wall 45 of a continuous trapezoid shape is generated between the channels, the trapezoidal wall 45 facilitates to generate the cracks, the trapezoidal wall 45 comes out when the resistance heating element 5 is rapidly heated or cooled, and thus there is a chance that the in-plane temperature difference of the wafer W is increased, thus it being not preferable.

Further, it is preferable that, among the plurality of the channels 14 in succession, some channels 14 have a length different from the others. In order to adjust the calorific value on the entire surface of the resistance heating element 5 as heating the entire surface of the large-sized plate shaped body 2, the resistance heating element 5 is divided into about 50 to 200 regions, the channels 14 are formed so as to cover the resistance values of the divided regions within a predetermined value, and then the calorific value of each divided region is adjusted. Thereby, it is possible to adjust and lessen the in-plane temperature difference of the wafer W. The channels 14 are formed so that the resistance values of these divided regions are previously determined. However, because the channels 14 are formed while resistances of both ends of each divided region are measured by directly contacting a probe, but the resistance values are measured while the laser processing is performed, the resistance value when a temperature of a part where the laser processing is performed is increased is different depending on a temperature coefficient of the resistance heating element 5. However, because the resistance value is greater than a resistance value at a room temperature, there is a fear that the resistance value is delicately different at the room temperature although it is adjusted to a predetermined resistance value. Thus, the plurality of channels 14 are formed while the resistance value of the resistance heating element 5 is measured, and then irradiation of the laser beam is stopped first when approaching the predetermined resistance value. After the resistance heating element 5 is cooled down to the room temperature, the resistance value of the resistance heating element 5 is measured and compared with the predetermined resistance value, and the last channel 14 is formed. Thereby, it is possible to adjust the resistance value of each region with good accuracy. Further, the channel 14 which corresponds to the last of the plurality of channels 14 formed on each region makes its length shorter than the other channels 14, and thereby it is possible to delicately adjust the resistance value of the region. This is preferable in that the in-plane temperature difference of the wafer W can be more lessened. Further, it is preferable that, in order to adjust the resistance value of each region, after the channel 14 shorter than the others is formed to adjust the resistance, the irradiation of the laser beam is stopped again to lower the temperature of the resistance heating element 5 to the room temperature, and the resistance is measured to form a predetermined length of channel 14 for adjusting the resistance in a more delicate manner. In this manner, the resistance value of each region is adjusted, so that it is possible to precisely adjust the resistance value of each region. It is possible to lessen the in-plane temperature difference of the wafer W, thus it being preferable.

Further, the channel 14 on an outer side of the plurality of channels 14 in succession preferably has a length shorter than the other channels 14. This is because it is preferable that forming the channels 14 at the center of the belt has a small fear of varying symmetry of all the resistance heating elements 5. Further, these channels 14 are formed in such a manner that the first channel 14 is formed at the center of the belt, and then on the outer left and right sides thereof in sequence. The last channel 14 is formed shorter than the other channels 14 on the outer side of the other channels 14, which is because it is possible to accomplish fine resistance adjustment.

Figure 15:
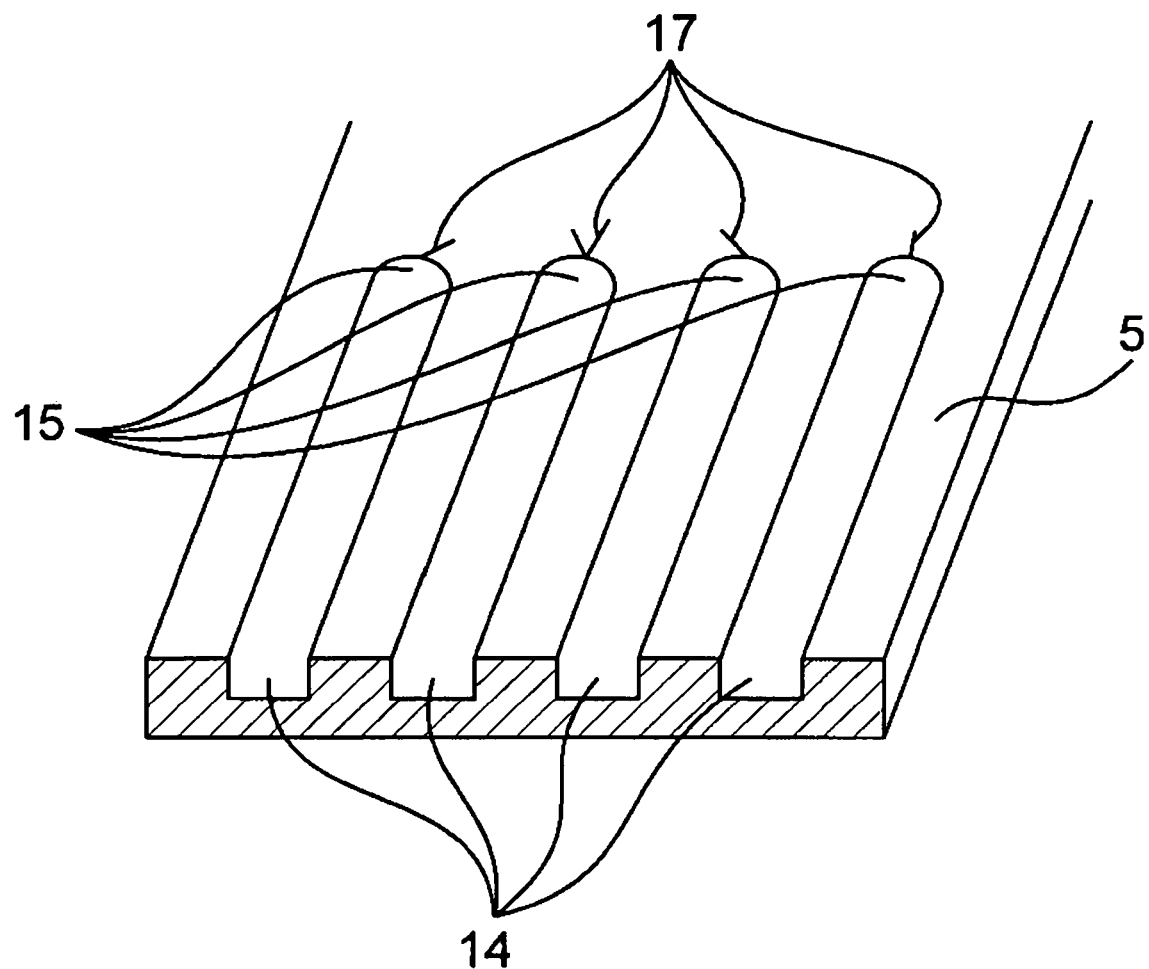
FIG. 15 is a perspective view showing an embodiment of the laser beam trimming of the resistance heating element in the heater of the invention.

Further, as to the ceramic heater 1 of the invention, as shown in FIG. 15, the resistance heating element 5 is characterized to have a channel 14 parallel substantially to a length direction of the belt and an edge of the channel 14 in an arc shape.

The arc shape is characterized to increase a radius of curvature of the edge of the channel 14 so that a crack is hardly generated from the channel end because a stress at that point is relaxed. Herein, a diameter of an arc along a leading end of the end is preferably 0.5 to 3 times a width of the channel because crack is hardly generated. Also, the arc shape is indicated as a closed curve connecting two contour lines defining the width of the channel 14. The closed curve is formed by describing an arc while doing the diameter of the arc shape as a distance between ends of the two contour lines. Specifically, the diameter can be calculated by a least square method and the like.

Meanwhile, since the resistance heating element 5 is formed by a screen printing method so that there exists a minute thickness deviation, the resistance heating element 5 is required to adjust a resistance value thereof through processing a channel thereto. A laser beam may be prefer- ably used in that channel-processing. Herein, if a scanning speed of the laser beam at an edge of the channel is high, a crack may be generated in the resistance heating element 5 because the edge of the channel is sharpened in an acute angle. However, if synchronizing a pulse ray of the laser beam with a working position thereof as not to be deviated from time and position for which one pulse ray of the laser beam irradiates, a thermal stress concentration is hardly generated at the edge of the channel in that the edge of the channel can be formed in a smooth shape as an arc shape, which is preferable because there is no fear that the crack is generated.

Next, a method of fabricating the ceramic heater 1 of the invention will be described.

The ceramic heater 1 of the invention, preferably, forms the channels 14 by use of the laser beam, measures the resistance value of the resistance heating element 5 forming the channels 14 to compare it with the predetermined resistance value, and forms new channels 14 along the channels 14 by use of the laser beam so that the resistance heating element 5 reaches the predetermined resistance value. It is preferable to provide a comparator measuring the resistance value of the resistance heating element 5 forming the channels 14 by use of the laser beam and comparing the measured resistance value with the predetermined resistance value, and to the new channels 14 along the channels 14 by use of the laser beam to reach the predetermined resistance value. In this manner, the resistance value of the resistance heating element 5 forming the channels 14 by use of the laser beam is measured and compared by the comparator. When the measured resistance value does not reach the predetermined resistance value, the new channels 14 are formed to again reach the predetermined resistance value along the channel 14 by the laser beam. This is preferable in that, because the resistance value of each region can be covered by the predetermined resistance value, it is possible to lessen the in-plane temperature difference of the wafer W.

Further, it is preferable to have a process of forming the channels by use of the laser beam during measuring the resistance values of both ends of the resistance heating element 5 to roughly adjust the measured resistance value, a process of measuring the resistance value without the laser beam applied to the resistance heating element 5, and a process of forming channels 14 shorter than the channels 14 along the channels 14 to again reach the predetermined resistance value. When the channels 14 are continuously formed while the resistance values of both ends of the resistance heating element 5 are measured to reach the predetermined resistance value, this is preferable in that it is possible to form the channels 14 for a short time. However, because a part of the resistance heating element is heated when the resistance is measured while the laser beam is applied, there is a chance that the resistance of the resistance heating element 5 is greatly measured, so that it is impossible to adjust the resistance with high precision. Hence, in order to more minutely exactly adjust the resistance, it is important to stop irradiation of the laser to measure the resistance value of the resistance heating element 5 after the channels 14 are formed, and furthermore it is important to measure the resistance value at a room temperature. As set forth above, in the state where the laser beam is irradiated, the temperature of the resistance heating element is partly enhanced, and thus there is a fear that the measured resistance value is increased, and it is difficult to exactly measure the resistance value. However, by stopping radiation of the laser beam and measuring the resistance when the temperature of the resistance heating element 5 is set to the room temperature, it is possible to obtain more exact resistance value. In addition, when the irradiation of the laser beam is stopped for about 100 m/sec, the temperature of the resistance heating element 5 can return to the room temperature, so that it is possible to measure the exact resistance value. Further, on the basis of the exact resistance value, the channels 14 for adjusting the length of the channels 14 to be short are formed, so that it is possible to delicately adjust the resistance.

Next, a process of trimming the resistance heating element by use of the laser beam in accordance with the invention will be described in more detail.

A processing quantity by the laser beam is determined by a product of an output and an irradiating time of a processed part. When a processing speed is varied, the processing quantity is varied on the whole. In addition, formation of the channels 14 is carried out by using a YAG laser beam having a wavelength of 1.06 μm and by setting a trimming speed to a range of 5 to 20 mm/sec. The output is about 0.5 W, and a spot diameter is about 60 μm. In the processing by the laser beam, when the resistance heating element 5 on the insulating layer 4 is processed, a depth of the channels 14 for adjusting and forming the output of the laser beam is preferably set to about ⅔ of the thickness of the resistance heating element 5. For example, when the laser output is adjusted to completely pass through the resistance heating element 5, due to deviation of the thickness of the resistance heating element 5, there is a fear that, at a place where the thickness of the resistance heating element 5 is thin, the laser beam arrives up to the insulating layer 4, and thus the insulating layer 4 is destroyed. Further, when the laser output is adjusted to form the channels 14 to be thin in a thickness direction of the resistance heating element 5, a range of the resistance value capable of being adjusted by laser processing is lessened. Therefore, the number of processed channels 14 is increased, and a time which it takes to perform the laser processing is increased. Consequently, working efficiency is deteriorated.

Figure 17:
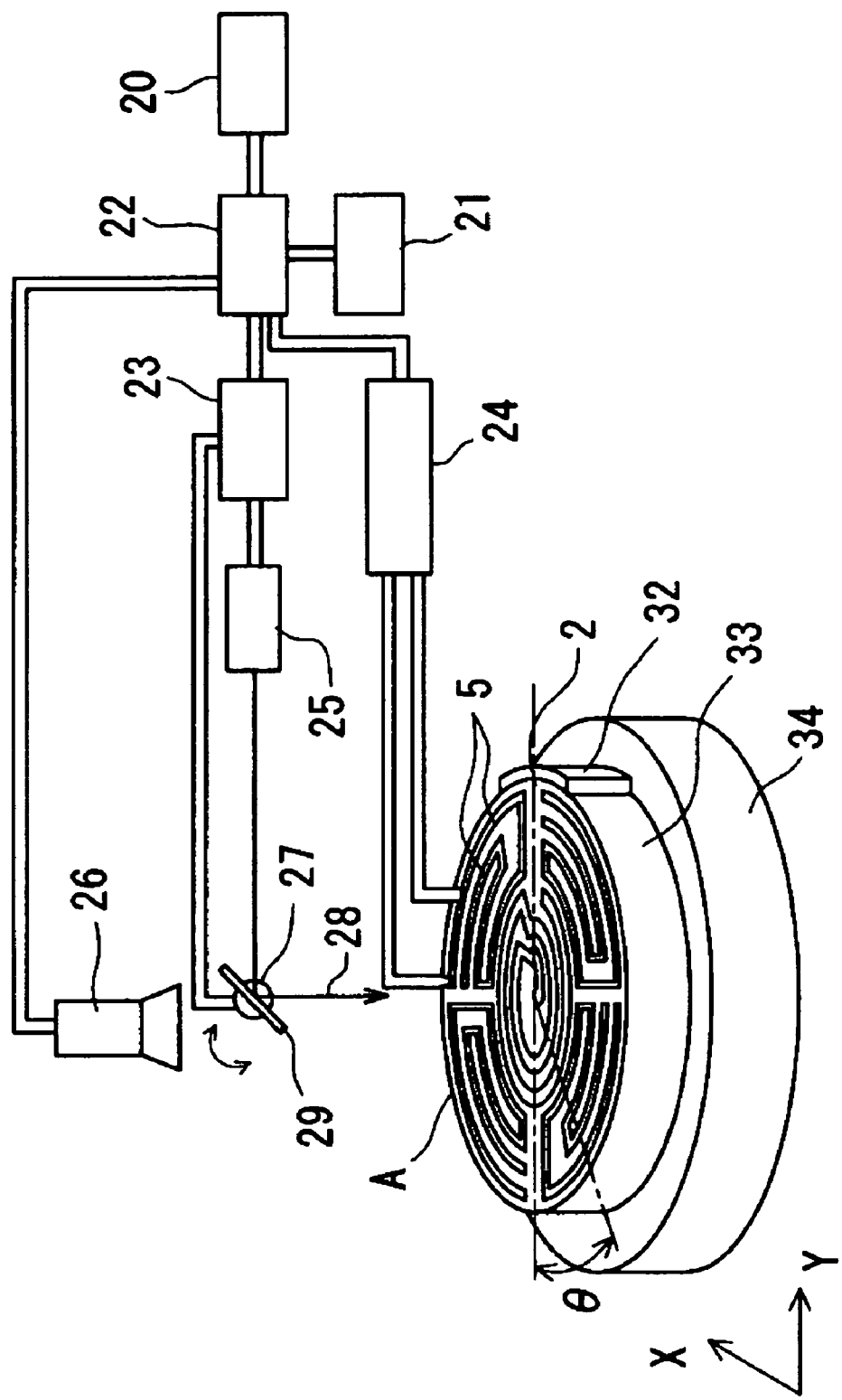
FIG. 17 is a schematic diagram showing the laser beam processing device of the invention.
Figure 18:
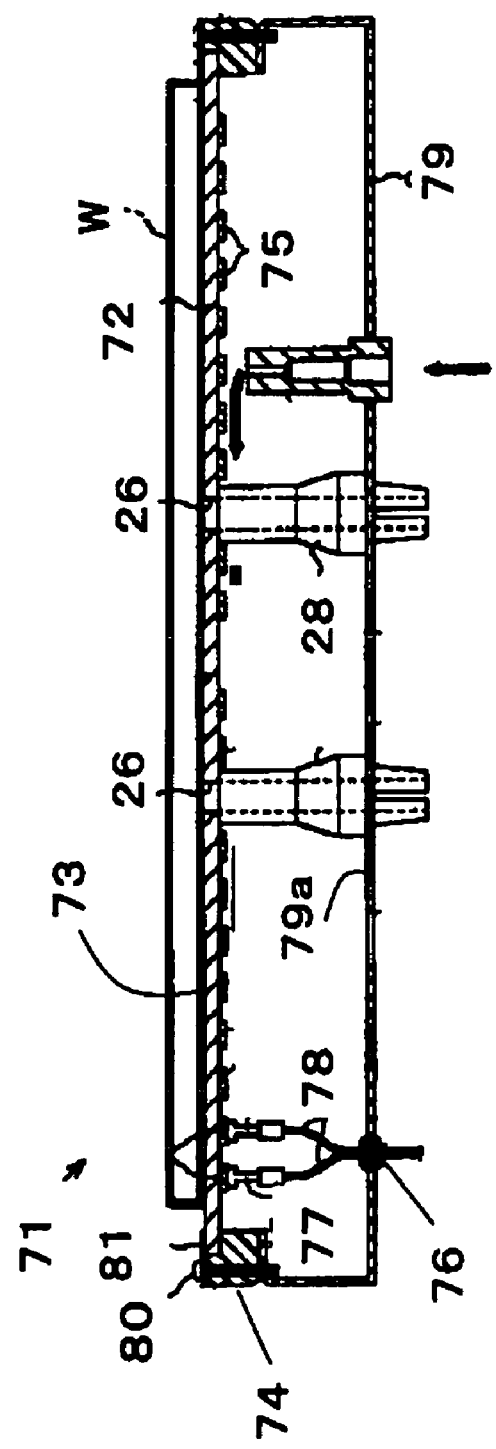
FIG. 18 is a cross-sectional view of a conventional heater.
Figure 19:
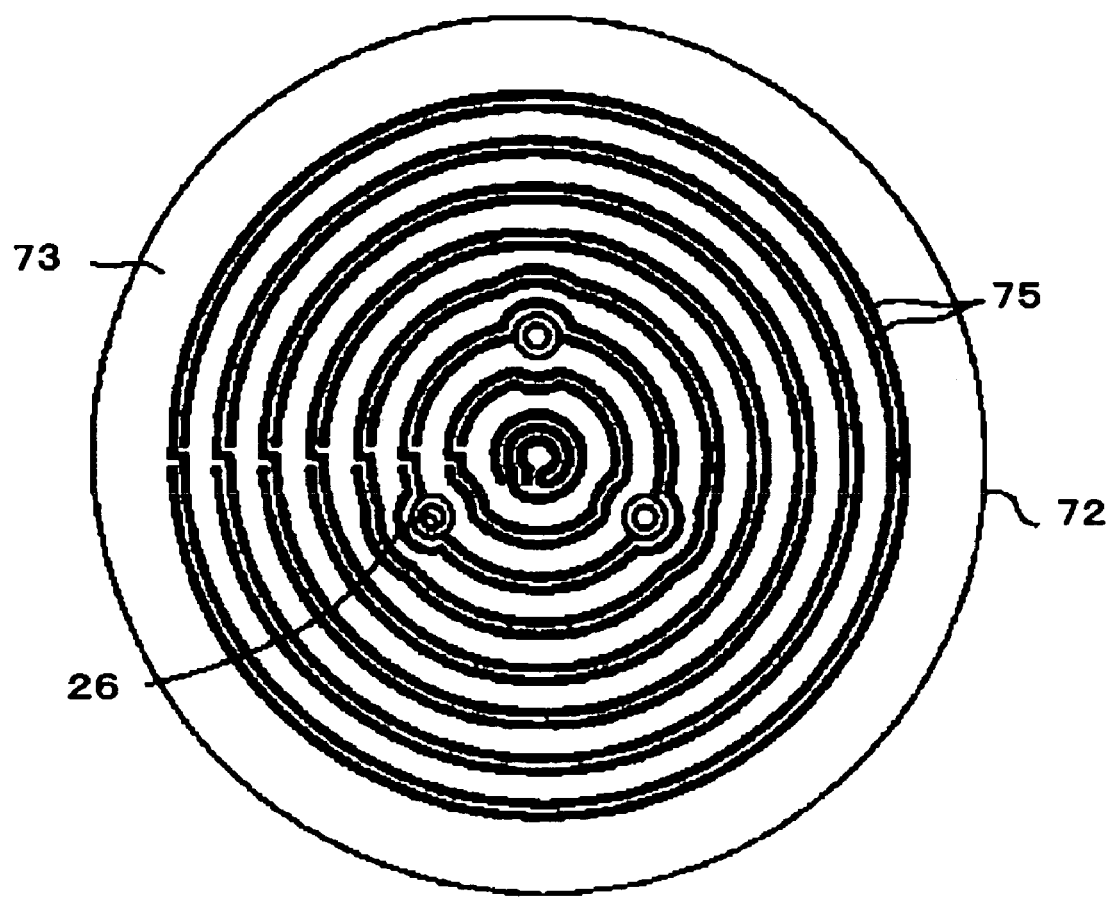
FIG. 19 is a diagram showing a resistance heating element in a conventional heater.

In the case of laser trimming of the invention, a resistance value of the belt-like resistance heating element 5 is measured per predetermined length by a four-terminal method in advance, and differences between the measured resistance values and a targeted resistance value are calculated and obtained. The obtained differences are inputted into a laser trimming device at each part. As shown in FIG. 17, a laser beam oscillator 25 having a movable mirror 29, and a movable table for loading the plate shaped body 2 having the belt-like resistance heating element 5 are provided, a laser beam emitted from the laser beam oscillator is applied to a belt of the resistance heating element 5 by a difference from a targeted resistance value, thereby the channels 14 are formed. In this process, the laser beam is irradiated via the movable mirror 29 on a fixed table and movable table, so that the belt-like channels 14 can be formed. A YAG laser beam having a wavelength of 1.06 μm is used a spot diameter is about 60 μm. In the laser processing of the invention, a time capable of being irradiated at one point in brief, the number of times of pulses is prescribed in advance. This is because it is necessary to set power enough to pass through the resistance heating element 5 not to destroy the insulating layer 2 as a laser processing condition. Here, when the irradiating time and output of the laser, and timing of the movable mirror 29 are not satisfied, the laser beam is applied at one place for a long time, a plurality of cracks are generated around the bottom of the channel 14, or the bottom of the processed channel may be formed deeply at an acute angle because the laser beam moves during irradiation.

Further, when constituents of the resistance heating element 5 are changed, the processing condition is changed. Here, preferably, a pulse laser beam of the laser beam oscillator 25 and rotation of the movable mirror 29 are synchronized, and the movable mirror 29 moves so that, after applied one, the laser beam is applied to a place overlapping with the previous processing place, and then is controlled to apply the next laser.

Processing position and length of the laser are registered as X-axis and Y-axis coordinate data, running angle data, and distance data in advance. The plate shaped body 2 is placed on the movable table 34, coordinates of a position alignment point that is not shown in the figure is read by a camera 26, and a processing start and stop positions are determined.

The laser beam emitted from the laser beam oscillator 25 processes the channels 14 to the resistance heating element 5 on the plate shaped body 2 via the movable mirror 29 controlled to be irradiated at the processing position. Because a processing area is limited to a traveling distance of the laser beam irradiated via the movable mirror, the plate shaped body 2 moves in sequence on the movable table 34, the channels 14 are processed throughout the belt of the resistance heating element 5 on the plate shaped body 2, and thus it is possible to adjust the resistance value. In brief, while the resistance value is measured on the basis of the difference from the targeted resistance value, the laser beam is irradiated to finish the resistance heating element per predetermined length. Thereby, the plurality of channels are formed, and the resistance value is again adjusted plural times until it reaches a predetermined resistance value. As such, the ceramic heater 1 of the invention is characterized in that among the plurality of continuous channels, some have a length different from the others. Further, it is characterized in that the channel of an outer side of the plurality of continuous channels has a length shorter than the others. In this manner, since the processing and checking by the measurement are repeated, it is possible to restrain accumulation of deviation of the resistance value to a minimum extent.

After the plate shaped body 2 adjusted in resistance is cleaned, it is assembled into the ceramic heater 1 by combination with other parts. Then, by applying a voltage by which a temperature of the entire plate shaped body 2 could reach 350° C. in 1 minute, maintaining as it is for 3 minutes, applying a heating/cooling cycle for 5000 cycles for forcibly cooling down to 40° C. or less in 2 minutes by use of air of 6 kg/mm$^3$ and 80 L/min, any variation of a resistance value was examined at a part of the belt forming the channels 14 before and after the heating/cooling cycle. That resistance variation is compared with an initial value, to be within 5% can be resistant to practical application, but to be beyond 5% is not practical. When exceeding 5%, local heating is generated, and thus uniform heating of the ceramic heater 1 is not maintained. Further, due to the variation of the resistance value of the resistance heating element 5, an output of the ceramic heater is unbalanced, and moreover the wafer W is non-uniformly heated when the wafer W is loaded.

Further, as shown in FIG. 1, because a means for connecting the power supply part 6 and a conductive terminal 11 is pressured by the elastic element 18, and because an expansion difference caused by a temperature difference between the plate shaped body 2 and the support 19 is relaxed by sliding of a contacted portion, it is possible to obtain the wafer heating device 1 which is excellent with respect to a heating cycle that is in use.

Further, in the case where the wafer heating device 1 for them is used for forming a resist film, when a material consisting essentially of nitride is used as the plate shaped body 2, an ammonia gas is generated by reacting with moisture, etc. in air to thus deteriorate the resist film. For this reason, a material composed of carbide such as silicon carbide or boron carbide is preferably used as the plate shaped body 2. Further, at this time, it is necessary to prevent nitride having a possibility to form ammonia or amine by reaction with water from being included in the sintering aids.

Using ceramics such as carbide or nitride, the plurality of patterns dividing the resistance heating element in the concentric circular shape are adjusted in resistance by the trimming that forms the channels by the laser beam, and the wafer heating device using the ceramic heater heated by causing current to flow to the patterns is mounted to the semiconductor fabricating device. The semiconductor fabricating device has a short processing time such as heating, drying, etc. of the resist, and accomplishes improvement of precision of the heating temperature and shortening of the wafer processing time, and thus realizes saving of running costs thereof. As a result, it is possible to form the fine wiring on the wafer W densely.

In addition, as to the fabricating method relating to the ceramic heater 1 which forms the edge of the channel m in an arc shape, if upon laser processing, rendering a moving speed of the laser beam fast, the laser beam is moved as irradiated so that arc diameter of a processed end 15 of the channel becomes less than 0.5 times the width of the channel. Repetition of ohmic heating and forced cooling alternatively as it is, a stress by expansion and restriction of the resistance heating element 5 is concentrated on the channel end, from which a crack 17 is generated, thus resistance being changed. In addition, an abnormal heating and a wire breakage may be finally caused. Furthermore, in a similar manner, it may occur just before the termination of the laser processing.

Accordingly, in order to form the processed end 15 of the channel in an arc shape, it is required not to properly regulate a process output and process speed of the laser beam, but also to synchronize a laser beam oscillator with a movable mirror for moving the laser beam to control the movement of the movable mirror so as to control irradiation such that preferably, after a pulse ray of the laser beam is irradiated once, the movable mirror is moved into a place partially overlapped with the previous irradiating place to conduct the next time irradiation of the laser beam at the moved place.

Further, upon laser processing, preferably, gas such as air and the like is always injected onto the irradiating place of the laser beam and the injected gas is absorbed. In this case, there may cause a problem in that the mirror surface for laser reflection is contaminated with burning smoke and processing waste generated in processing to change an output, a spot diameter and so forth of the laser beam, with the result that the arc diameter of the processed end 15 of the channel becomes less than 0.5 times the width of the channel, so that if, under that state, the ohmic heating and the forced cooling are alternately repeated, a stress by expansion and restriction of the resistance heating element 5 is concentrated on the channel end thus to generate a crack 17 from the channel end, to change resistance, finally to cause abnormal heating and wire disconnection.

Furthermore, as in Patent Document 9, in case of adjusting a thickness of the resistance heating element with a grinding before a laser trimming, because the resistance heating element includes glassy material, pores therein is remained as vacancies with crack by the grinding to change resistance possibly causing abnormal heating and wire disconnection.

Herein, although the trimming has been described with reference to the output of the laser beam as a parameter, the processing quantity by the laser beam is determined by multiplying the output with the irradiating time for the processing place so that if changing the processing speed, the processing quantity is changed in all. In addition, this embodiment was conducted under the conditions in which YAG laser beam was used that had 1.06 μm in laser wavelength, a trimming speed was preset as 2 to 20 mm/sec, the output was about 0.5 W, and the spot diameter was about 50-60 μm.

In laser beam processing, in case of processing the resistance heating element 5 on the insulating layer 4, the output of the laser beam is preferably adjusted such that a depth of the channel 14 formed corresponds to ¼ to ⅚ times or so the thickness of the resistance heating element 5. For instance, if adjusted in the laser output as to completely pass through the resistance heating element 5, due to existence of thickness deviation in the resistance heating element 5, at thin place in the resistance heating element 5, the laser beam reaches up to the insulating layer 4 to possibly cause an insulation breakdown in the insulating layer 4. In addition, if adjusted in the laser output as to process the resistance heating element 5 to form the channel 14 thinly in a thickness direction thereof, a range of the resistance value controllable by the laser processing becomes smaller, requiring to increase the number of the channel 14 to be processed, which increases process time for laser processing thus to degrade a working efficiency.

In addition, although, upon channel processing, it is preferable not to make generation of the crack 17 in the resistance heating element 5, it has been discovered that if the number of the crack 17 generated in the resistance heating element 5 in the channel processing direction would be 5 or less per an edge of the processed channel, good endurance would be maintained. If it would be 6 or more, resistance change becomes larger so that there is a concern of being not responsive to a minute temperature change. Further, from the durability evaluation, a length of the crack 17 is preferably preset to be 100 μm or less.

Figure 16:
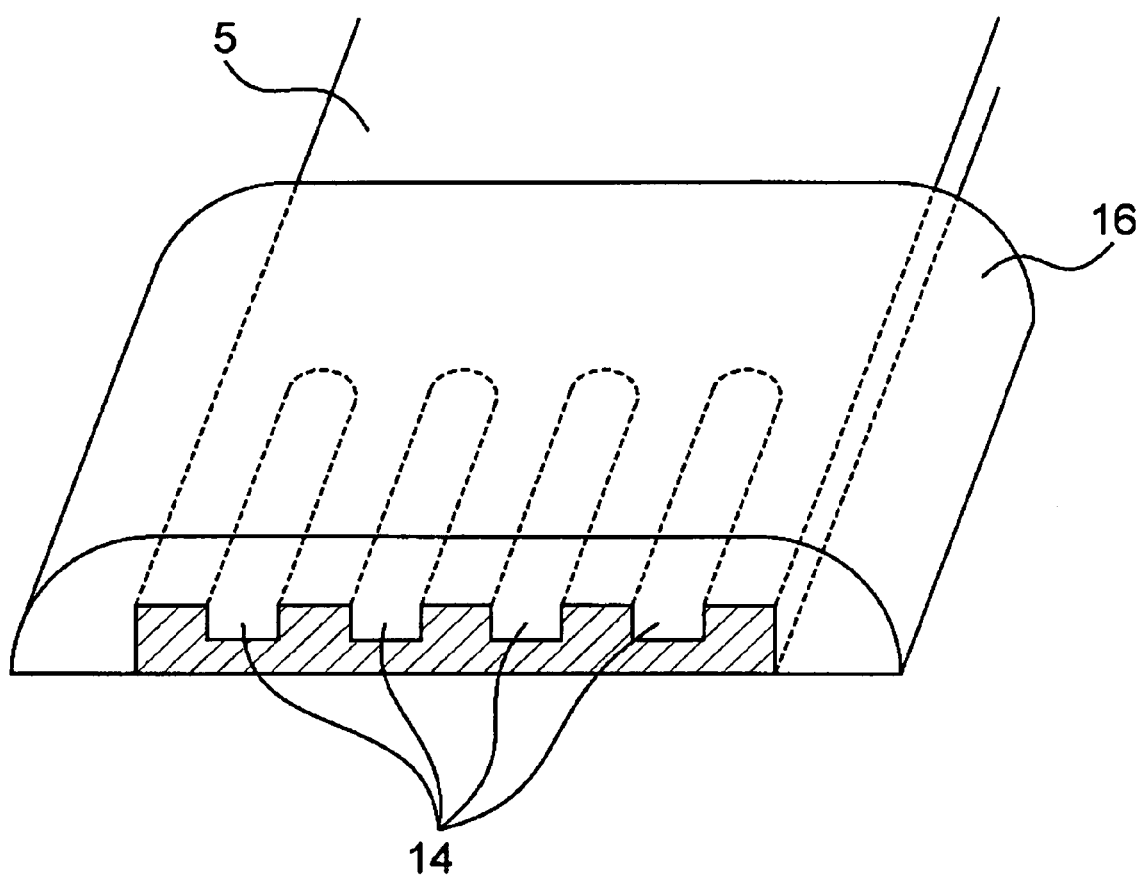
FIG. 16 is a perspective view showing an embodiment of a passivation layer.

Still further, as shown in FIG. 16, the wafer heating device 1 of the invention may have more enhanced durability, through forming a passivation layer 16 to the processed end 15 of the channel on the resistance heating element 5 to obtain an effect of restricting the propagation of the crack 17.

Still further, as shown in FIG. 1, if forming the passivation layer 16 also on the resistance heating element 5 near the air injecting outlet 24 suffering the most serious thermal shock, the ceramic heater with more excellent durability may be obtained. This is because the generation of crack 17 due to thermal shock as well as the erosion of the resistance heating element 2 due to the high pressure air flow can be prevented. Also, other part of the resistance heating element 5 is preferably exposed without being covered with the passivation layer 16. This is because if the resistance heating element 5 is exposed, air is introduced during cooling to discharge heat from the resistance heating element 5. Also, other part of the resistance heating element 5 means a part that is not exposed by the passivation layer 16 which is hard to expect a cooling effect by the air injecting outlet 24.

In the laser processing of the invention, irradiating time for one point, e.g., frequency of the pulses should be prescribed. As described before, this is because it is needed to preset a condition of laser processing likely to have a power to the extent of only passing through the resistance heating element 5 without destroying the insulating layer 4. Herein, if the laser irradiating time, the output and the timing of mirror 29 deviate, the laser beam is irradiated to one place for a long time to generate a plurality of cracks near the processed end 15, otherwise, the laser beam is irradiated while being moved, allowing the processed end 15 to have an acute angle. Also, if constitutional elements of the resistance heating element 5 are changed, such processing condition is also changed.

Herein, preferably, the pulsed laser beam of the laser beam oscillator is synchronized with the rotation of the movable mirror to control the irradiation of the laser beam such that after the laser beam is irradiated once, the movable mirror is moved to conduct the next time irradiation as to irradiate to a place partially overlapped with previous processing place.

Further, the processing start/stop positions are determined such that a laser processing position and length is previously registered as X-Y coordinate data and distance data, the plate shaped body 2 is loaded on the movable table, and the coordinate of the positioning point not shown in the drawing are read out with an image sensor device. Also, upon laser processing, the movable table always has at the upper part a gas injecting port and a discharge port so as to remove burning smoke or dusts such as processing waste and the like from the irradiated surface of the laser beam. This is aimed at preventing an output change of the laser beam due to a surface contamination of the movable mirror by the burning smoke and the processing waste generated upon processing.

Meanwhile, if delivery and exhaust of gas are not conducted, the surface of the mirror is contaminated due to burning smoke and the processing waste generated upon processing, with the result that the output, the spot diameter of the laser beam and the like are to be changed, so that the arc diameter of the processed end 15 of the channel becomes less than 0.5 times the width of the channel. Alternatively repeating the ohmic heating and the forced cooling under that state, the stress by the expansion and the restriction of the resistance heating element 5 is concentrated on the processed edge of the channel to form a crack 17 from the channel end, to change resistance, thus to possibly cause the abnormal heating and the wire disconnection.

The laser beam oscillated from the laser beam oscillator processes the channel 14 in the resistance heating element 5 on the plate shaped body 2 through interposing the movable mirror 29 to irradiate the laser beam to the processing place. Since the processing area is restricted from a range of the laser beam irradiated via the movable mirror, the plate shaped body 2 is sequentially moved by use of the movable table 20 to process the channel 14 along the whole belt of the resistance heating element 5 on the plate shaped body 2, thereby adjusting the resistance value.

The laser processing process is conducted by the following sequence. The resistance value of the belt type resistance heating element 5 is previously measured for every certain length thereof, and a difference between the target resistance value and the measured value is inputted as data into the laser processing device. Based on the data, the resistance value is measured and the resistance value is increased to conduct adjustment of the resistance value.

Resistance adjusted plate shaped body 2 is cleaned and then combined with other components thus to be assembled into the ceramic heater 1. Further, the boron carbide sintered compact can be obtained by mixing carbon of 3 to 10% by weight as the sintering aids with boron carbide as the main constituent, and then hot-press baking the mixture at 2000 to 2200° C.

Further, boron nitride sintered compact may be obtained by mixing 30 to 45% by weight aluminum nitride and 5 to 10 wt % rare earth element oxide as a sintering aids with boron nitride of major element and hot press sintering the same at 1900 to 2100° C.

Still further, aluminum nitride sintered compact forming plate shaped body 2 may be obtained by adding and sufficiently mixing rare earth element oxide such as $Y_2O_3$, $Yb_2O_3$ and so forth as a sintering aids and, if necessary, alkaline-earth metallic oxide such as CaO and so forth with aluminum nitride of major element thus to process the same in plate shape, and sintering the same at 1900 to 2100° C. under nitrogen gas atmosphere.

Yet still further, boron carbide sintered compact may be obtained by mixing 3 to 10% by weight carbon as a sintering aids with boron carbide of major element and hot press sintering the same at 2100 to 2200° C.

Further, the silicon nitride sintered compact to form a plated shaped body 2 can be obtained by mixing earth-rare element oxide of 3 to 12% by weight and $Al_2O_3$ of 0.5 to 3% by weight as the sintering aids with silicon nitride as the main constituent, together with $SiO_2$ which has 1.5 to 5% by weight as a quantity of $SiO_2$ included additionally in the compact, and then hot-press sintering at 1650 to 1750° C. Here, the quantity of $SiO_2$ refers to the total sum of $SiO_2$ generated from an impurity, oxygen, contained in a raw material of silicon nitride, $SiO_2$ serving as an impurity contained in other additives, and $SiO_2$ added intentionally inclusive of an influence from an atmosphere Further, the temperature of the plated shaped body 2 is measured by the thermocouple 27 whose leading end is buried in the plated shaped body 2. As the heat-uniformity planar body 100, it is preferable to use a sheath thermocouple 27 having an outer diameter of 1.0 mm or less in a point of view of a response characteristic and a working characteristic of maintenance. An intermediate part of the thermocouple 27 is supported on the plate-like structure 21 of the support 7 such that no force is applied to the leading end buried in the plated shaped body 2. The leading end of the thermocouple 27 is preferably pressed and fixed on an inner wall surface of a hole, which is formed on the plated shaped body 2, by a spring material installed in the hole in order to improve reliability of temperature measurement.

Further, in the case where this wafer heating device 1 is used for forming a resist film, when a material consisting essentially of nitride is used as the plate shaped body 2, an ammonia gas is generated by reacting with moisture, etc. in air to thus deteriorate the resist film. For this reason, a material composed of carbide from silicon carbide or boron carbide is preferably used as the plate shaped body 2.

Further, at this time, it is necessary to prevent nitride having a possibility to from ammonia or amine by reaction with water from being included in the sintering aids. Thereby, it is possible to form a fine wiring on the wafer W with high accuracy.

Meanwhile, in case that a silicon carbide sintered compact is used as the plate shaped body 2, glass or resin can be used as the insulating layer 4 for maintaining insulation between the semi-conductive plate shaped body 2 and the resistance heating element 5. Herein, in case that the glass is used, if its thickness is less than 100 μm, electric strength does not reach 1.5 kV not to maintain the insulation, and on the contrary, if exceeds 600 μm, a difference of thermal expansion from that of the silicon carbide sintered compact forming the plated shaped body 2 and the insulating layer becomes so larger not to function as an insulating layer 4 because of the generation of crack. Thus, in case that glass is used as an insulating layer 4, a thickness of the insulating layer 4 is preferably formed in a range of 100 to 600 µm, preferably 200 to 350 µm.

The glass forming the insulating layer 4 is characteristically formed with either of crystalline or amorphous structure, and is preferably used by properly selecting one in which a heat resisting temperature is 300° C. or higher, and a thermal expansion coefficient at a temperature domain of 0 to 300° C. has a range of −5 to +5×$10^{-7}$/° C. relative to that of ceramics constituting the plate shaped body 2. That is, if using the glass with thermal expansion coefficient deviating from such range, a difference of the thermal expansion coefficient between the plate shaped body 2 and glass becomes so larger, so that upon baking and then cooling the glass, defect such as crack or exfoliation and so forth is likely to be generated.

In forming the insulating layer 4 as glass, a paste is preferably used that is fabricated by the steps of mixing glass powders with a proper binder, a dispersant and an organic solvent and kneading the mixed.

Next, in case of forming the insulating layer 4 as resin, if a thickness thereof is less than 30 µm, dielectric strength does not reach 1.5 kV so that an insulating property can not be maintained, and when the channel 14 is formed on the resistance heating element 5 with the laser beam, the insulating layer 4 may be possibly damaged and such flaws thereby cause the insulating layer 4 not to be functioned. On the contrary, if exceeding 150 µm, evaporation of solvent or moisture generated upon baking of resin becomes larger so that a bubble shaped exfoliation called swelling is generated between the plate shaped body 2. Such exfoliation renders heat transfer deteriorated, so that uniformity of the loading surface 3 is inhibited. From the above, in using resin as the insulating layer 4, the thickness of the insulating layer 4 is preferably formed with range of 30 to 150 µm, preferably 60 to 150 µm.

Further, in case of forming the insulating layer 4 using resin, considering heat resistance of 300° C. or higher and adherence to the resistance heating element 5, it is preferable to use a polyimide resin, a polyimidoamide resin, a polyamide resin and the like.

Also, in agglutinating the insulating layer 4 consisting of glass or a resin on the plate shaped body 2, the process is preferably conducted by the steps of dropping a proper quantity of glass paste or resin paste on a center of the plate shaped body 2 to spread out and uniformly coat the same with a spin coating method, or to uniformly coat the same with a screed printing method, dipping method, spray coating method and the like, and implementing the baking at 800° C. in case of the glass paste and at more than 400° C. in case of the resin paste. Further, in case of using glass as the insulating layer 4, the plate shaped body 2 consisting of silicon carbide sintered compact or aluminum nitride sintered compact is previously heated at a temperature of 1200° C. or so to oxidize the surface where the insulating layer 4 is to be agglutinated, thereby improving adherence to the insulating layer 4 consisting of glass.

In addition, preferably, the passivation layer 16 formed on the resistance heating element 5 consists of crystallized glass at least a part of which includes a crystal phase including at least one kind of Zn, B and Si. The crystal phase formed or dispersed in glass can be specified as for example, $Zn_2SiO_4$, $Zn_3B_2O_6$, $Zn_3(BO_3)_2$, $Zn(BO_2)_2$, $SiO_2$ and so forth.

The passivation layer 16 prevents crack propagation by Griffith flow to increase strength of glass itself because it prevents the direct injection of cooling gas onto the resistance heating element 5 as well as its crystal phase divides the glass layer into fine blocks. As a result, the lifetime of the resistance heating element 5 is increased up to 20000 cycles in comparison with the resistance heating element 5 without the passivation layer 16 which heating element had been wire-broken by 20000 cycles repeated durability test at 50 to 350° C. Also, the glass phase including crystalline phase is able to reduce a baking temperature through properly adding Pb, B, Bi, Sb and so forth thereto.

In crystallizing glass, there is a method comprising the steps of, for example, fusing and producing a glass layer once, maintaining the glass layer for one hour near a nucleation temperature to sufficiently produce crystal nucleus, and raising the temperature up to a crystallization temperature.

Although a quantity of the crystal produced by crystallization is hardly measured, the degree of crystallinity may be indirectly measured by measuring lightness L* of glass. As a result, if it comes to at least the extent that transparency of glass is disappeared, that is, a lightness L* of 40 or more, good crystallization is preferably obtained.

Further, the measuring of lightness L* of the passivation layer 16 is conducted through measuring lightness L* with a spectroscopy based on JIS Z 8729 L* a* b* color matrix system.

If the produced crystal layer is a needle shaped crystal, strength of the passivation layer 16 is enhanced by fiber-reinforcement, thereby restricting the generation of crack. In addition, even though micro crack is generated in glass, it can be expected that the produced crystal may restrict the propagation of crack.

Glass used in the passivation layer 16 is required to be able to be baked at a temperature of as low as 700° C., and to have a thermal expansion coefficient ranging from 0.5 to 1.5×$10^{-6}$/° C. relative to that of the plate shaped body 2. Generally, a thermal expansion rate and a baking temperature of glass have a negative correlation, and thus it is likely that as the thermal expansion coefficient is lowered, the baking temperature is increased, and as the baking temperature is lowered, the thermal expansion coefficient is increased. Therefore, it is very difficult to set both the thermal expansion coefficient and the baking temperature to be each desired level at the same time.

Accordingly, for example, it is preferable for lower thermal expansion coefficient crystal phase such as $Zn_2SiO_4$, $Zn_3B_2O_6$, $Zn_3(BO_3)_2$, $Zn(BO_2)_2$, $SiO_2$ and so forth to lower the thermal expansion coefficient of external glass through precipitating or dispersing the lower thermal expansion coefficient crystal phase in glass. In case of PbO, $B_2O_3$, $Bi_2O_3$, and $Sb_2O_3$, they remain in glass without being crystallized, providing an effect of lowering fusion point of glass. Also, those elements have a function of lowering the baking temperature without increasing the thermal expansion coefficient of glass. Further, regarding the crystal phase in glass, it is not particularly limited to the precipitated phase in glass, but formed even by a method in which such crystal is mixed in glass and treated with baking, thereby being introduced into glass.

As the lower thermal expansion coefficient crystal phase, there is the crystal phase having negative thermal expansion coefficient such as β-eucryptite, in which however, Li ion included in crystal is migrated with voltage applied to the resistance heating element 5 possibly influencing on a durability, so that it is preferable to use other crystal layer rather than β-eucryptite.

Further, the analysis of the crystal phase in glass included in the passivation layer 16 was analyzed by X-ray diffractometer (Rika Electric Inc.). Still further, glass transition point and softening point were measured by a differential scanning calorimetry in such a way that entrance and exit of heat is measured while increasing a temperature so that an intersection of an asymptotic line of an initial endothermic shift portion of a base line is preset as a glass point shift and an intersection of an asymptotic line of both sides of exothermic peak appearing next time is preset as a softening point.

Further, preferably, the thermal expansion coefficient of the passivation layer 16 has a range of −0.5 to +2.0×10$^{-6}$/° C. relative to that of the plate shaped body 2. This is because the plate shaped body 2 of the invention made of ceramics has one main surface 3 on which wafer is loaded and the other main surface having the oxide film and the insulating layer 4 consisting of glass in this order, and on which insulating layer 4 the resistance heating element 5 is positioned on which in turn the passivation layer 16 is positioned, so that the thermal expansion coefficients of the insulating layer 4, the resistance heating element 5 and the passivation layer 16 increase lifetime for repeated durability test at 50 to 350° C. as approaching the plate shaped body 2.

Particularly, it has been discovered that if the plate shaped body 2 is silicon carbide and the thermal expansion coefficient of the passivation layer 16 is 3.4 to 6.9×10$^{-6}$/° C., the lifetime for the repeated durability test at 50 to 350° C. can be increased up to 200000 cycles.

Also, by lowering the softening point of the glass part of the passivation layer 16 than the transition point of glass forming the insulating layer 4, more enforced adhesive strength between the passivation layer 16 and the insulating layer 4 is obtained so that the lifetime for the repeated durability test at 50 to 350° C. can be increased more than 220000 cycles.

In addition, by lowering the softening point of the glass part of the passivation layer 16 than that of glass included in the resistance heating element 5, the exposure temperature of the passivation layer 16 can become lower than that of the resistance heating element 5, thereby restricting the penetration of glass component of the passivation layer 16 into the resistance heating element 5. Thus, the quantity of resistance change upon exposure can be restricted, so that the ceramic heater requiring for uniform temperature distribution can be manufactured, which is likely a representative property to a ceramic heater for semiconductor manufacturing device. Furthermore, the penetration of the glass component of the passivation layer 16 into the resistance heating element 5 is restricted, so that the glass component and the metallic component of the resistance heating element 5 are maintained in uniform distribution state, thereby preventing a deterioration of lifetime for the repeated durability test at 50 to 350° C.

Still further, preferably, a thickness of the passivation layer 16 has a range of 10 to 500 μm. If the thickness is less than 10 μm, there causes an appearance defect representative of a pin hole on the surface of the passivation layer 16. Also, if exceeding 500 μm, it is not preferable from the point of rapid temperature elevation of the plate shaped body 2 because glass has particularly lower thermal conductivity.

In addition, the passivation layer 16 may be properly formed by using paste shaped powders including crystallized glass and so forth with a screen printing method.

A detailed description will be made regarding other configuration of the ceramic heater 1 of the invention. A belt-like resistance heating element 5, which is formed in a plate shaped body 2 or on a main surface of the plate shaped body 2, as shown in FIG. 11, is formed in a shape of a substantially concentric circle by consecutively arranging arc shaped belts 5$i$ to 5$p$ and folded small arc shaped belts 5$q$ to 5$v$. In other words, the resistance heating element 5 is formed by the arc shaped belts 5$i$ to 5$p$ that are arranged to configure the substantially concentric circle at an approximately equal interval and have a different radius, and the folded small arc shaped belts 5$q$ to 5$v$ that are connected between the radially adjacent arc shaped belts 5$i$ to 5$p$ to form a series circuit, and makes use of the ends of arc shaped belts 5$i$ and 5$j$ as a power supply part 6. As such, the arc shaped belt 5$i$ and the arc shaped belt 5$j$, the arc shaped belt 5$k$ and the arc shaped belt 5$m$, the arc shaped belt 5$n$ and the arc shaped belt 5$o$, and the arc shaped belt 5$p$ are each arranged to form a circle, and each circle is arranged in a shape of the concentric circle. Thus, when the resistance heating element 5 is heated, a temperature of a mounting surface 3 can be distributed in the concentric circular shape from its center to its peripheral edge.

Further, distances L4, L5 and L6 between the radially adjacent arc shaped belts 5$i$ and 5$j$ and the radially adjacent arc shaped belts 5$k$ and 5$m$, between the radially adjacent arc shaped belts 5$k$ and 5$m$ and the radially adjacent arc shaped belts 5$n$ and 5$o$, and between the radially adjacent arc shaped belts 5$n$ and 5$o$ and the arc shaped belt 5$p$ are each kept at an approximately equal interval. Thus, because each of the arc-shaped belts 5$i$ to 5$p$ is allowed to have the same calorific value per unit volume, it is possible to restrain radial heating deviation on the mounting surface 3.

Moreover, it is important that distances L1, L2 and L3 between the folded small arc shaped belts 5$q$ and the folded small arc shaped belt 5$r$ which are located in pairs on the same circumference, between the folded small arc shaped belt 5$s$ and the folded small arc shaped belt 5$t$ which are located in pairs on the same circumference, and between the folded small arc shaped belt 5$u$ and the folded small arc shaped belt 5$v$ which are located in pairs on the same circumference each get small in correspondence to each of the distances L4, L5 and L6 between the radially adjacent arc shaped resistance heating element zones 5$i$ to 5$p$.

In other words, it is necessary to equate the calorific value per unit volume at the arc shaped belts 5$i$ to 5$p$ as well as the folded small arc shaped belts 5$q$ to 5$v$ in order to enhance a uniform heating characteristic of the mounting surface 3. Typically, the distances L1, L2 and L3 between the folded small arc shaped belts 5$q$ to 5$v$ which are located in pairs on the same circumference are designed to be equal to the distances L4, L5 and L6 between the radially adjacent arc shaped belts 5$i$ to 5$p$, respectively. However, in the case of this shape of the resistance heating element zone, because a heating density of a folded portion P5 around the arc shaped belts 5$i$ to 5$p$ and the folded small arc shaped belts 5$q$ to 5$v$ is lessened, a temperature outside the folded portion P5 is lowered, and thereby an in-plane temperature difference of the wafer W is increased to cause damage to the uniform heating characteristic. In this regard, in the invention, because the distances L1, L2 and L3 between the folded small arc shaped belts 5$q$ to 5$v$ which are located in pairs on the same circumference are shorter than the corresponding distances L4, L5 and L6 between the radially adjacent arc shaped belts 5*i* to 5*p* respectively, a calorific value of the folded portion P5 is compensated by heat generated from the opposite folded small arc shaped belts 5*q* to 5*v*, and thus a temperature drop can be restrained at the folded portion P5. For this reason, the in-plane temperature difference of the wafer W loaded on the mounting surface 3 can be lessened, so that it is possible to enhance the uniform heating characteristic.

In particular, when the distances L1, L2 and L3 between the folded small arc shaped belts 5*q* to 5*v* which are located in pairs on the same circumference has a range of 30 to 80% of the corresponding distances L4, L5 and L6 between the radially adjacent arc shaped belts 5*i* to 5*p* respectively, it is possible to enhance the uniform heating characteristic on the mounting surface 3 to the maximum extent. More preferably, it is good that each of the distances L1, L2 and L3 amounts to a range of 40 to 60% of each of the corresponding distances L4, L5 and L6.

Further, the resistance heating element 5 of the invention is composed of the arc shaped belts 5*i* to 5*p* and the folded small arc shaped belts 5*q* to 5*v*, so that there is a small chance that an excessive stress is exerted on an edge part compared to the conventional rectangular folded resistance heating element, and there is lessened a chance that the plate shaped body 2 or the resistance heating element 5 is damaged even when the ceramic heater 1 is sharply increased or decreased in temperature, and thus it is possible to provide the ceramic heater 1 having high reliability.

Further, when the resistance heating element 5 is buried in the plate shaped ceramics body, a great effect is obtained, and when the belt-like resistance heating element 5 is arranged on the other main surface of the plate shaped body 2, the same effect is obtained. Especially, when the belt-like resistance heating element 5 is arranged on the other main surface of the plate shaped body 2, and when an overcoated insulating layer is formed on the belt-like resistance heating element 5, this is preferable because an effect of preventing the plate shaped body 2 or the resistance heating element 5 from being damaged is great.

Further, the resistance heating element is characterized in that it is composed of a plurality of heating elements capable of being independently heated in the concentric circular shape, and an interval between an outermost belt of the resistance heating element located on the outermost circumference of the concentric circular shape and an inner belt located on the inner side of the outermost belt is smaller than an interval between belts of the concentric circular shape of the resistance heating element except the independent resistance heating element located on the outermost circumference. In this manner, the resistance heating element 5 is formed, and thereby heat that is still more radiated from the outer circumference of the plate shaped body 2 is easily compensated. This is more preferable because it is possible to prevent a temperature around the surface of the wafer W from being lowered.

Further, the ceramic heater 1 of the invention is more preferably divided into three annular resistance heating element zones 4 of the concentric circle in correspondence to the mounting surface 3 of the wafer W. This is because the ceramic heater is subjected to the influence of a surrounding atmosphere of the wafer W, a wall surface facing the wafer W, or a flow of gases in order to uniformly heat the surface of the disc shaped wafer W, but an opposite surface around or on the wafer W or the flow of the atmosphere gases is designed to have a central symmetry about the wafer W so as to keep the disc shaped wafer W from having a non-uniform surface temperature. It is preferable that the ceramic heater 1 meeting the environments and having the central symmetry about the wafer W is required to uniformly heating the wafer W, and that the resistance heating element zones 4 are formed by central symmetrically dividing the mounting surface 3.

Particularly, it is preferable that the annular resistance heating element zone of the concentric circle numbers three in order to uniformly heat the surface temperature of the wafer W of 300 mm or more.

FIG. 5A shows a resistance heating element zone 4 of the invention. A resistance heating element zone 4 is provided with a plurality of resistance heating element zones 4 on one main surface of a plate shaped body 2, wherein the plurality of resistance heating element zones 4 are a circular resistance heating element zone 4*a* on a center, and three annular resistance heating element zones 4*b*, 4*cd* and 4*eh* of a concentric circle on an outer side of the circular resistance heating element zone 4. In order to improve a uniform heating characteristic of a wafer W, a resistance heating element 5 is divided corresponding to the four resistance heating element zones.

Further, when an outer diameter D1 of the resistance heating element zone 4*a* of the center of the ceramic heater 1 of the invention is set to a range of 20 to 40% of an outer diameter D of the resistance heating element zone 4*eh* of the outer circumference, when an outer diameter D2 of the resistance heating element zone 4*bc* of the outer side of the resistance heating element zone 4 is set to a range of 40 to 55% of the outer diameter D of the resistance heating element zone 4*eh* of the outer circumference, and when an inner diameter D3 of the resistance heating element zone of the outermost circumference is set to a range of 55 to 85% of the outer diameter D of the resistance heating element zone of the outermost circumference, this is preferable because it is possible to lessen an in-plane temperature difference of the wafer W.

Further, the outer diameter D of the resistance heating element zone 4*eh* of the outer circumference refers to a diameter of a circumscribed circle surrounding a resistance heating element 5*eh* constituted of the resistance heating element zone 4*eh* when being viewed on a projected plane parallel to the other main surface of the plate shaped body 2. Further, similarly, the outer diameter D2 of the resistance heating element zone 4*b* refers to a diameter of a circle circumscribed around a resistance heating element 5*b* constituted of the resistance heating element zone 4*b*. Further, the inner diameter D3 is a diameter of a circle inscribed around a resistance heating element 5*cd*. Further, the circumscribed circle can be obtained along an arc in the concentric circular shape except a protrusion of the resistance heating element connected to a power supply part.

This is because, when the outer diameter D1 is set to 20% or less of the outer diameter D, there is a chance that, because the outer diameter of resistance heating element zone 4*a* of the center is too small, a temperature of a center of the resistance heating element zone 4*a* is not increased even when a calorific value of the resistance heating element zone 4*a* is increased, and thus the temperature of the center is lowered. Further, this is because, when the outer diameter D1 exceeds 40%, there is a chance that, because the outer diameter of resistance heating element zone 4*a* of the center is too large, a temperature of a periphery of the resistance heating element zone 4*a* is increased when the temperature of the center is increased, and thus the temperature of the periphery of the resistance heating element zone 4*a* is too enhanced. Further, preferably, the outer diameter D1 is set to a range of 20 to 30% of the outer diameter D, and more preferably a range of 23 to 27% of the outer diameter D, and thereby it is possible to more lessen the in-plane temperature difference of the wafer W.

Further, when the outer diameter D2 is less than 40% of the outer diameter D, there is a chance that, because the periphery of the ceramic heater 1 is easily cooled, a temperature on an inner side of the resistance heating element zone 4cd near the center of the wafer W is increased when a calorific value of the resistance heating element zone 4cd is increased to prevent a temperature around the wafer W from being lowered, and thus the in-plane temperature difference of the wafer W is increased. Further, when the outer diameter D2 exceeds 55% of the outer diameter D, there is a chance that, even when the calorific value of the resistance heating element zone 4cd is increased to prevent a temperature around the wafer W from being lowered, the temperature of the resistance heating element zone 4cd is increased, but the lowering of the temperature around the wafer W has an influence on the resistance heating element zone 4b, and thus the temperature of the outer side of the resistance heating element zone 4b is lowered. Preferably, the outer diameter D2 is set to a range of 41 to 53% of the outer diameter D, and more preferably a range of 43 to 49% of the outer diameter D, and thereby it is possible to more lessen the in-plane temperature difference of the wafer W.

Further, when the outer diameter D3 is less than 55% of the outer diameter D, there is a chance that, because the periphery of the ceramic heater 1 is easily cooled, a temperature on an inner side of the resistance heating element zone 4eh near the center of the wafer W is increased when a calorific value of the resistance heating element zone 4eh is increased to prevent the temperature around the wafer W from being lowered, and thus the in-plane temperature difference of the wafer W is increased. Further, when the outer diameter D3 exceeds 85% of the outer diameter D, there is a chance that, even when the calorific value of the resistance heating element zone 4eh is increased to prevent the temperature around the wafer W from being lowered, the temperature of the resistance heating element zone 4eh is increased, but the lowering of the temperature around the wafer W has an influence on the resistance heating element zone 4cd, and thus the temperature of the outer side of the resistance heating element zone 4cd is lowered. Preferably, the outer diameter D3 is set to a range of 65 to 85% of the outer diameter D, and more preferably a range of 67 to 70% of the outer diameter D, and thereby it is possible to more lessen the in-plane temperature difference of the wafer W.

Further, it can be seen that the ceramic heater 1 constituted of the plurality of resistance heating elements 5 as set forth above can compensate delicate asymmetry of the left, right, front and rear generated from the surrounding environment or thickness deviation of symmetrical heating element, and the in-plane temperature difference of the wafer W is more lessened as well.

FIG. 5B shows an example of a resistance heating element zone 4 of a ceramic heater 1 of the invention. Among three annular resistance heating element zones 4b, 4cd and 4eh, the innermost resistance heating element zone 4b is the resistance heating element zone 4b taking an annulus shape, the resistance heating element zone 4cd of an outer side of the resistance heating element zone 4b is two fan shaped resistance heating element zones 4c and 4d bisecting an annulus in a circumferential direction, and the resistance heating element zone 4eh of an outer side of the resistance heating element zone 4cd is composed of four fan shaped resistance heating element zones 4e, 4f, 4g and 4h quartering an annulus in a circumferential direction. This configuration is preferable in making a surface temperature of a wafer W uniform.

It is preferable that resistance heating element zones 4a to 4g of the ceramic heater 1 can each generate heat independently, and that resistance heating elements 5a to 5g are provided corresponding to the resistance heating element zones 4a to 4g.

However, the zone 4a and the zone 4b can be connected in parallel or series and controlled by one circuit when an installed place corresponding to an external environment of the ceramic heater 1 is not frequently changed. This configuration is preferable because a predetermined interval can be set between the zones 4a and 4b, and because a through hole through which a lift pin lifting the wafer W passes can be formed.

Further, the annular resistance heating element zones 4cd and 4eh are subjected to, but not limited to, division into two parts and four parts in a radial direction respectively.

A boundary line between the resistance heating element zones 4c and 4d of FIG. 5B is a straight line, but it is not essential to be the straight line and may be a broken line. It is preferable that the resistance heating element zones 4c and 4d is central symmetry about the center of the heating element zone of the concentric circle.

Similarly, each boundary line between the resistance heating element zones 4e and 4f, 4f and 4g, 4g and 4h, and 4h and 4e is not essential to be the straight line, and may be a broken line. It is preferable that the boundary line is central symmetry about the center of the heating element zone of the concentric circle.

It is preferable that each of the resistance heating elements 5 is formed by printing etc., and that the belt of the resistance heating element 5 is formed at a thickness of 5 to 50 µm and a width of 1 to 5 mm. When a printing surface printed once is wide, there is a chance that a printed thickness does not get constant due to a pressure difference between a squeegee and a screen left and right or front and rear. In particular, when a size of the resistance heating element 5 is large, there is a chance that a calorific value designed so that left, right, front and rear thicknesses of the resistance heating element 5 are different from each other is deviated. When the calorific value is deviated, this is not preferable because the in-plane temperature difference of the wafer W is increased. It is proved that, in order to prevent temperature variation resulting from the thickness deviation of the resistance heating element, it is efficient to divide the individual resistance heating elements 5 that constitute a single resistance heating element and have a great outer diameter.

Thus, because, except the center of the mounting surface 3 of the wafer W, the concentric annular resistance heating element zone 4cd is divided two parts left and right and the larger annular resistance heating element zone 4eh is divided into four parts, and thereby a size printing the resistance heating element 5 in the resistance heating element zone 4 can be lessened, it is possible to make a thickness of each part of the resistance heating element 5 uniform, and to make the surface temperature of the wafer W uniform by compensating the delicate temperature difference of the front, rear, left and right of the wafer W. Further, it is preferable that, in order to more minutely adjust a resistance value of the belt of each resistance heating element 5, the resistance value is adjusted by forming a long channel m along the resistance heating element by use of a laser, etc.

Further, resistance heating element zones of the resistance heating elements 5a, 5b, 5c, 5d, 5e, 5f, 5g and 5h shown in FIG. 6 are formed into folded resistance heating element zones, respectively.

Further, preferably, the ceramic heater 1 of the invention is a ceramic heater 1 having the resistance heating elements 5 on one main surface of the plate shaped body 2, and as shown in FIG. 6, the resistance heating elements 5e, 5f, 5g and 5h located at an outer circumference of the plate shaped body 2 are formed of arc shaped belts 51 of the concentric circular shape and small arc shaped belts 52 as connection resistance heating element zones which are consecutively connected with the arc shaped belts 51, at a place far from the center of the plate shaped body 2. It is preferable that a power supply part 6 for supplying the resistance heating elements 5 with electric power and a metal case 19 enclosing the power supply part 6 are provided, that a wafer heating surface is provided on the other main surface of the plate shaped body 2, and that, when being viewed on a projected plane parallel to the other main surface, a diameter D of a circumscribed circle C of the resistance heating element 5 amounts to a range of 90 to 97% of a diameter DP of the plate shaped body 2.

When the diameter D of the circumscribed circle C of the resistance heating element 5 is less than 90% of the diameter DP of the plate shaped body 2, a time to rapidly increase or decrease a temperature of the wafer becomes long, and thus a temperature response characteristic of the wafer W is deteriorated. Because the diameter D is suitable to have about 1.02 times as long as a diameter of the wafer W in order to uniformly heat the surface temperature of the wafer W without lowering the temperature of the periphery of the wafer W, the diameter DP of the plate shaped body 2 is increased over the size of the wafer W, and thus the size of the wafer W capable of being uniformly heated is decreased compared to the diameter DP of the plate shaped body 2. Accordingly, heating efficiency of heating the wafer W is deteriorated compared to input power of heating the wafer W. Further, because the plate shaped body 2 is enlarged, an installed area of a semiconductor fabricating device is increased. It is not preferable that this lowers an operating ratio with respect to the installed area of the wafer fabricating device required for maximum production with a minimum installed area.

When the diameter D of the circumscribed circle C of the resistance heating element 5 is more than 97% of the diameter DP of the plate shaped body 2, there is a chance that, because an interval between a contact member 17 and an outer circumference of the resistance heating element 5 is small, because heat from the outer circumference of the resistance heating element 5 non-uniformly flows to the contact member 17, particularly because the heat flows from a portion where an arc shaped resistance heating element zone 51 contacting with a circumscribed circle C of the outer circumference is not present, and because the arc shaped resistance heating element zone 51 of the outer circumference is bent toward the center of the plate shaped body 2, a temperature of the portion P free from the arc shaped resistance heating element zone 51 is lowered along the circumscribed circle C enclosing the resistance heating element 5 to thus increase the in-plane temperature difference of the wafer W. More preferably, the diameter D of the circumscribed circle C of the resistance heating element 5 is in a range of 92 to 95% of the diameter DP of the plate shaped body 2.

Further, as shown in FIG. 1, when the plate shaped body 2 has an outer diameter equal substantially to that of the metal case 19, and when the metal case 19 supports the plate shaped body 2 from the lower part, the diameter D of the circumscribed circle C of the resistance heating element 5 is in a range of 91 to 95% of the diameter DP of the plate shaped body 2, and more preferably in a range of 92 to 94%, so as to lessen the in-plane temperature difference of the wafer W.

Further, it is preferable that, in the ceramic heater 1 of the present invention, the arc shaped resistance heating element zones 51 contacting with the circumscribed circle C of the resistance heating element 5, for example, of FIG. 6 and the small arc shaped resistance heating element zones 52 as connection resistance heating element zones which are consecutively connected with the arc shaped belts 51, connection resistance heating element zones, consecutively connected with the arc shaped resistance heating element zones 51 are provided, and that an interval L1 of the blank region P where the arc shaped resistance heating element zone are not present at a part of the circumscribed circle C is smaller than a difference (hereinafter abbreviated as LL) between the diameter DP of the plate shaped ceramics body and the diameter D of the circumscribed circle C. When the interval L1 is greater than the difference LL, there is a chance that heat of the blank region P flows to the periphery of the plate shaped ceramics body, and thus a temperature of the blank region P is lowered. However, when the interval L1 is smaller than the difference LL, this is preferable because the temperature of the blank region P is difficult to be lowered, a temperature of a part of the periphery of the wafer W loaded on the mounting surface 3 of the plate shaped body 2 is not lowered, and thus the in-plane temperature difference of the wafer W is lessened.

When it is necessary to increase the temperature of the blank region so as not to decrease the temperature of the blank region P, and resistance of connection resistance heating element zone 52 heating the blank region is equated or increased slightly to thereby increase a calorific value, this is preferable because there is a small chance that the temperature of the blank region P is lowered and the in-plane temperature of the wafer W is made uniform. When the resistance heating element 5 formed by printing etc. takes a plane shape, a resistance of the connection resistance heating element zone 52 can be increased by lessening a line width Ws of the small arc shaped belt 52 as the connection resistance heating element zone by a range of 1 to 5% compared to a line width Wp of the arc shaped resistance heating element zone 51, and the in-plane temperature of the wafer W can be made uniform by increasing a temperature of the small arc shaped belt 52 as the connection resistance heating element zone higher than a temperature of the arc shaped resistance heating element zone 51.

Further, it is preferable that, in the ceramic heater 1 that adopts one main surface side of the plate shaped body 2 having a thickness of 1 to 7 mm as the mounting surface 3 for mounting the wafer, and has the resistance heating element 5 on a bottom surface of the plate shaped body 2 as well, a thickness of the resistance heating element 5 is in a range of 5 to 50 µm, and when being viewed on a projected plane parallel to the main surface of the plate shaped body 2, an area ratio of the resistance heating element 5 occupied in the circumscribed circle C is in a range of 5 to 30% with respect to an area of the circumscribed circle C enclosing the resistance heating element 5.

Specifically, this is because, when the area ratio of the resistance heating element 5 occupied in the circumscribed circle C is less than 5% with respect to an area of the circumscribed circle C enclosing the resistance heating element 5, because opposite intervals L1, L2, . . . on opposite regions of the resistance heating element 5 which are opposite to each other are too increased, the surface temperature of the mounting surface 3 corresponding to the interval L1 free from the resistance heating element 5 is lessened compared to other portions, and thus it is difficult to make the temperature of the mounting surface 3 uniform. In contrast, when the area ratio of the resistance heating element 5 occupied in the circumscribed circle C exceeds 30% with respect to an area of the circumscribed circle C enclosing the resistance heating element 5, there is a chance that, although a thermal expansion difference between the plate shaped body 2 and the resistance heating element 5 approximates to $2.0 \times 10^{-6}/°$ C. or less, a thermal stress exerting on both of them is too great, and thus the plate shaped body 2 is formed of a ceramic sintered compact resistant to deformation, but the plate shaped body 2 is subjected to deflection to make the mounting surface 3 indented when the resistance heating element 5 is heated from a thin portion of the plate shaped body having a thickness t of 1 to 7 mm. As a result, a temperature of the center of the wafer W is lower than its edge, so that there is a chance that temperature variation is increased.

Further, preferably, it is preferable that the area ratio of the resistance heating element 5 occupied in the circumscribed circle C is in a range of 7 to 20% with respect to an area of the circumscribed circle C enclosing the resistance heating element 5, and more preferably in a range of 8 to 15%.

More specifically, it is preferable that the resistance heating element 5 has opposite regions on its outer circumference that are opposite to each other, and the interval L1 between the opposite regions is 0.5 mm or more and is not more than three times as thick as the thickness of the plate shaped body 2. This is because, when the interval L1 between the opposite regions is 0.5 mm or less, there is a chance that a beard shaped protrusion is generated at the opposite regions of the resistance heating element 5 when the resistance heating element 5 is printed and formed, and thus the protrusion is subjected to a short circuit. Further, that is because, when the interval L1 between the opposite regions exceeds three times as thick as the thickness of the plate shaped body 2, there is a chance that a cool zone is generated on the surface of the wafer W corresponding to the opposite region L1, and thus the in-plane temperature difference of the wafer W is increased.

Further, in order to efficiently accomplish this effect, it is preferable that the film thickness of the resistance heating element 5 is set to a range of 5 to 50 μm.

This is because, when the film thickness of the resistance heating element 5 is less than 5 μm, it is difficult to uniformly print the film thickness of the resistance heating element 5 by use of the screen printing method. Further, when the film thickness of the resistance heating element 5 exceeds 50 μm, the thickness of the resistance heating element 5 is increased although the area ratio at which the resistance heating element 5 occupies the circumscribed circle C is 30% or less, thus increasing a stiffness of the resistance heating element 5, and thus the plate shaped body 2 is deformed due to expansion and contraction of the resistance heating element 5 caused by a change of the temperature of the plate shaped body 2. Further, that is because there is a chance that it is difficult to print the resistance heating element at a uniform thickness by use of screen printing, and thus the surface temperature difference of the wafer W is increased. Further, the desirable thickness of the resistance heating element 5 is good to be a range of 10 to 30 μm.

FIG. 1 is a cross-sectional view showing an example of a wafer heating device according to the invention. In the wafer heating device, one main surface of a plate shaped body 2 that is constituted of ceramics having a thickness t of 1 to 7 mm and a Young's modulus of 200 to 450 MPa at 100 to 200° C. is adopted as a mounting surface 3 for mounting a wafer W, and a power supply part 6 is provided, which is electrically connected to a resistance heating element 5 which is formed on the other main surface.

As a material of the plate shaped body 2 having the Young's modulus of 200 to 450 MPa at 100 to 200° C., alumina, silicon nitride, sialon and aluminum nitride may be used. Above all, among them, aluminum nitride has a high thermal conductivity of 50 W/(m·K) or more, and more preferably 100 W/(m·K) or more, and has excellent corrosion resistance or plasma resistance against corrosive gases such as fluorine based gases, or chlorine based gases, thus being suitable for the material of the plate shaped ceramics body 2.

It is more preferable that a thickness of the plate shaped body 2 is in a range of 2 to 5 mm. This is because, when the thickness of the plate shaped body 2 is less than 2 mm, the plate shaped body 2 is deprived of its strength and can not withstand a thermal stress during cooling when cooling air is injected into a gas injection hole 24, etc. during heating by use of heat generated from the resistance heating element 5, and thus a crack is generated at the plate shaped ceramics body 2. Further, when the thickness of the plate shaped body 2 exceeds 5 mm, there is a chance that, because a heat capacity of the plate shaped body 2 is increased, a time until a temperature during heating and cooling becomes stable is lengthened.

The plate shaped body 2 is elastically fixed by passing a bolt 16 through an outer circumference of an opening of a bottomed metal case 19, interposing a ring shaped contact member 17 between the plate shaped body 2 and the metal case 19 so that the plate shaped body 2 is not brought into direct contact with the bottomed metal case 19, and interposing an elastic element 18 from the bottomed metal case 19 to screw a nut 20. Thus, when a temperature of the plate shaped body 2 is changed, the bottomed metal case 19 is deformed. However, this deformation is absorbed by the elastic element 18, and thereby bending of the plate shaped body 2 is depressed. Accordingly, it is possible to prevent temperature variation from being generated from a surface of the wafer due to the bending of the plate shaped body 2.

A cross section of the ring shaped contact member 17 may take a polygon or circle shape, but any one will do. In the case that the plate shaped body 2 and the contact member 17 are brought into plane contact with each other, when a width of a contacted portion where plate shaped body 2 and the contact member 17 are contacted is in a range of 0.1 mm to 13 mm, heat of the plate shaped body 2 can flow to the bottomed metal case 19 via the contact member 17 at a small amount. And an in-plane temperature difference of the wafer W is small, so that it is possible to uniformly heat the wafer W. More preferably, the width is in a range of 0.1 to 8 mm. When the width of the contacted portion of the contact member 17 is 0.1 mm or less, there is a chance that the contacted portion is deformed when the contact member 17 is fixed in contact with the plate shaped body 2, and thus the contact member is damaged. Further, when the width of the contacted portion of the contact member 17 exceeds 13 mm, the heat of the plate shaped body 2 flows to the contact member, and thus a periphery of the plate shaped body 2 is lowered in temperature, so that it is difficult to uniformly heat the wafer W. Preferably, the width of the contacted portion between the plate shaped body 2 and the contact member 17 is in a range of 0.1 mm to 8 mm, and more preferably, in a range of 0.1 to 2 mm.

Further, it is preferable that a thermal conductivity of the contact member 17 is smaller than that of the plate shaped body 2. When the thermal conductivity of the contact member 17 is smaller than that of the plate shaped body 2, it is possible to uniformly maintain an in-plane temperature distribution of the wafer W loaded on the plate shaped body 2, and when the temperature of the plate shaped body 2 goes up or down, an amount of transmitting heat to the contact member 17 is lessened, and thermal interference with the bottomed metal case 19 is lessened, so that it is easy to change the temperature rapidly.

In the ceramic heater 1 where the thermal conductivity of the contact member 17 is smaller than 10% of that of the plate shaped body 2, the heat of the plate shaped body 2 is difficult to flow to the bottomed metal case 19, the heat from the plate shaped body 2 to the bottomed metal case 19 is more than heat flowing by heating or radiation heating caused by an atmosphere gas (here, air). On the contrary, an effect is small.

When the thermal conductivity of the contact member 17 is greater than that of the plate shaped body 2, this is undesirable because the heat of the periphery of the plate shaped body 2 flows to the bottomed metal case 19 via the contact member 17, thus heating the bottomed metal case 19, and the temperature of the periphery of the plate shaped body 2 is lowered, and thereby the in-plane temperature difference of the wafer W is increased. Further, there is a chance that, because the bottomed metal case 19 is heated, even when an attempt is made to inject air from the gas injection hole 24 to cool the plate shaped body 2, a cooling time is lengthened because a temperature of the bottomed metal case 19 is high, and a time to reach a desired temperature when being heated at a constant temperature is lengthened.

Meanwhile, as a material forming the contact member 17, in order to maintain a small contacted portion, the Young's modulus is preferably 1 GPa or more, and more preferably 10 GPa. Thereby, the width of the contacted portion is small—in a range of 0.1 mm to 8 mm, and even when the plate shaped body 2 is fixed to the bottomed metal case 19 via the contact member 17 by use of the bolt 16, the contact member 17 is not deformed, and the plate shaped body 2 is deviated in position or is not changed in parallelism, thus being capable of maintaining good accuracy.

Further, it is possible to obtain accuracy which is not obtained from the contact member made of resin adding a fluorine based resin or a glass fiber, as disclosed in Patent Document 2.

As the material of the contact member 17, a metal, such as carbon steel composed of iron and carbon, a special steel adding nickel, manganese and chromium, and so forth, is preferable due to a great Young's modulus. Further, as a material having a low thermal conductivity, a stainless steel or a so-called KOVAR, a Fe—Ni—Co based alloy, is preferable. It is preferable to select the material of the contact member 17 to be less than the thermal conductivity of the plate shaped body 2.

Further, the contacted portion between the contact member 17 and the plate shaped body 2 is small, and although the contacted portion is small, there is a small chance of generating a particle when the contacted portion is damaged, and thus it is possible to stably maintain the contacted portion. As such, the cross section of the contact member 17 that is cut on a plane perpendicular to the plate shaped body 2, preferably, takes a circle shape rather than a polygon shape. When a circular wire having a cross-sectional diameter of 1 mm or less is used as the contact member 17, positions of the plate shaped body 2 and the bottomed metal case 19 are not changed, and it is possible to heat and cool the surface temperature of the wafer W in a rapid and uniform manner.

Next, the bottomed metal case 19 has a side wall 22 and a bottom 21, and the plate shaped body 2 is installed to cover the opening of the bottomed metal case 19. Further, the bottomed metal case 19 is provided with a hole 23 for discharging a cooling gas, a power supply terminal 11 for connecting to the power supply part 6 for powering the resistance heating element 5 of the plate shaped body 2, and a gas injection hole 24 for cooling the plate shaped body 2, and a thermocouple 27 for measuring the temperature of the plate shaped body 2.

Further, a depth of the bottomed metal case 19 is in a range of 10 to 50 mm, and the bottom 21 is preferably installed in a distance of 10 to 50 mm apart from the plate shaped body 2, and more preferably of 20 to 30 mm. This is because it is easy to uniformly heat the mounting surface 3 by mutual radiant heat of the plate shaped body 2 and the bottomed metal case 19 and there is an adiabatic effect against the exterior, and thus the temperature of the mounting surface 3 is constant and a time to reach the uniform temperature is shortened.

And the wafer W is loaded on the mounting surface 3 or is lifted from the mounting surface 3 by means of a lift pin 25 that is installed to freely go up and down in the bottomed metal case 19. The wafer W continues to be lifted from the mounting surface 3 by a wafer supporting pin 8, and then to prevent temperature variation by piece contact, etc.

Further, in order to heat the wafer W by means of the ceramic heater 1, the wafer W transferred upward the mounting surface 3 by a transfer arm (not shown) is supported by the lift pin 25, and then loaded on the mounting surface 3 by lowering the lift pin 25.

Subsequently, the ceramic heater 1 is used to form a resist film. In this case, when the plate shaped body 2 consists essentially of silicon carbide, no gas is generated by reaction with moisture or the like in air. As such, although the ceramic heater is used to bond the resist film on the wafer W, it does not exert an adverse effect upon a structure of the resist film, and thus it is possible to form a fine wiring with high accuracy. At this time, it is necessary to prevent nitride having a possibility to react with water to form ammonia or amine from being contained in sintering aids.

Further, a silicon carbide sintered compact forming the plate shaped body 2 is obtained by adding either boron (B) and carbon (C) as the sintering aids or a metal oxide such as alumina ($Al_2O_3$) and yttria ($Y_2O_3$) to silicon carbide as a main constituent, performing sufficient mixing to form the mixture in a flat plate shape, and then sintering the result at 1900 to 2100° C. It does not matter that silicon carbide is based on a α type or a β type.

Meanwhile, when the silicon carbide sintered compact is used as the plate shaped body 2, it is possible to use glass or resin as an insulating layer maintaining insulation between the plate shaped body 2 having semi-conductivity and the resistance heating element 5. Here, use of glass can not maintain an insulating characteristic, because a dielectric strength is less than 1.5 kV when a thickness of the insulating layer is less than 100 μm, and to the contrary, when the thickness exceeds 400 μm, a thermal expansion difference between glass and the silicon carbide sintered compact forming the plate shaped body 2 or the aluminum nitride sintered compact is too increased, and thus a crack is generated, so that glass fails to serve as the insulating layer. Hence, when the glass is used as the insulating layer, the thickness of the insulating layer 4 is preferably formed in a range of 100 to 400 μm, and more preferably in a range of 200 to 350 μm.

Further, the mounting surface 3 of the plate shaped body 2 and the main surface of its opposite side are preferably ground under the conditions: flatness of 20 μm or less, and surface roughness of 0.1 to 0.5 μm on the basis of a central line average roughness (Ra), in a point of view of enhancing adhesion with the insulating layer 4 made of glass or resin.

Further, when the plate shaped body 2 is made of the sintered compact consisting essentially of aluminum nitride, the plate shaped body 2 is obtained by adding an earth-rare element oxide, as the sintering aids, such as $Y_2O_3$ and $Yb_2O_3$ to aluminum nitride as a main constituent, together with an alkaline-earth metal oxide such as CaO if necessary, performing sufficient mixing to form the mixture in a flat plate shape, and then sintering the result in a nitrogen gas at 1900 to 2100° C. In order to enhance adhesion of the resistance heating element 5 to the plate shaped body 2, an insulating layer made of glass may be formed. However, this may be omitted when a sufficient amount of glass is added to the resistance heating element 5, and thereby a sufficient adhesive strength is obtained.

As for characteristics of the glass forming the insulating layer, it does not matter whether the glass is crystalline or amorphous, a heat resistant temperature is 200° C. or more, a thermal expansion coefficient in a temperature domain of 0° C. to 200° C. is in a range of −5 to +5×10$^{-7}$/° C. with respect to a coefficient of thermal expansion of ceramics forming the plate shaped body 2. It is preferable to properly select and use any glass meeting these characteristics. In other words, this is because, when the glass having the coefficient of thermal expansion beyond the range is used, a thermal expansion difference between the glass and the ceramics forming the plate shaped body 2 is excessively increased, and thus it is easy to generate defects such as a crack, exfoliation, etc. during cooling after baking of the glass.

Further, as for a means for bonding the insulating layer made of glass on the plate shaped body 2, a proper amount of glass paste is dropped on a center of the plate shaped ceramics body 2. The dropped glass paste spreads out and then is uniformly applied by spin coating, or is uniformly applied by screen printing, dipping, spray coating or the like, and then is subjected to baking at a temperature of 600° C. or more. Further, when glass is used as the insulating layer, the surface on which the insulating layer is bonded is oxidized by previously heating the plate shaped body 2 made of the silicon carbide sintered compact or aluminum nitride sintered compact at a temperature of 850 to 1300° C., thereby being capable of enhancing adhesion with the insulating layer made of glass.

The resistance heating element zone of the resistance heating element 5 of the invention is divided into a plurality of blocks as shown in FIGS. 5 and 6, thereby taking either a spiral shape or a zigzag or folded shape where the individual block is composed of an arc shaped resistance heating element zone and a linear resistance heating element zone. Since the ceramic heater 1 of the invention is important to uniformly heat the wafer W, their resistance heating element zones are preferable in that a density of each part of the belt-like resistance heating element 5 is uniform. However, when being viewed in a radial direction from a center of a plate shaped body 2 as shown in FIG. 8, in the resistance heating element zone where a portion having a narrow interval between resistance heating elements 5 and a portion having a wide interval between resistance heating elements 5 are alternately shown, the surface temperature of the wafer W corresponding to the wide portion is low, and the surface temperature of the wafer W corresponding to the narrow portion is high. This is not preferable in that the whole surface of the wafer W can not be uniformly heated.

Further, when the resistance heating element 5 is divided into the plurality of blocks, it is preferable to uniformly heat the wafer W on the mounting surface 3 by independently controlling a temperature of each block.

The resistance heating element 5 is to print and bake an electrode paste, which contains a glass frit or metal oxide in a conductive metal particle, on the plate shaped body 2 by printing. As the metal particle, it is preferable to use at least one of Au, Ag, Cu, Pd, Pt and Rh. Further, as the glass frit, it is preferable to use low expansion glass which is made of an oxide containing B, Si and Zn and has a thermal expansion coefficient of 4.5×10$^{-6}$/° C. or less smaller than that of the plate shaped ceramics body 2. Further, as the metal oxide, it is preferable to use at least one selected from silicon oxide, boron oxide, alumina and titania.

Here, using at least one of Au, Ag, Cu, Pd, Pt and Rh as the metal particle forming the resistance heating element 5 is because it has a small electrical resistance.

The glass frit forming the resistance heating element 5 is made of the oxide containing B, Si and Zn, and the thermal expansion coefficient of the metal particle forming the resistance heating element 5 is greater than that of the plate shaped body 2. This is because it is preferable to use, as the glass frit, the low expansion glass having the thermal expansion coefficient, 4.5×10$^{-6}$/° C. or less, smaller than that of the plate shaped body 2 in order to approximate the thermal expansion coefficient of the resistance heating element 5 to that of plate shaped body 2.

Further, using at least one selected from silicon oxide, boron oxide, alumina and titania as the metal oxide forming the resistance heating element 5 is because it is excellent in adhesion with the metal particle in the resistance heating element 5, its thermal expansion coefficient is near that of the plate shaped body 2 and it has excellent adhesion with the plate shaped body 2.

However, when a content of the metal oxide exceeds 80% with respect to the resistance heating element 5, an adhesive force with the plate shaped body 2 is increased, but that is not desirable in that a resistance value of the resistance heating element 5 is increased. As such, it is good to set the content of the metal oxide to be 60% or less.

And, preferably, the resistance heating element 5 made of the conductive metal particle and the glass frit or the metal oxide uses what a thermal expansion difference between itself and the plate shaped body 2 is 3.0×10$^{-6}$/° C. or less.

In other words, this is because, when the thermal expansion difference between the resistance heating element 5 and the plate shaped body 2 is 1.0×10$^{-6}$/° C., there is a difficulty for the sake of fabrication, and that, to the contrary, when the thermal expansion difference between the resistance heating element 5 and the plate shaped body 2 exceeds 3.0×10$^{-6}$/° C., there is a change that the side of the mounting surface 3 is bent in a concave shape by a thermal stress exerting between the resistance heating element 5 and the plate shaped body 2 when the resistance heating element 5 is heated.

Further, as for the material of the resistance heating element 5 which is bonded on the insulating layer, a metal unit such as gold (Au), silver (Ag), copper (Cu), palladium (Pd), etc. is directly bonded by deposition or plating, or a paste where the metal unit, conductive metal oxide such as rhenium oxide ($Re_2O_3$), lanthanum manganate ($LaMnO_3$) etc. or the metal material is dispersed in a resin paste or a glass paste is prepared and printed in a predetermined shape of the resistance heating element zone by screen printing etc. and then baked, and the conductive material is coupled by a matrix made of resin or glass. When glass is used as the matrix, any of crystallized glass and amorphous glass will do, but it is preferable to use crystallized glass in order to suppress variation of a resistance value caused by a heat cycle.

However, when silver (Ag) or copper (Cu) is used for the material of the resistance heating element 5, there is a chance that migration is generated. In this case, it is good to cover a coat layer made of a material equal to the insulating layer at a thickness of about 40 to 400 μm to cover the resistance heating element 5.

Further, as for a method of supply power to the resistance heating element 5, the power supply terminal 11 installed to the bottomed metal case 19 is pressed on the power supply part 6 formed on the surface of the plate shaped body 2 by a spring (not shown), and thereby connection is secured to supply the power. This is because, when a terminal of metal is buried and formed in the plate shaped body 2 having a thickness of 2 to 5 mm, a uniform heating characteristic is deteriorated by heat capacity of the terminal. For this reason, as in the invention, the power supply terminal 11 is pressed by the spring, and thereby the electrical connection is secured. Thereby, the thermal stress caused by a temperature difference between the plate shaped body 2 and the bottomed metal case 19 is relaxed, so that it is possible to maintain electrical conduction with high reliability. Further, in order to prevent a contact point from being in point contact, it does not matter that a resilient conductor is inserted as an intermediate layer. This intermediate layer has an effect only by inserting a sheet of a foil shape. And, a diameter of the power supply terminal 11 on the side of the power supply part 6 is preferably set to a range of 1.5 to 5 mm.

Further, a temperature of the plate shaped body 2 is measured by the thermocouple 27 whose leading end is buried in the plate shaped body 2. As the thermocouple 27, it is preferable to use a sheath thermocouple 27 having an outer diameter of 0.8 mm or less in a point of view of a response characteristic and a working characteristic of maintenance. Preferably, the leading end of the thermocouple 27 is pressed and fixed on an inner wall surface of a hole formed on the plate shaped body 2 by a fixture member installed in the hole in order to improve reliability of temperature measurement. Similarly, the temperature can be measured by burying a single strand thermocouple or a temperature measurement resistor such as Pt etc.

Further, it does not matter that as shown in FIG. 1, a plurality of supporting pins 8 are formed on one main surface of the plate shaped body 2 to thus support the wafer W at a constant distance apart from the main surface of the plate shaped ceramics body 2.

Further, the ceramic heater 1 having only the resistance heating element 5 on the other main surface 3 of the plate shaped body 2 is shown in FIG. 1, needless to say, it is good to bury an electrode for absorbing static electricity or generating plasma between the main surface 3 and the resistance heating element 5 in the invention.

Figure 23:
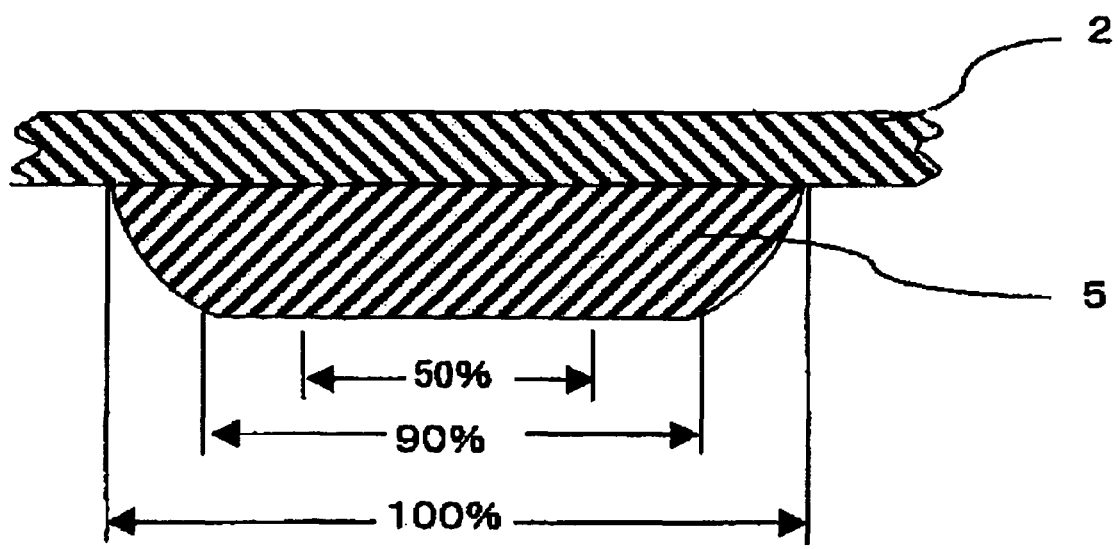
FIG. 23 is a cross-sectional view of the resistance heating element in the heater of the invention.

Further, a width Wg of the group g is preferably within 90% of the width Wh of the belt of the resistance heating element 5. On the one hand, this is because, in consideration that the fine and complicated resistance heating element 5 is generally formed by screen printing, a cross-sectional area of the resistance heating element 5 formed by screen printing is decreased due to a thickness of the region of left and right 5% of the width of the belt of the resistance heating element 5 as in FIG. 23. Further, the channel m is formed by a laser beam etc., wherein a size of the channel m is determined by output and irradiation time of the laser beam. Generally, the output and irradiation time are not changed during forming the channel m, and thus a depth of the channel m is substantially uniform. So, when the channel m is formed at the place that is within 90% of the width of the belt of the resistance heating element 5 except a region where a thickness of its peripheral part is small, this is preferable in that there is no chance that the channel m passes through the resistance heating element 5 and that there is a small chance that a crack is generated on a bottom of the channel m. On the other hand, that is because, when the channel m is formed in excess of 90% of the width of the belt of the resistance heating element 5, the channel m is formed at a place where a film thickness on both ends of the resistance heating element 5 is thin, and thus there is a chance that the channel m passes through the resistance heating element 5 or the laser beam is applied to the plate shaped ceramics body 2 to generate a micro-crack.

Further, when the micro-crack is generated, there is a chance that the uniform heating characteristic is deteriorated because repetition of heating and cooling of the ceramic heater 1 causes the temperature difference of the surface of the wafer W to be increased. In the worst case, there is a fear that the plate shaped ceramics body 2 is destroyed.

Further, a depth of each of the channels m1, m2, . . . constituting the group g of the channels m is preferably in a range of 20% to 75% of a width Wm of each channel m, wherein depth/width of the channel is 20 to 75%. This is because, in consideration that, when being less than 20%, a change of the resistance value caused by formation of one channel m is small and thus an adjustment range of the resistance value gets small, it is difficult to sufficiently lessen the in-plane temperature difference of the wafer W.

Further, that is because, when the depth of the channel m exceeds 75% of the width Wm, there is a fear that the micro-crack is generated on the bottom of the resistance heating element 5 due to great energy of a first pulse of the laser, that repetition of heating and cooling causes the micro-crack to grow, and thereby the resistance value of the resistance heating element 5 is changed, and that the change of the resistance value causes the in-plane temperature difference of the wafer W to be increased, and thus it is impossible to maintain the uniform heating characteristic.

In addition, it is preferable that a plurality of channels m1, m2, . . . , which are substantially parallel to the length direction of the belt of the resistance heating element 5 and have the same length, are formed into a group g, that the group g is provided to the belt in plural number, and that an interval Gg between the group g1 and the group g2 is smaller than width Wh of the belt.

Figure 24:
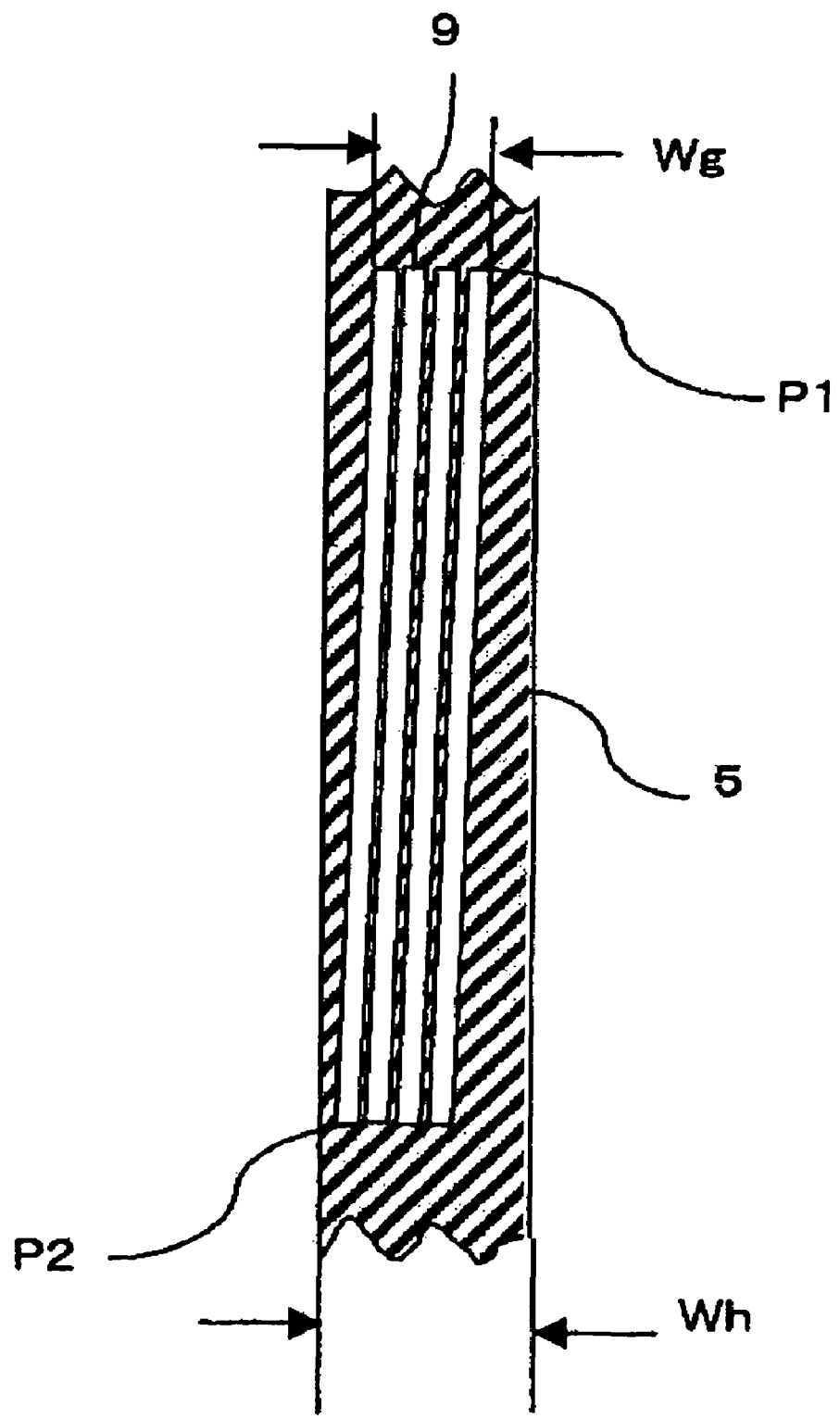
FIG. 24 is a diagram showing a resistance heating element in a conventional heater.

Because the resistance heating element 5 is formed by screen printing, delicate mislocation of the designed location is generated when the resistance heating element 5 is formed. For this reason, there is generated deviation between a set position of the plate shaped ceramic body 2 and a position of the resistance heating element. Hence, when the group g of long channels m1, m2, . . . is formed on the resistance heating element 5 without any interval Gg between the group g1 and the group g2, such a delicate mislocation is expanded as in FIG. 24. Consequently, even when being matched with the center at a start point P1, the group g is formed at a place deviated from the center of the width of the belt at an end point P2. As such, a cross-section area serving as a current passage on the left and right sides of the cross section of the resistance heating element 5 adjacent to the end point P2 of the group g is considerably different, and in the cross section of the belt of the resistance heating element 5, left and right calorific values of the belt are different from each other. Thus, there is a chance that the in-plane temperature difference of the wafer W is increased.

Figure 25:
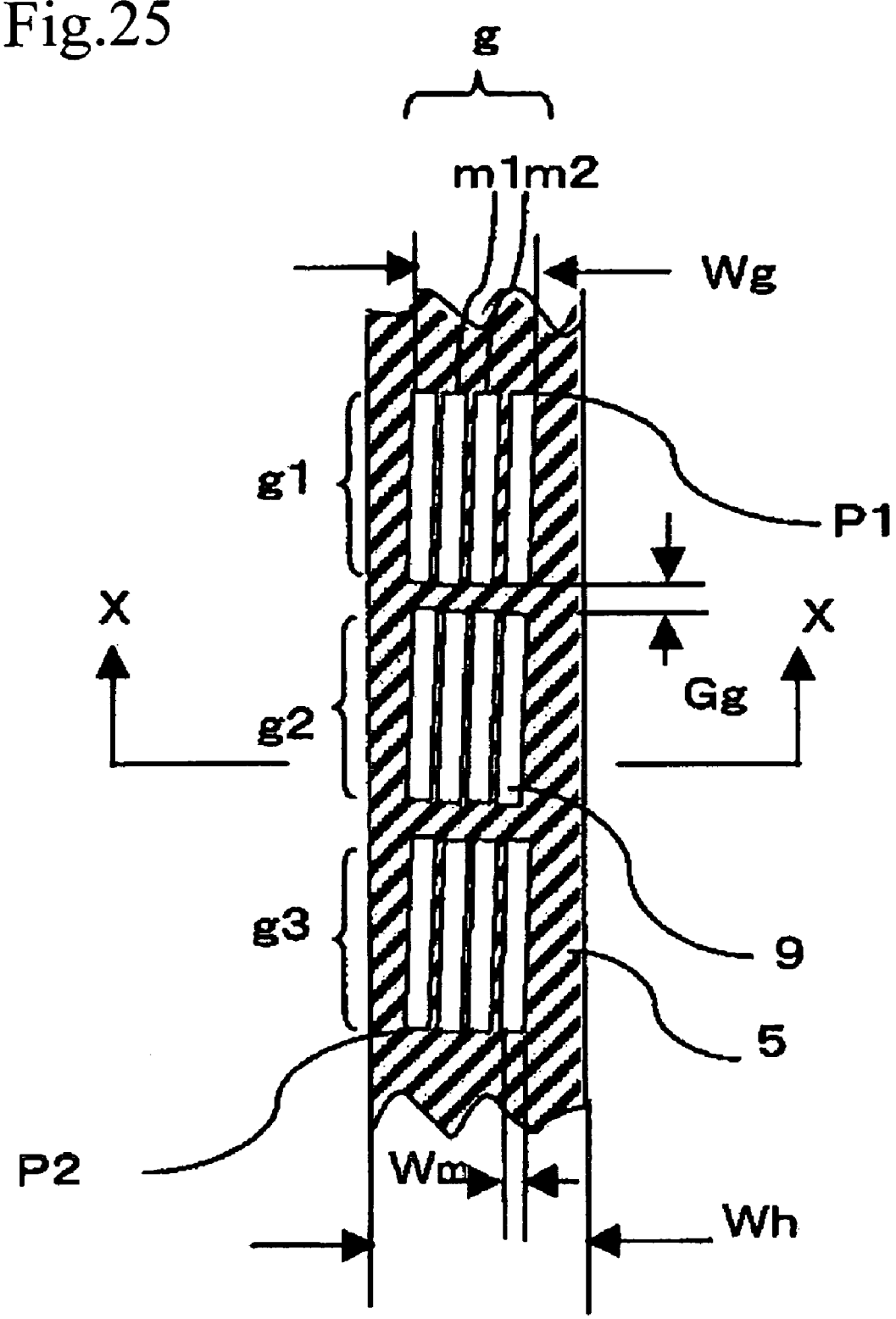
FIG. 25 is an enlarged view of the resistance heating element in the heater of the invention.

In order to prevent generation of this problem, as shown in FIG. 25, it is preferable that the group g is divided into a plurality of groups, and then the interval Gg between the numerous groups g1 and g2 is less than the width Wh of the belt of the resistance heating element 5. Thereby, a change of the left and right calorific values of the belt of the resistance heating element 5 is small, and the portion of the interval Gg serves as a by-pass of the left and right belts divided by the channels m as well. Thus, the heating is made uniform without any bias of a current flow.

Meanwhile, when the interval Gg is greater than the width Wh of the belt, the calorific value of the place Gg is decreased. Thus, when being heated, the place becomes a cool spot. Consequently, the temperature of the wafer W is lowered at the place alone, so that the entire uniform heating characteristic is deteriorated. As such, the interval Gg between the group g and the group g is preferably smaller than the width Wh of the belt.

Further, the interval Gg between the group g and the group g of the channel is preferably 1 mm or less. This is because, when the interval Gg is 1 mm or less, it is possible to prevent the bias of the current and simultaneously there is a small chance that the cool spot can be generated.

Figure 26:
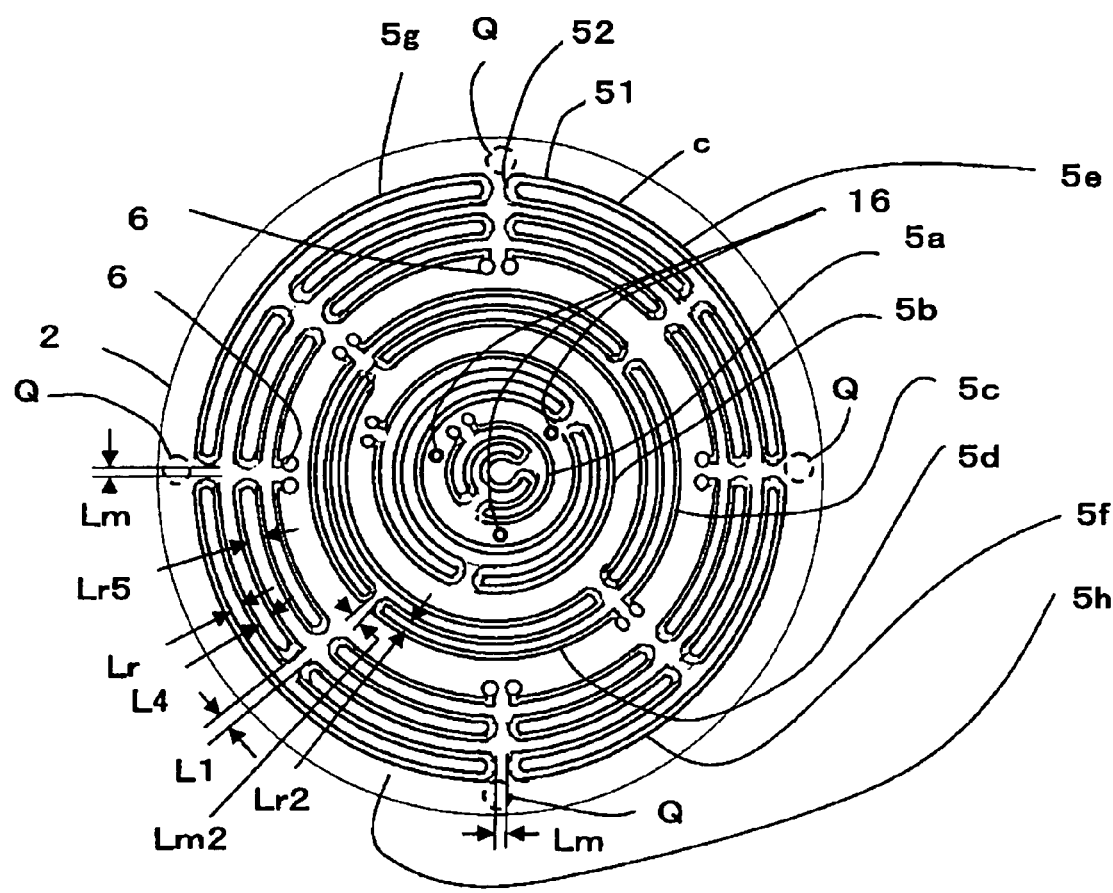
FIG. 26 is a plan view showing the resistance heating element in the heater of the invention.

Further, as shown in FIG. 26, it is preferable that a distances Lm or Lm2 between a pair of folded arc shaped belts located on the same circumference of the resistance heating element 5 is shorter than a distance Lr or Lr2 between arc shaped belts arranged in substantially concentric circular shape in at least one place. If the distance Lm or Lm2 is shorter than the distance Lr or Lr2, it is possible to prevent a temperature from being lowered around Lm, for example, at a position of Q, and thus it is possible to lessen the in-plane temperature difference of the wafer W.

Further, it is preferable that a distance Lm or Lm2 between a pair of folded arc shaped belts located on the same circumference of the resistance heating element is shorter than a distance Lr or Lr2 between arc-shaped belts arranged in substantially concentric circular shape in all places. In this way, if the distance Lm or Lm2 is shorter than the corresponding distance Lr or Lr2, the temperature difference variations in all surface regions of a wafer are small.

Furthermore, when the distance Lm or Lm2 between a pair of folded arc shaped belts located on the same circumference is set to a range of 30 to 80%, preferably a range of 40 to 60% of the distance Lr or Lr2 between arc shaped belts arranged in substantially concentric circular shape, it is possible to further enhance the uniform heating characteristic on the mounting surface 3. Further, each of the distances L1 to Lm is to measure a distance between the respective resistance heating elements 5 at several places to calculate its average distance.

Further, in the resistance heating element 5 formed in substantially concentric circular shape, an interval Lr between a belt of the resistance heating element located on the outermost circumference in the concentric circular shape and a belt located on an inner side of the outermost circumferential belt is preferably smaller than an interval L4, Lr5 or Lr2 between the other belts of the resistance heating element taking the concentric circular shape except the resistance heating element of the outermost circumference. There is a fear that the periphery of the wafer heating heater 100 is easily deprived of heat through heat emission or heat convection to the periphery thereof and thus the temperature of the periphery of the wafer heating heater 110 is lowered. However, an interval Lr between a belt 5p of the resistance heating element located on the outermost circumference and a belt 5o or 5n located inside the outermost circumferential belt is lessened and thus a calorific value of the periphery can be increased. In addition, when a wafer is mounted on the mounting surface 3 and heated, the in-plane of a wafer can be uniformly heated.

EXAMPLE 1

A silicon carbide sintered compact having thermal conductivity of 80 W/(m·K) was subjected to grinding to thus prepare a plurality of uniform heating plates taking a shape of a disc having a thickness of 4 mm and an outer diameter of 230 mm. In order to bond an insulating layer on one main surface of each uniform heating plate, a glass paste prepared by kneading ethyl cellulose as a binder and terpineol as an organic solvent with glass powder was laid by a screen printing method, heated at 150° C. to dry the organic solvent, defatted for 30 minutes at 550° C., and then subjected to baking at a temperature of 700 to 900° C. again. Thereby, the insulating layer composed of glass and having a thickness of 200 µm was formed. Subsequently, in order to bond a resistance heating element on the insulating layer, 20% by weight Au powder, 10% by weight Pt powder and 70% by weight glass as a conductive material were printed in a shape of a predetermined quantity of resistance heating element zone, heated at 150° C. to dry the organic solvent, defatted for 30 minutes at 450° C. again, and then subjected to baking at a temperature of 500 to 700° C. Thereby, the resistance heating element having a thickness of 50 µm was formed. The resistance heating element was formed into eight resistance heating element zones quartering its center and outer circumference in a circumferential direction.

Figure 6A:
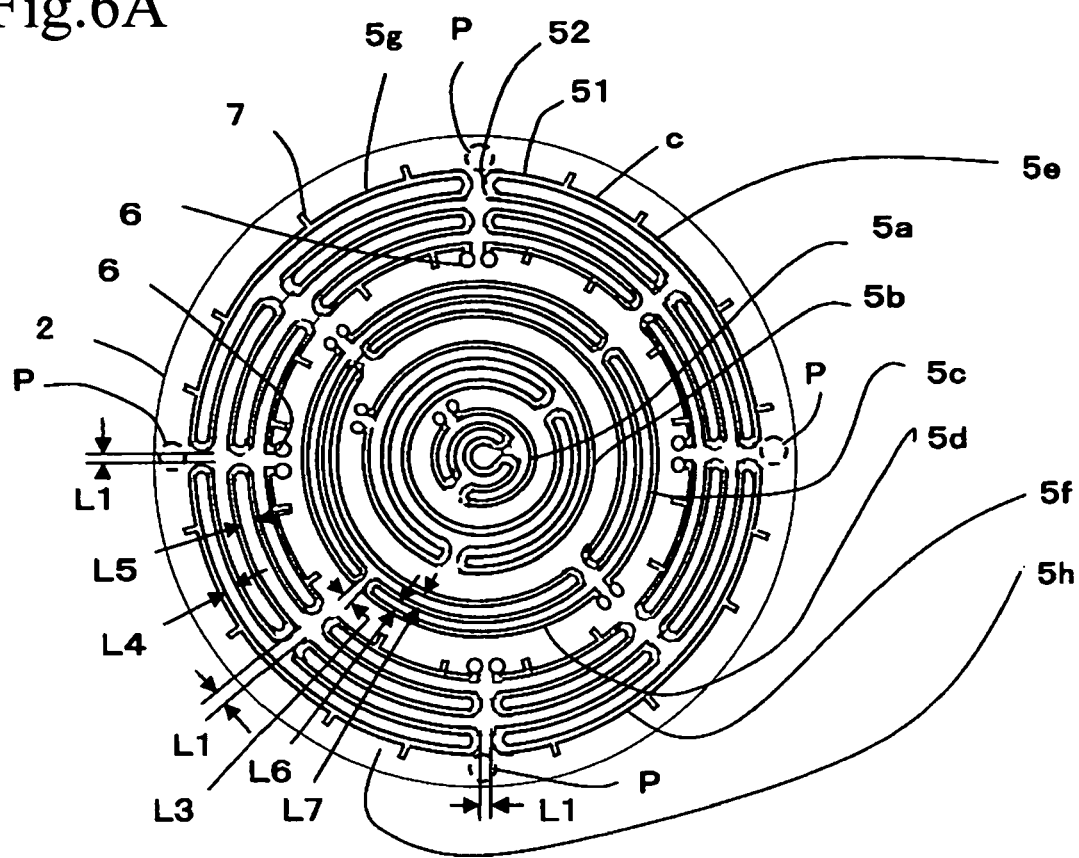
FIG. 6A is a diagram showing the resistance heating element zone in the heater of the invention.
Figure 6B:
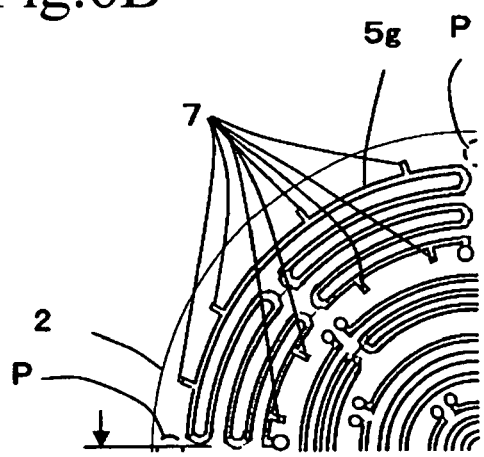
FIG. 6B is a partially enlarged view thereof.

And, there were prepared the uniform heating plate (sample No. 1) forming a positioning mark 7 as in FIG. 6A, another uniform heating plate (sample No. 2) forming the positioning mark 7 at a position spaced apart from and near a belt-like resistance heating element as in FIG. 6B, and the third uniform heating plate (sample No. 3) as the same resistance heating element free from the positioning mark 7.

Each resistance heating element zone of the resistance heating element prepared in this way was subjected to division of a belt at 54 places, and then a difference between a resistance value designed at each place and an actually measured resistance value was adjusted in resistance by applying a laser beam to form a channel.

And, sample Nos. 1 and 2 was formed with the channel on the basis of the positioning mark, and sample No. 3 is formed with the channel on the basis of a contour of a plate shaped ceramics body. As a method of forming the channel, a YAG laser available from NEC Corporation was used. A laser beam was irradiated under the conditions: wavelength of 1.06 µm, pulse frequency of 1 kHz, laser output of 0.4 W, processing speed of 5 mm/sec.

Further, the channel formed under the above-mentioned conditions had a width of about 50 to 60 µm, and a depth of about 20 to 25 µm. And, an interval, a pitch, between the channel and the channel which were formed in each group was about 65 µm, and the maximum number of channels was 13.

And, the uniform heating plate was mounted to a metal case, together with a temperature measurement element, a power supply terminal or the like, and thereby ceramic heater sample Nos. 1 to 3 was finished.

Then, a silicon wafer attached with the temperature measurement element was loaded on a mounting surface. The ceramic heater was heated to get the entire wafer to reach an average temperature of 200° C. An in-plane temperature difference of the wafer was measured using silicon wafer attached with the temperature measurement element.

Each result was represented in Table 1.

TABLE 1

| Sample No. | Existence of positioning mark | In-plane temperature difference of wafer W (° C.) |
| --- | --- | --- |
| 1 | Yes | 0.25 |
| 2 | Yes | 0.3 |
| *3 | No | 0.45 |

Symbol * indicates a sample other than those of the invention.

As shown in Table 1, sample Nos. 1 and 2 of the present invention where the positioning mark 7 was formed on the belt of the resistance heating element showed a good result that the in-plane temperature difference of the wafer W was within 0.3° C. and temperature distribution was small.

In contrast, in sample No. 3 free from the positioning mark, the in-plane temperature difference of the wafer W was 0.45° C., and thus was great.

EXAMPLE 2

Samples were prepared in the same method as in Example 1. Further, the positioning mark configured of a protrusion shown in FIG. 6 was formed. Thereby, ceramic heaters forming a channel outside the belt, inside the belt, and in the middle of the belt were prepared. In addition, for the sake of comparison, a ceramic heater where the channels were present inside and outside was prepared.

Further, the belt of the resistance heating element was formed at a width of 1.5 mm, and then the belt was form with a group of channels by the laser. The channel group was formed on a portion of the belt located outside the plate shaped ceramics body. And, a sample changing an interval between the channel group and the channel group was prepared.

Further, the interval between the group and the group referred to dividing each resistance heating element zone of resistance heating elements into portions, lessening resistance deviation of each portion of each resistance heating element zone, measuring resistance of each portion to form the channel at the portion where the resistance was small, and increasing the resistance. Therefore, the interval between the group and the group referred to the interval between the group and the group, i.e., a resistance measurement interval of each portion, and the interval between the group and the group where was smallest among each resistance heating element zone.

And, the same evaluation as in Example was carried out, its result was indicated in Table 2.

TABLE 2

| Sample No. | Place of forming channel or group | Interval between group and group (mm) | In-plane temperature difference of wafer W (° C.) |
| --- | --- | --- | --- |
| 21 | Center | 0.2 | 0.18 |
| 22 | Outside | 0.5 | 0.19 |
| 23 | Inside | 0.8 | 0.21 |
| 24 | Outside | 1.2 | 0.22 |
| 25 | Outside | 1.3 | 0.24 |
| 26 | Mixed | 1.4 | 0.27 |
| 27 | Mixed | 1.8 | 0.3 |

As could be seen from Table 2, sample Nos. 21 to 26 obtained a good result that a minimum interval between the group and the group was less than 1.5 mm, i.e., the width of the belt of the resistance heating element, and the temperature difference of the entire wafer W is within 0.27° C. Further, in sample Nos. 21 to 24 where the minimum interval between the group and the group was 1.2 mm or less and the width of the belt was 80% or less, it could be seen that the in-plane temperature differences of the wafer were preferably small as 0.22° C.

Meanwhile, in sample Nos. 26 and 27 which mixing the positions forming the channel inside or outside the belt, the in-plane temperature differences of the wafer were slightly great as 0.27° C. and 0.3° C.

However, in sample Nos. 21 to 25 which form the channel or a group of channels at the center of the belt and inside or outside thereof, it could be seen that the in-plane temperature difference of the wafer W was preferably small as 0.24° C. or less.

EXAMPLE 3

A silicon carbide sintered compact having thermal conductivity of 80 W/(m·K) was subjected to grinding to thus prepare a plurality of uniform heating plates taking a shape of a disc having a thickness of 4 mm and an outer diameter of 230 mm. In order to bond an insulating layer on one main surface of each uniform heating plate, a glass paste prepared by kneading ethyl cellulose as a binder and terpineol as an organic solvent with glass powder was laid by a screen printing method, heated at 150° C. to dry the organic solvent, defatted for 30 minutes at 550° C., and then subjected to baking at a temperature of 700 to 900° C. again. Thereby, the insulating layer composed of glass and having a thickness of 200 μm was formed. Subsequently, in order to bond a resistance heating element on the insulating layer, 20% by weight of Au powder, 10% by weight of Pt powder and 70% by weight of glass as a conductive material were printed in a shape of a predetermined quantity of pattern, and then heated at 150° C. to dry the organic solvent, defatted for 30 minutes at 450° C. again, and subjected to baking at a temperature of 500 to 700° C. Thereby, the resistance heating element having a thickness of 50 μm was formed.

Further, average particle sizes of Au and Pt as conductive composition used for the resistance heating element were 0.5 μm. Further, glass powder as an insulating composition was added, and thereby their average particle sizes become 1.5 μm and 20 μm. Further, sample Nos. 101 to 103 were prepared using their mixtures.

Figure 20:
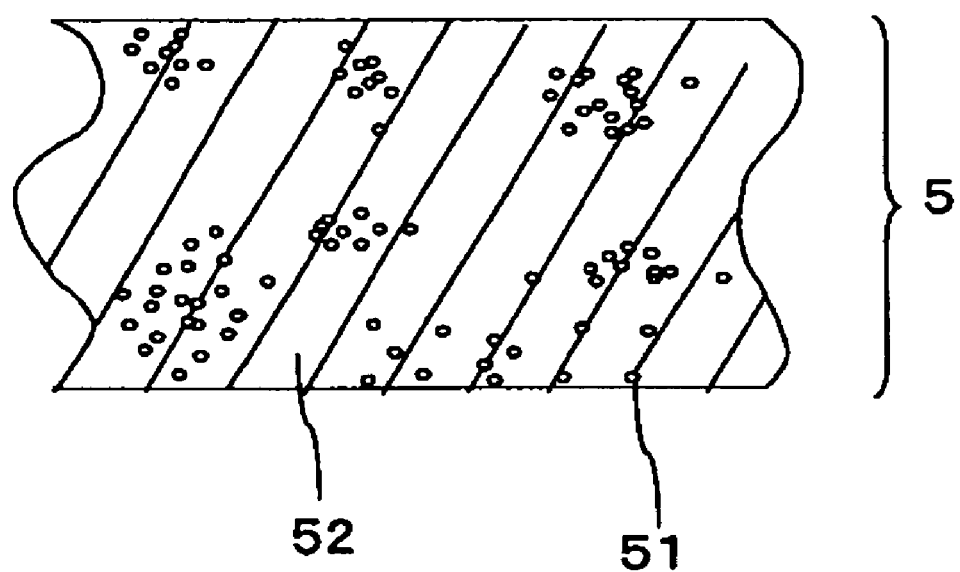
FIG. 20 is an enlarged view of the resistance heating element in the heater of the invention.

Checking an internal dispersed state of the conductive composition after forming the resistance heating element, sample Nos. 101 and 102 had a large conglomerate of glass and were turned into a dispersed state as in FIG. 20.

Figure 21:
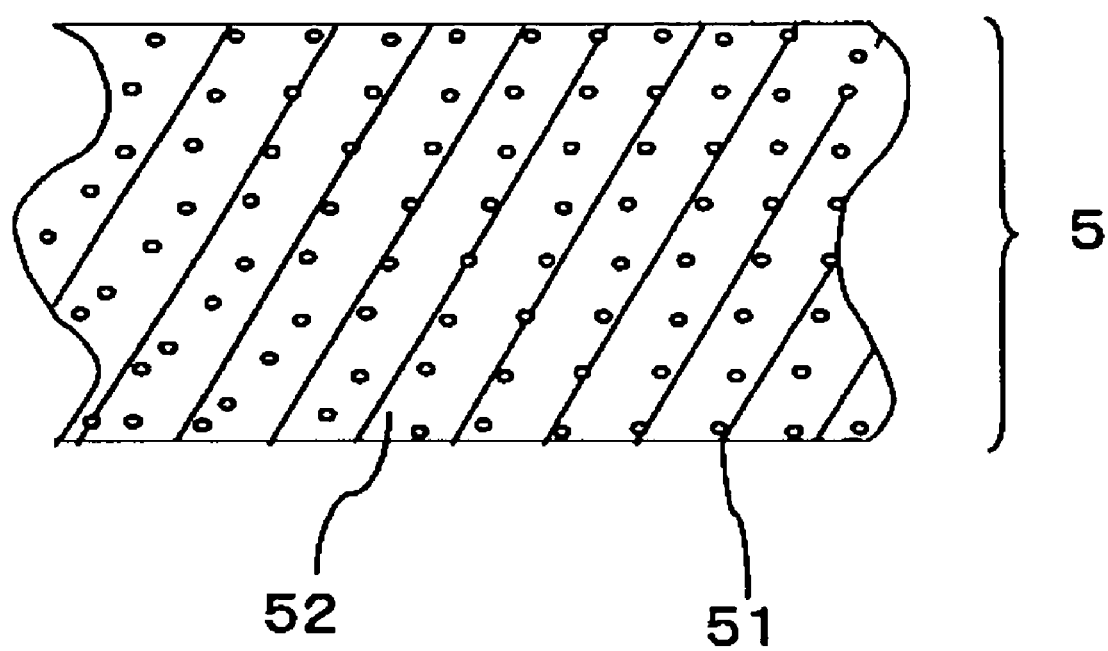
FIG. 21 is an enlarged view of a resistance heating element in a conventional heater.

Further, sample No. 103 was turned into a dispersed state as in FIG. 21.

Further, the resistance heating element was configured of five patterns quartering its center and circumference in a circumferential direction.

Each pattern of the resistance heating element prepared in this way was divided into 50 places or so, and then a difference between a resistance value designed at each place and an actually measured resistance value was adjusted in resistance by applying a laser beam to form a channel. As a method of forming the channel, a YAG laser available from NEC Corporation was used. A laser beam was irradiated under the conditions: wavelength of 1.06 μm, pulse frequency of 1 KHz, laser output of 0.4 W, processing speed of 5 mm/sec.

Further, the channel formed under the above-mentioned conditions had a width of about 50 to 60 μm, and a depth of about 20 to 25 μm. And, an interval, a pitch, between the channel and the channel which were formed in each group was about 65 μm, and the maximum number of channels was 13.

Further, the conductive composition of the surface of the channel of sample No. 101 or 102 become circle of 2 to 5 μm, and thus a density of the conductive composition of the surface of the channel was smaller than that of its interior.

Figure 22:
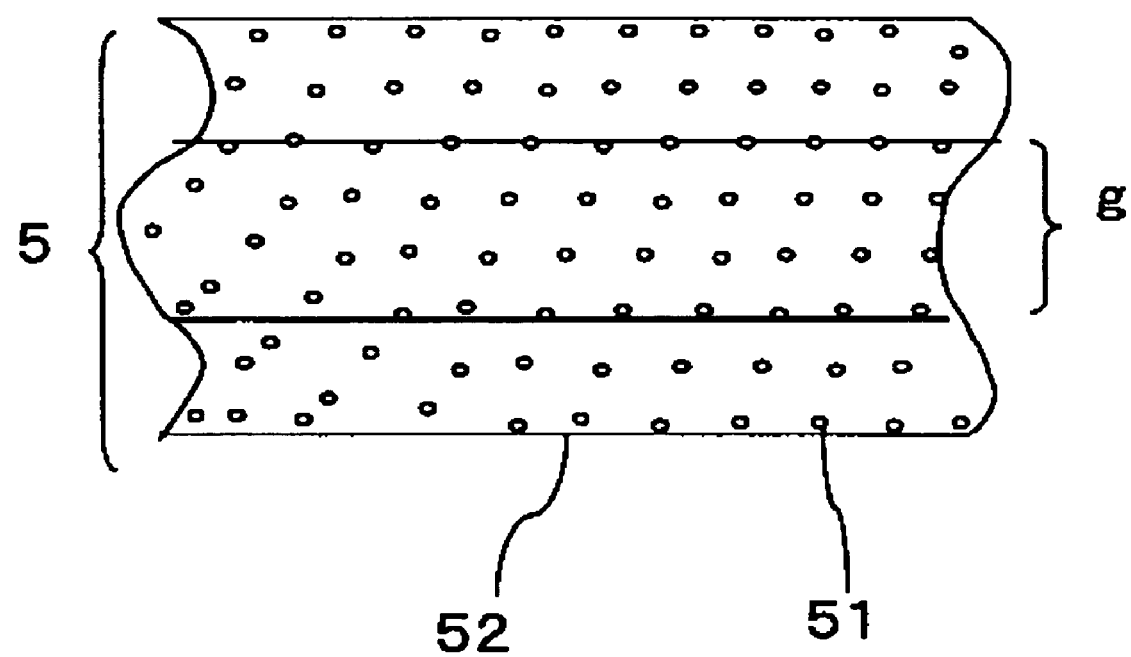
FIG. 22 is an enlarged view of a resistance heating element in a conventional heater.

Meanwhile, the density of the conductive composition of the surface of the channel of sample No. 103 had hardly any difference from its interior as in FIG. 22.

Further, lightness of each was examined. As a method of simply examining a lightness difference, first, a photograph of each surface was taken by a metallurgical microscope, and a white and block copy of the photograph was made. Thereby, an intensity of a white tone was examined. The lightness was increased as the white tone become stronger. In contrast, the lightness was decreased as the black tone become stronger. As a result, sample Nos. 101 and 102 were low in lightness because the black tone of the surface of the channel was stronger than that of other surface than the channel. Meanwhile, sample No. 103 had no difference in lightness.

And, the uniform heating plate was mounted to a metal case, together with a temperature measurement element, a power supply terminal or the like. Thereby, ceramic heaters of sample Nos. 101 to 103 were finished.

Further, a surface of a group g of channels of the finished samples was examined by a 200-power scanning electron microscope (SEM). As shown in Table 3, micro-cracks each having a length of 5 μm were observed.

Further, the length of the crack was measured in a straight distance from a start point of the crack to an end point, and thereby its average value was obtained.

Then, a silicon wafer where the temperature measurement element was attached to the ceramic heater of sample No. 101, 102 or 103 was loaded on a mounting surface. The ceramic heater was heated to get the entire wafer to reach an average temperature of 200° C. An in-plane temperature difference of the wafer was measured using silicon wafer attached with the temperature measurement element.

Further, thereafter, the ceramic heaters of sample Nos. 101 to 103 were kept for 3 minutes after a voltage was applied so that the wafer reached an average surface temperature of 350° C. from a room temperature for 1 minute. Then, a heat cycle cooling up to a temperature of 40° C. or less for 2 minutes was adopted as 1 cycle, and the heat cycle was repeated 5000 times. And then, a channel was observed, and a rate of change in resistance of each resistance heating element of each sample and an in-plane temperature difference of the wafer were measured.

The rate of change in resistance of each resistance heating element of each sample was found by dividing a quantity of change in resistance by an initial resistance value. When a plurality of rates of change in resistance were present, the maximum value was adopted as the rate of change in resistance, and shown in the table. Further, the rate of change in resistance of the resistance heating element was preferably within 3% at which a surface temperature difference of the wafer was converged on the change within 0.1° C. More preferably, the rate of change in resistance was within 1% at which a surface temperature difference of the wafer was converged within 0.03° C.

Each result was as shown in Table 3.

TABLE 3

| | | | Before heat cycle | | After 5000 heat cycles | | |
| --- | --- | --- | --- | --- | --- | --- | --- |
| Sample No. | Surface of channel has density of conductive composition smaller than surface of resistance heating element except channel | Surface of channel has lightness smaller than surface of resistance heating element except channel | Average length of microcrack (μm) | In-plane temperature difference of wafer (° C.) | Average length of microcrack (μm) | In-plane temperature difference of wafer (° C.) | Rate of change in resistance (%) |
| 101 | Yes | Yes | 5 | 0.35 | 5 | 0.37 | 0.7 |
| 102 | Yes | Yes | 5 | 0.36 | 5 | 0.38 | 0.6 |
| 103 | No | NO | 5 | 0.35 | 50 | 0.86 | 5.1 |

As shown in Table 3, in sample Nos. 101 and 102 where the surface of the channel has the density of the conductive composition smaller than the interior of the resistance heating element, the particle size of glass as the insulating composition was great, and growth of the micro-crack was not observed. Further, although a cold heat cycle was repeated 5000 times, changes of the resistance vales were 0.7% and 0.6% respectively, and so small. Further, the in-plane temperature differences of the wafer were 0.37° C. and 0.38° C. respectively, and thus were small and good after the cold heat cycle.

Meanwhile, in sample No. 103 where the surface of the channel has the density of the conductive composition greater than the interior of the resistance heating element, the micro-crack grown up to about 50 μm after the cold heat cycle. Hence, the resistance value of the resistance heating element was changed by about 5%, and thus the in-plane temperature difference of the wafer was great as 0.86° C. As a result, the sample could not used consecutively.

Further, in sample Nos. 101 and 102 where the surface of the channel has the lightness smaller than the surface of the resistance heating element except the channel, it could be found that they were excellent in characteristic, because the in-plane temperature differences of the wafer were small as 0.37° C. and 0.38° C., respectively, and the rates of change in resistance were small as 1% or less.

EXAMPLE 4

Sample Nos. 104 to 108 were prepared in the same method as in Example 3. Insulating compositions of sample Nos. 104 to 108 were composed of glass, and their average particle sizes were 1.5 µm, 5 µm, 20 µm, 40 µm, and 60 µm. And, average particle sizes of conductive compositions of the surface after the channel was formed by a laser beam were 0.5 µm, 1 µm, 3.2 µm, 8.5 µm, and 20 µm. Further, the average particle sizes of the conductive compositions were represented by diameters of circles equivalent to average areas of the 20 conductive compositions from a SEM photograph of the surface.

Then, the surface was observed, and as in Example 3, adopting a heat cycle of 5000 cycles, a rate of change in a resistance value and a temperature deviation of the wafer were examined.

Their results were represented in Table 4.

TABLE 4

| Sample No. | Particle size of conductive composition of channel surface after processing channel by laser (µm) | Before heat cycle Average length of micro-crack (µm) | After 5000 heat cycles Average length of micro-crack (µm) | After 5000 heat cycles Rate of change in resistance (%) |
|---|---|---|---|---|
| 104 | 0.5 | 5 | 10 | 2.8% |
| 105 | 1 | 5 | 5 | 0.7% |
| 106 | 3.2 | 5 | 5 | 0.7% |
| 107 | 8.5 | 5 | 5 | 0.5% |
| 108 | 20 | 5 | 5 | 0.7% |

As shown in Table 4, in sample No. 104 where the particle size of the conductive composition on the surface of a group of channels was about 0.5 µm, the micro-crack grown up to 10 µm after the cold heat cycle, and the change in resistance was 2.8%.

In contrast, in sample Nos. 105 to 108 where the conductive composition was in circular shape and the particle size of the conductive composition on the surface of a group of channels was in a range of 1 to 20 µm, growth of the micro-crack was not observed, and the change in resistance was 1% or less. Thus, it could be found that these samples were more preferable.

EXAMPLE 5

By mixing the glasses of resistance heating element having the average particle sizes of 1.5 µm and 20 µm which represented a good result in Example 3, the samples were prepared in the same method as in Example 3, and a group of channels was formed by a laser beam.

The center of the group, which is a set of channels, formed on the center of a belt of a resistance heating element was referred to as sample No. 109. Further, the center of the group formed on a position of 25% from the edge of the belt was referred to as sample No. 110. Further, the channel formed from the edge of the belt was referred to as sample No. 111. In addition, the center of the belt of the resistance heating element was set in a range of ±5% of a width of the belt, based on a width of the center. And, the same evaluation as in Example 3 was carried out.

Their results were represented in Table 5.

TABLE 5

| Sample No. | Position of center of group in width direction of belt | In-plane temperature difference of wafer (° C.) |
|---|---|---|
| 109 | Center of belt | 0.29 |
| 110 | 25% from edge of belt | 0.35 |
| 111 | Edge of belt | 0.39 |

As shown in Table 5, sample No. 109 of the invention where the group of the channels formed at the center of the belt of the resistance heating element represented a good result in that the in-plane temperature difference of the wafer W surface was 0.29° C., and that the temperature distribution was small.

In contrast, sample Nos. 110 and 111 where the channel formed beyond the center of the group had the in-plane temperature difference of the wafer of 0.35° C. and 0.39° C. respectively, thus when compared with sample No. 109 the in-plane temperature difference of the wafer was greater.

EXAMPLE 6

Samples were prepared in the same method as in Example 5, and a group of channels was formed by a laser beam. As for a center of the group of the channels, the center representing a good result in Example 5 was adopted. A width of the group of the channels was adjusted by changing a pitch, an interval, between the adjacent channels, and thereby the widths of the group of the channels were set as 50%, 70%, 90%, 95% and 100% of a width of a belt of a resistance heating element. Then, the samples were maintaining as it is for 3 minutes after a voltage was applied so that the wafer reached an average surface temperature of 350° C. from a room temperature in 1 minute. Then, a heat cycle cooling down to a temperature of 40° C. or less in 2 minutes was adopted as 1 cycle, and the heat cycle was repeated 5000 times. Further, a channel was observed before and after the heat cycle and the rate of change in resistance value of each resistance heating element of each sample was measured.

Their results were represented in Table 6.

TABLE 6

| Sample No. | Ratio of width of group to width of belt (with respect to resistance heating element) | Rate of change in resistance |
|---|---|---|
| 112 | 50% | 0.4% |
| 113 | 70% | 0.4% |
| 114 | 90% | 0.5% |
| 115 | 95% | 1.8% |
| 116 | 100% | 2.5% |

As seen from the result of Table 6, in sample Nos. 112 to 114 where the widths of the group of the channels were formed within 90% of the width of the belt, the resistance change in each sample was less than 1% at the heat cycle of 5000 cycles, and thus was good.

Meanwhile, sample Nos. 115 and 116 had greater resistance change compared to sample Nos. 112 to 114.

EXAMPLE 7

Samples were prepared in the same method as in Example 5, and a group of channels was formed by a laser. As for a center of the group of the channels, the center representing a good result in Example 5 was adopted. A width of the group of the channels set as less than 90% of the width of the belt of the resistance heating element represented a good result in Example 6. Further, an output of the laser beam was changed in a range of 0.1 to 0.6 W, and thereby a depth of the channel was adjusted up to 10%, 20%, 50%, 75%, and 85% of a width of the channel.

And, the heat cycle test was performed in the same manner as in Example 3, and thereby rate of changes in the resistance values were examined. Their results were represented in Table 7.

Further, among the resistance values of before and after durability of five resistances heating elements, one value having the maximum rate of change in resistance was disclosed.

TABLE 7

| Sample No. | Depth of channel/width of channel (%) | Rate of change in resistance (%) |
|---|---|---|
| 117 | 10 | NG because resistance value is not rounded off |
| 118 | 20 | 0.3% |
| 119 | 50 | 0.3% |
| 120 | 75 | 0.4% |
| 121 | 85 | 2.1% |

In the case of Sample No. 117 where the depth of the channel was 10% of the width of the channel and resistance of each part of the resistance heating element was adjusted, the resistance value of each part was not sufficiently adjusted, thus the deviation of the resistance value of the resistance heating element was great even when the channel was formed, and it was impossible to lessen an in-plane temperature of the wafer W.

Sample Nos. 18 to 20 showed a good result in that the depth of the channel was in a range of 20% to 75% and the rate of change in resistance after 5000 heat cycles was within 1%.

However, in sample No. 121, the depth of the channel was 85% of the width, and the resistance value of the resistance heating element was changed by 2.1%.

EXAMPLE 8

A silicon carbide sintered compact having thermal conductivity of 80 W/(m·K) was subjected to grinding to thus prepare the plurality of uniform heating plates in a shape of a disc having a thickness of 4 mm and an outer diameter of 230 mm. In order to bond an insulating layer on one main surface of each uniform heating plate, a glass paste prepared by kneading ethyl cellulose as a binder and terpineol as an organic solvent based on the glass powder was laid by a screen printing method, heated at 150° C. to dry the organic solvent, defatted for 30 minutes at 550° C., and then subjected to baking at a temperature of 700 to 900° C. again. Thereby, the insulating layer composed of glass and having a thickness of 200 μm was formed. Subsequently, in order to bond a resistance heating element on the insulating layer, 20% by weight of Au powder, 10% by weight of Pt powder and 70% by weight of glass as a conductive material were printed in a shape of a predetermined quantity of pattern, heated at 150° C. to dry the organic solvent, defatted for 30 minutes at 450° C. again, and then subjected to baking at a temperature of 500 to 700° C. Thereby, the resistance heating element having a thickness of 50 μm was formed. The resistance heating element was formed into five patterns quartering its center and outer circumference in a circumferential direction.

Each pattern of the resistance heating element prepared in the above manner was divided into 50 places or so, and then a difference between a resistance value designed at each place and an actually measured resistance value was adjusted in resistance by applying a laser beam to form a channel. As a method of forming the channel, a YAG laser available from Nippon Denki Co. was used. A laser beam was processed under the conditions: wavelength of 1.06 μm, pulse frequency of 1 KHz, laser output of 0.4 W, processing speed of 5 mm/sec.

Further, the channel formed under the above-mentioned conditions had a width of about 50 to 60 μm, and a depth of about 20 to 25 μm. And, an interval, a pitch, between the adjacent channels, which were formed in each group, was about 65 μm, and the maximum number of channels was 13.

Sample Nos. 201 to 203 which formed a center of the group, in a set of channels, at a center of a belt of a resistance heating element (Sample No. 201), which formed a center of the group at a position of 25% from an edge of the belt (Sample No. 202), which formed the channel from the edge of the belt (Sample No. 203) were prepared. In addition, the center of the belt of the resistance heating element was set to a range of ±5% of a width of the belt on the basis of a center of the width.

And, the uniform heating plate was mounted to a metal case, together with a temperature measurement element, a power supply terminal or the like. Thereby, a variety of ceramic heaters were finished.

Then, a silicon wafer to which the temperature measurement element was attached was loaded on a mounting surface. The ceramic heater was heated to get the entire wafer to reach an average temperature of 200° C. A surface temperature deviation of the wafer was measured using a silicon wafer attached with the temperature measurement element.

Each result was represented in Table 8.

TABLE 8

| Sample No. | Center of group of channel | In-plane temperature difference of wafer W |
|---|---|---|
| 201 | Center of belt | ±0.14° C. |
| 202 | 25% from width of belt | ±0.34° C. |
| 203 | Width of belt | ±0.49° C. |

As shown in Table 8, sample No. 201 of the invention where the group of the channels was formed at the center of the belt of the resistance heating element represented a good result in that the in-plane temperature difference of the wafer W was ±0.14° C. and temperature distribution was small.

In contrast, sample Nos. 202 and 203 where the channel formed beyond the center of the group were ±0.34° C. and ±0.49° C. respectively, and thus the in-plane temperature difference of the wafer were great and not desirable.

EXAMPLE 9

Samples were prepared in the same method as in Example 8, and a group of channels was formed by a laser beam. As for a center of the group of the channels, the center representing a good result in Example 8 was adopted. A width of the group of the channels was adjusted by changing a pitch, an interval, between the adjacent channels, and thereby the width of the group of the channels was set as 50%, 70%, 90%, 95% and 100% of a width of a belt of a resistance heating element. Then, the samples were maintaining as it is for 3 minutes after a voltage was applied so that the wafer reached an average surface temperature of 350° C. from a room temperature in 1 minute. Then, a heat cycle cooling down to a temperature of 40° C. or less in 2 minutes was adopted as 1 cycle, and the heat cycle was repeated 5000 times. And a channel was observed before and after the heat cycle, and the change in resistance value of each pattern of each sample was measured.

The change in resistance value of each pattern of each sample was measured by a four-terminal method. Further, the rate of change in resistance of a resistance heating element was good if it was within 1%, but was not desirable if it exceeded 1%. This is because there is a chance that, when the resistance was changed within 1%, a surface temperature difference of the wafer was 0.03° C.—small, but when the resistance was changed by 1% or more, the surface temperature difference of the wafer exceeded 0.03° C. to cause great change.

Their results were represented in Table 9.

TABLE 9

| Sample No. | Width of group of channel (with respect to width of resistance heating element) | Number of heat cycles leading to breakdown | Rate of change in resistance | Temperature difference of entire wafer after durability |
| --- | --- | --- | --- | --- |
| 204 | 50% | 5000 or more | 1% or less | None |
| 205 | 70% | 5000 or more | 1% or less | None |
| 206 | 90% | 5000 or more | 1% or less | None |
| 207 | 95% | 4535 cycles | Breakdown | Breakdown |
| 208 | 100% | 3125 cycles | Breakdown | Breakdown |

As seen from the result of Table 9, sample Nos. 204 to 206 where the width of the group of the channels formed within 90% of the width of the belt were not destroyed at 5000 heat cycles, and had the resistance change of 1% or less.

Meanwhile, sample Nos. 207 and 208 were destroyed at 5000 cycles or less, and thus it could be found that they fell in durability against the heat cycle.

EXAMPLE 10

Samples were prepared in the same method as in Example 8, and a group of channels was formed by a laser. As for a center of the group of the channels, the center representing a good result in Example 8 was adopted. A width of the group of the channels was set as 90% or less of the width of the belt of the resistance heating element representing the good result in Example 9. Further, an output of the laser beam was changed in a range of 0.1 to 0.6 W, and thereby a depth of the channel was adjusted up to 10%, 20%, 50%, 75%, and 85% of a width of the channel.

Further, a heat cycle test was performed in the same manner as in Example 9, and thereby the rate of change in a resistance value was examined. Their results were represented in Table 10.

Further, among the resistance values of before and after durability of five patterns, one value having the maximum rate of change in resistance was disclosed.

TABLE 10

| Sample No. | Depth of channel/width of channel (%) | Resistance value after forming channel (Ω) | Resistance value after durability (Ω) | Rate of change in resistance (%) |
| --- | --- | --- | --- | --- |
| 209 | 10 | 19.5 | — | — |
| 210 | 20 | 22.33 | 22.39 | 0.27 |
| 211 | 50 | 22.65 | 22.82 | 0.75 |
| 212 | 75 | 22.45 | 22.65 | 0.89 |
| 213 | 85 | 23.55 | 24.03 | 2.04 |

In sample No. 209 where the depth of the channel was set as 10% of the width of the channel and resistance of each part of the resistance heating element was adjusted, the resistance value of each part could not be sufficiently adjusted, thus its resistance was 19.5 Ω, i.e. small and deviation of the resistance value of the resistance heating element was great even when the channel was formed, and it was impossible to lessen an in-plane temperature of the wafer W.

Sample Nos. 210 to 212 showed a good result in that the depth of the channel was in a range of 20% to 75% and the rate of change in resistance after 5000 heat cycles was within 1%.

However, in the case of sample No. 213, the depth of the channel was 85% of the width, the resistance value of the resistance heating element is varied by 2.04%. After the heat cycle test of 5000 times or more, the in-plane temperature difference of the wafer increases by 0.06° C., and the in-plane temperature difference of the wafer increases by ±0.32° C. Thus, it could be found that the sample could not be used at a heat cycle of 5000 times or more.

EXAMPLE 11

Samples were prepared in the same method as in Example 8, and a group of channels was formed by a laser beam. A center of the group of channels was adopted by a center representing a good result in Example, and a width of the group of channels was set as 90% or less of a width of the belt representing a good result in Example 9. Further, the sample where an interval between the adjacent group of channels were removed and thus the groups of the channels were made continuous was determined as sample No. 214. The samples where the interval between the adjacent groups of channels corresponds to 5% of the width of the belt, 50% of the width of the belt, the same as the width of the belt, and 150% of the width of the belt, respectively were prepared and determined as sample Nos. 215 to 218. An in-plane temperature difference of the wafer was measured by heating at 200° C. as in Example 8. Besides, a heat cycle test was performed in the same manner as in Example 9, and the rate of change in a resistance value before and after a heat cycle was measured.

Further, the interval between the adjacent groups referred to dividing each pattern of the resistance heating element into parts, measuring resistance of each part to form the channel at the part where the resistance was small, increasing the resistance to be able to reduce the resistance deviation of each part of each pattern. Therefore, the interval between the adjacent groups referred to the interval inside resistance measurement interval of each part, and could be indicated by the smallest interval between the adjacent groups in the respective patterns.

Their results were represented in Table 11.

TABLE 11

| Sample No. | Interval between adjacent groups of channels | Temperature difference of entire wafer (° C.) | Resistance value after forming channel (Ω) | Resistance value after durability (Ω) | Rate of change in resistance (%) |
| --- | --- | --- | --- | --- | --- |
| 214 | Continuous | ±0.29 | Disconnected during durability | | Disconnected |
| 215 | 5% of width of belt | ±0.11 | 22.33 | 22.39 | 0.27% |
| 216 | 50% of width of belt | ±0.15 | 22.65 | 22.82 | 0.75% |
| 217 | Same as width of belt | ±0.20 | 22.45 | 22.61 | 0.71% |
| 218 | 150% of width of belt | ±0.25 | 23.55 | 23.78 | 0.98% |

As seen from Table 11, sample Nos. 215 to 217 obtained better results that the minimum interval between the adjacent groups were equal to or less than the width of the resistance heating element, and the temperature difference of the entire wafer W was within ±0.20° C., thus good result was obtained.

On the other hand, in sample No. 218 having the interval between the adjacent groups larger than the width of the belt, and at each place of the interval, the temperature was low and the temperature difference was slightly large, i.e. ±0.25° C.

Also, in sample No. 214, the groups were continuous, and the resistance heating element of the sample was disconnected during the heat cycle of 5000 cycles, and thus it was proved that durability against the heat cycle was slightly deteriorated.

EXAMPLE 12

Samples were prepared as in Example 11, which had intervals between the adjacent groups of 0.2, 0.5, 0.8, 1.0 and 1.2 mm. Then, a temperature difference of the entire wafer was examined in the same manner as in Example 8.

Further, in a resistance heating element, a width of a belt was set to 2 mm.

Results were represented in Table 12.

TABLE 12

| Sample No. | Interval between the adjacent groups (mm) | Temperature difference of entire wafer (° C.) |
| --- | --- | --- |
| 219 | 0.2 | ±0.11 |
| 220 | 0.5 | ±0.12 |
| 221 | 0.8 | ±0.13 |
| 222 | 1 | ±0.15 |
| 223 | 1.2 | ±0.19 |

As shown in Table 12, sample Nos. 219 to 222 having the interval between the adjacent groups of 1 mm or less represented very good results in that the temperature difference in the wafer W was very small, i.e. ±0.15° C. Meanwhile, in sample No. 223 having the interval between the adjacent groups of 1.2 mm, the in-plane temperature difference of the wafer W was rather large, i.e. ±0.19° C.

EXAMPLE 13

A ceramic heater and a wafer heating device of the invention were fabricated as follows. A silicon carbide sintered compact having thermal conductivity of 80 W/(m·K) was subjected to grinding to thus prepare the plurality of plate shaped bodies in a shape of a disc having a thickness of 4 mm and an outer diameter of 230 mm. In order to bond an insulating layer on one main surface of each plate shaped body, a glass paste prepared by kneading ethyl cellulose as a binder and terpineol as an organic solvent based on a glass powder was laid by a screen printing method, heated at 150° C. to dry the organic solvent, defatted for 30 minutes at 550° C., and then subjected to baking at a temperature of 700 to 900° C. again. Thereby, the insulating layer composed of glass and having a thickness of 200 μm was formed. Subsequently, in order to bond a resistance heating element on the insulating layer, 20% by weight of Au powder, 10% by weight of Pt powder and 70% by weight of glass as a conductive material were printed in a shape of a predetermined quantity of resistance heating element zone, heated at 150° C. to dry the organic solvent, defatted for 30 minutes at 450° C. again, and then subjected to baking at a temperature of 500 to 700° C. Thereby, the resistance heating element having a thickness of 50 μm was formed. The resistance heating element was composed of arc shaped belts and folded arcs connecting the belts and was formed into eight resistance heating element zones quartering its center and outer circumference in a circumferential direction.

Each of the respective resistance heating element zone of the resistance heating element prepared as above was divided into 50 places or so. In order to remove any difference between a resistance value designed at each place and an actually measured resistance value at each place, a group constituted of the plurality of channels was formed by irradiating a laser beam, and then resistance was adjusted. In addition, the aforementioned resistance value was adjusted for one smaller than the designed value on the basis of the maximum resistance value by measuring the resistance value of each resistance heating element zone.

Here, the ceramic heater was fabricated having the design of which on the basis of a position of forming the group G constituted of the plurality of channels m, were formed on the side of a center of the plate shaped body 2 rather than a longitudinal center line of the resistance heating element (sample No. 301) and on the side of an outer circumference of the plate shaped body 2 rather than a longitudinal center line of the resistance heating element 5 (sample No. 302).

In addition, as a comparative example, the ceramic heater (sample No. 303) was fabricated by randomly forming a group constituted of the plurality of channels on the resistance heating element, for example, on the center side, the outer circumference side, or the center of the resistance heating element.

As a method of forming the channel, a YAG laser available from Nippon Denki Co. was used. A laser beam was processed under the conditions: wavelength of 1.06 μm, pulse frequency of 1 KHz, laser output of 0.4 W, processing speed of 5 mm/sec.

Further, the channel formed under the above-mentioned conditions had a width of about 50 to 60 μm, and a depth of about 20 to 25 μm. And, an interval, a pitch, between the adjacent channels, which were formed in each group, was about 65 μm, and the maximum number of channels was 13.

The ceramic heater obtained under the above-mentioned conditions was mounted on a metal case, together with a temperature measurement element, a power supply terminal or so on in order to fabricate wafer heating device.

The fabricated wafer heating devices were tested by using a temperature measuring wafer having a diameter of 300 mm in which temperature measuring resistors were buried at 29 places. Each of the respective wafer heating devices was mounted with a power source, and heated the wafer W from 25° C. to 200° C. for 5 minutes, and after the temperature of the wafer W was set to 200° C., the wafer W was removed. A temperature measuring wafer W having a room temperature was mounted, and then a time until the average temperature of the wafer W become uniform in a range of 200° C.±0.5° C. was measured as a response time. In addition, after a temperature cycle of heating the wafer from 30° C. to 200° C. for 5 minutes, maintaining it for 5 minutes, and then cooling it for 30 minutes was repeated 1000 times, the temperature was set at room temperature to 200° C., the difference between maximum and minimum values of the wafer temperature after 10 minutes had lapsed was measured as an in-plane temperature difference of the wafer W. Results were represented in Table 13.

TABLE 13

| Sample No. | Position of forming group constituted of channels | In-plane temperature difference of wafer W (° C.) |
|---|---|---|
| 301 | Outer circumference side of plate shaped ceramic body | 0.26 |
| 302 | Center side of plate shaped ceramic body | 0.27 |
| 303 | Random | 0.38 |

As shown in Table 13, in the ceramic heater of sample No. 303 as a comparative example, since the groups G of the channels m were randomly formed on resistance heating elements, the symmetry of the channels m with respect to the plate shaped body 2 was deteriorated, the temperature difference was generated on heating areas of each resistance heating element, and in-plane temperature difference of the wafer was great, i.e. 0.38° C. Thus, the uniform heating characteristic was degraded.

In contrast, in the ceramic heaters of sample Nos. 301 and 302 as Examples of the invention, since the channels m were unilaterally formed on the resistance heating element 5 in one direction, the channels m had an excellent symmetry with respect to the plate shaped body 2, and temperature difference in heating areas of each resistance heating element 5 was reduced. Thus, it was possible to reduce the in-plane temperature difference of the wafer.

EXAMPLE 14

A resistance heating element 5 was formed in the same method as the above-described Example 13, in which a belt of the resistance heating element 5 was formed having a width of 1.5 mm, and groups G constituted of the plurality of channels m by laser were unilaterally concentrated on a center of a plate shaped body 2.

Then, the relation of an interval between the plurality of group G with a width of the resistance heating element 5 was inspected. In addition, the above-mentioned interval of the groups G could be expressed as an interval between the smallest groups in each resistance heating element zone.

Then, the in-plane temperature difference of the wafer W was tested in the same manner as in Example 13. Results were represented in Table 14.

TABLE 14

| Sample No. | Ratio of interval between groups to width of belt (%) | In-plane temperature difference of wafer W (° C.) |
|---|---|---|
| 321 | 70 | 0.19 |
| 322 | 80 | 0.21 |
| 323 | 90 | 0.22 |
| 324 | 120 | 0.26 |

As shown in Table 14, in sample No. 324 in which the interval between the groups G was larger than the width of the belt constituted of the resistance heating element 5, it was difficult to equate the temperature at the interval with of other parts, and thus the in-plane temperature difference of the wafer was 0.26° C., i.e. rather great.

On the contrary, in sample Nos. 321 to 324, since the interval of the group G was smaller than the width of the belt constituted of the resistance heating element 5, it was possible to further lower the in-plane temperature difference of the wafer.

EXAMPLE 15

First, aluminum nitride slurry was prepared by adding 1.0% by weight of yttrium oxide to aluminum nitride powder, and then kneading the mixture for 48 hours with a ball mill using isopropyl alcohol and urethane balls.

Then, after strained through a 200 mesh to remove scraps from the urethane balls or ball mill walls, aluminum nitride slurry was dried for 24 hours at 120° C. with an explosion proof drier. Then, the obtained aluminum nitride powder was mixed with an acrylic binder and a solvent, and thereby a nitride aluminum slip was prepared, from which a number of green sheets of aluminum nitride were prepared using a doctor blade method. Then, the plurality of the obtained green sheets of aluminum nitride were stacked and subjected to thermal compression, and thereby a laminated structure was formed. Then, the laminated structure was defatted for 5 hours at a temperature of 500° C. in a non-oxidizing gas flow, and then baked for 5 hours at a temperature of 1900° C. under a non-oxidizing atmosphere. As a result, aluminum nitride sintered compacts having a variety of thermal conductivities were prepared.

Each of the aluminum nitride sintered compacts was grinded to prepare the plurality of plate shaped ceramic bodies in a shape of disc and had a thickness of 3 mm and a diameter of 330 mm. Then, three though-holes were formed uniformly on a concentric circle having a radius of 60 mm from the center, each of which had a diameter of 4 mm.

Then, in order to bond the resistance heating element 5 on the plate shaped body 2, a conductor paste, which was prepared by kneading Au powder and Pd powder as a conductive material and a glass paste adding a binder of the same composition as the conductive material, was printed in a predetermined pattern by a screen printing method, heated at 150° C. to dry an organic solvent, defatted for 30 minutes at 550° C., and subjected to baking at a temperature of 700 to 900° C. As a result, the resistance heating element 5 having a thickness of 50 μm was prepared.

In addition, as shown in FIG. 6, the resistance heating element 5 was formed by printing a pattern composed of substantially concentric arc shaped belts and folded arc shaped belts connecting the concentric arc shaped belts, and unevenly distributing channels m for adjusting a resistance value on a center side of the plate shaped body 2.

Further, as for arrangement of the total of eight resistance heating zones dividing the above-described resistance heating element 5, as shown in FIG. 5, a circular resistance heating element zone 4a corresponding to 25% of a diameter D of the plate shaped body 2 was formed in a center of the plate shaped body 2, an annular resistance heating element zone 4b was formed outside the circular resistance heating element zone 4a, two resistance heating element zones 41c and 42c dividing an annulus corresponding to 45% of the diameter D of the plate shaped body 2 were formed outside the annular resistance heating element zone 4b, and four resistance heating element zones 41d, 42d, 43d and 44d dividing an annulus corresponding to 70% of the diameter D of the plate shaped body 2 were formed outside the annular resistance heating element zone 4b. Thereby, samples were prepared, each of which was composed of the total of eight resistance heating zones and had an outer diameter D of 310 mm.

Then, a ceramic heater 1 was fabricated by firmly fixing power supply part 6 to the resistance heating element 5 by means of brazing. In addition, in this Example, the resistance heating element zone of the center and the annular resistance heating element zone outside the center were connected in parallel and subjected to heating control at the same time.

The ceramic heater 1 was fabricated at a different ratio expressed by Lm/Lr×100%, wherein Lm is a distance between a pair of folded arc shaped belts placed on the same circumference, and Lr is a distance between two arc shaped belts connected with the folded arc shaped belts.

Then, a wafer heating device 111 was fabricated by installing the ceramic heater 1 in an opening of the metal case 19, passing a bolt through an outer circumference thereof, interposing a ring shaped contact member 17 therebetween to prevent the ceramic heater 1 from being brought into direct contact with the metal case 19, and screwing a nut 20 to the bolt to fix the ceramic heater 1 and the metal case 19.

A bottom 21 of the metal case 19 had a thickness consisting of 2.0 mm thick aluminum and 1.0 mm thick aluminum for a side wall. Gas nozzles 24, a thermocouple 27 and power supply terminal 11 were mounted at predetermined plates of the bottom 21. The distance from the bottom 21 to the ceramic heater 1 was set to 20 mm.

The contact member 17 took a ring shaped with an L shaped cross section. An upper surface of an L shaped step part was brought into annular contact with a lower surface of the ceramic heater 1, and thereby a width of the contact surface with the ceramic heater 1 was set to 3 mm. In addition, a heat resistant resin was for the contact member.

Sample Nos. 331 to 339 were prepared by varying the Lm/Lr ratio of the ceramic heater 1 provided for the above-mentioned wafer heating device. Then, the in-plane temperature difference of the wafer W was tested in the same manner as in Example 13. Results were represented in Table 15.

TABLE 15

| Sample No. | Lm/Lr × 100 (%) | In-plane temperature difference of wafer W (° C.) |
| --- | --- | --- |
| 331 | 20 | 0.21 |
| 332 | 30 | 0.18 |
| 333 | 40 | 0.16 |
| 334 | 50 | 0.15 |

TABLE 15-continued

| Sample No. | Lm/Lr × 100 (%) | In-plane temperature difference of wafer W (° C.) |
| --- | --- | --- |
| 335 | 60 | 0.16 |
| 336 | 80 | 0.18 |
| 337 | 90 | 0.21 |
| 338 | 95 | 0.22 |
| 339 | 120 | 0.27 |

As shown in Table 15, since sample No. 337 had a large Lm/Lr ratio of 120%, an air gap Q in a periphery between the pair of folded arc shaped belts located on the same circumference was widened, so that the temperature of the air gap Q without any resistance heating element 5 was lowered. Thus, it was impossible to efficiently lower the in-plane temperature difference of the wafer W.

In contrast, it could be found to be preferable that sample Nos. 331 to 338 had an Lm/Lr ratio smaller than 100% and the in-plane temperature difference of the wafer was small, i.e. 0.22° C. or less. In addition, since sample Nos. 332 to 336 had an Lm/Lr ratio of 30 to 80%, and an excellent in-plane uniform heating characteristic of the wafer, it was possible to lessen the in-plane temperature difference of the wafer W. The in-plane temperature difference could be further lessened in sample Nos. 333 to 335 having an Lm/Lr ratio of 40 to 60%.

EXAMPLE 16

A silicon carbide sintered compact having thermal conductivity of 80 W/(m·K) was subjected to grinding to thus prepare the plurality of uniform heating plates in a shape of a disc having a thickness of 3 mm and an outer diameter of 330 mm. In order to bond an insulating layer on one main surface of each uniform heating plate, a glass paste prepared by kneading ethyl cellulose as a binder and terpineol as an organic solvent based on the glass powder was laid by a screen printing method, heated at 150° C. to dry the organic solvent, defatted for 30 minutes at 550° C., and then subjected to baking at a temperature of 700 to 900° C. again. Thereby, the insulating layer composed of glass and having a thickness of 200 μm was formed. Subsequently, in order to bond a resistance heating element on the insulating layer, 20% by weight of Au powder, 10% by weight of Pt powder and 70% by weight of glass as a conductive material were printed in a shape of a predetermined quantity, heated at 150° C. to dry the organic solvent, defatted for 30 minutes at 450° C. again, and then subjected to baking at a temperature of 500 to 700° C. Thereby, the resistance heating element having a thickness of 50 μm was formed. The resistance heating element was configured of five patterns quartering its center and outer circumference in a circumferential direction.

The patterns of the resistance heating element prepared as above were divided into 50 places or so, designed resistance values and actually measured resistance values at the respective places were measured through a four-terminal method, and its difference was adjusted in resistance by forming a channel through irradiation of a laser beam. The channel was formed by using a YAG laser available from Nippon Denki Co. The laser beam was processed under the conditions: wavelength of 1.06 μm, pulse frequency of 1 KHz, laser output of 0.5 W, processing speed of 8 mm/sec.

Further, the channel formed under the above-mentioned conditions had a width of about 60 μm, and a depth of about 20 µm. And, an interval, a pitch, between the adjacent channels, which were formed in each group, was about 50 µm, and the maximum number of channels was 13. After the plurality of channels was formed by changing an overlapped state of the laser beam, resistance values were measured and compared with a predetermined resistance value. The laser beam was applied several times so as to reach the predetermined resistance value again, and thereby samples were prepared, which were shorter than and different from the other channels on an outer side along the channels.

Sample Nos. 405 and 406 were prepared by measuring resistance values on both edges of the resistance heating element while forming channels through irradiation of the laser beam until obtaining a predetermined resistance value so that the channels formed by the laser beam were separated from one another without being overlapped.

In addition, sample Nos. 403 and 404 were prepared by measuring resistance values on both edges of the resistance heating element while forming channels through irradiation of the laser beam until a predetermined resistance value was obtained so that the channels formed by the laser beam were continued perpendicular to the belt.

Further, sample Nos. 401 and 402 were prepared by measuring the resistance values again without irradiation of the laser beam onto the resistance heating element after the channels continued perpendicular to the belt were formed, and forming shorter channels along the channels again via the laser beam to have a predetermined resistance value.

The plate shaped body forming the resistance heating element was mounted on a metal case, together with a temperature measurement element, a power supply terminal or the like, and thereby a wafer heating device used for a semiconductor fabrication apparatus was finished. Then, a wafer to which the temperature measurement element was attached was loaded on a mounting surface. The ceramic heater was heated to get the entire wafer to reach an average temperature of 250° C. A difference between the surface temperature deviation of the wafer and a designed resistance value was measured using the wafer attached with the temperature measurement element. Besides, a durability test was performed by applying a voltage by which a temperature of the entire plate shaped body could reach 350° C. in 1 minute, maintaining as it is for 3 minutes, applying a cold heat cycle for 5000 cycles for forcibly cooling down to 40° C. or less in 2 minutes by use of air of 6 kg/mm³ and 80 L/min, and examining any variation of a resistance value at a part forming the channels before and after the cold heat cycle. The resistance value was measured through four-terminal method so that contact resistance could be considered. In addition, as evaluation criteria, in the above durability test, it was determined to be practical if the maximum value of the rate of change in an entire resistance value of the divided resistance heating element 5 was within 5%. If the maximum value exceeds 5%, it was determined to be unpractical.

Results were represented in Table 16.

TABLE 16

| Sample No. | Difference from designed resistance value | Overlapping of laser beam | In-plane temperature difference | Rate of change in resistance after durability |
|---|---|---|---|---|
| 401 | −0.04 Ω | Yes | ±0.18° C. | 0.24% |
| 402 | −0.08 Ω | Yes | ±0.10° C. | 0.42% |
| 403 | −0.17 Ω | Yes | ±0.15° C. | 1.22% |

TABLE 16-continued

| Sample No. | Difference from designed resistance value | Overlapping of laser beam | In-plane temperature difference | Rate of change in resistance after durability |
|---|---|---|---|---|
| 404 | −0.23 Ω | Yes | ±0.18° C. | 1.80% |
| 405 | −0.39 Ω | No | ±0.32° C. | 8.30% |
| 406 | −0.42 Ω | No | ±0.36° C. | 12.40% |

As shown in Table 16, sample Nos. 405 and 406 in which channels formed by the laser beam were spaced apart from one another and substantially in parallel were not preferable, because the in-plane temperature differences of the wafer had great values of ±0.32° C. and ±0.36° C. and the rate of change in resistance after durability test had great values of 8.3% and 12.4%.

In contrast, it could be found that sample Nos. 401 to 404 of the invention, in which belt-like resistance heating elements were provided on plate shaped bodies and thereon the plurality of channels were formed substantially parallel to a length direction of a belt and continued perpendicular to the belt, represented excellent properties. For example, the in-plane temperature differences of the wafer W had a small value within ±0.18° C. and the rates of change in resistance after durability test also had a small value of 1.8% or less.

In addition, sample Nos. 401 and 402 of the invention, in which the resistance value was adjusted by forming channels by the laser beam while measuring the resistance value, and upon completing irradiation of the laser beam, the resistance value was measured and compared with a predetermined resistance value, and then shorter channels were formed again along the channels by the laser beam to have the predetermined resistance value, represented more excellent properties compared with sample Nos. 403 and 404. For example, the rates of change in resistance after durability test were 0.24% and 0.42% when the in-plane temperature differences of the wafer were ±0.08° C. and 0.10° C.

EXAMPLE 17

A silicon carbide sintered compact having thermal conductivity of 80 W/(m·K) was subjected to grinding to thus prepare the plurality of plates 2 in a shape of a disc having a thickness of 4 mm and an outer diameter of 230 mm. In order to bond an insulating layer 4 on one main surface of each plate 2, a glass paste prepared by kneading ethyl cellulose as a binder and terpineol as an organic solvent with glass powder was laid by a screen printing method, heated at 150° C. to dry the organic solvent, defatted for 30 minutes at 550° C., and then subjected to baking at a temperature of 700 to 900° C. again. Thereby, the insulating layer 4 composed of glass and having a thickness of 200 µm was formed. Subsequently, in order to bond a resistance heating element 5 on the insulating layer 4, 20% by weight of Au powder, 10% by weight of Pt powder and 70% by weight of glass as a conductive material were printed by screen painting in a pattern shaped of a predetermined quantity, heated at 150° C. to dry the organic solvent, defatted for 30 minutes at 450° C. again, and then subjected to baking at a temperature of 500 to 700° C. Thereby, the resistance heating element 5 having a thickness of 50 µm was formed. The resistance heating element 5 was configured of five patterns quartering its center and outer circumference in a circumferential direction.

The resistance heating element 5 prepared as above was divided in to the plurality of belts, and then was subjected to measurement of a resistance value. The measured resistance value was compared with a designed resistance value. Then, a YAG laser was used, a beam of which had a wavelength of 1.06 μm, an output of which was changed in a range of 0.2 to 1.0 W, and a processing speed of which was set to a range of 2 to 20 mm/sec. Under these conditions, a channel was formed, and the resistance value of each divided belt was adjusted.

Further, in part, a Zn-based glass paste was screen-printed, and thereby a sample forming a passivation layer 16 on a channel forming edge on the resistance heating element 5 and another sample forming the passivation layer 16 of glass on the whole resistance heating element 5 around an air outlet 12 were prepared.

Then, by applying a voltage by which a temperature of the entire plate shaped body 2 could reach 350° C. in 1 minute, maintaining as it is for 3 minutes, applying a cold heat cycle for 5000 cycles for forcibly cooling down to 40° C. or less for 2 minutes by use of air of 6 kg/mm$^3$ and 80 L/min, any variation of a resistance value was examined at a part forming the channels before and after the cold heat cycle.

The resistance value was measured through four-terminal method so that contact resistance could be considered. In addition, as evaluation criteria, in the above durability test, it was determined to be practical if the maximum value of the resistance rate of change in an entire resistance value of the divided resistance heating element 5 was within 5%. If the maximum value exceeds 5%, it was determined to be unpractical.

A diameter of an arc of an arc shaped portion on an edge of the channel or an initial longest length of a crack was calculated by photographing the edge of the channel with microscope to perform image processing. The diameter of the arc on the edge of the part was obtained by D/AV (diameter of arc shaped portion on the edge/width of channel), wherein D was the average value measuring the diameter of the arc on the edge of the part at three places, and AV was the width of the channel set to an average value of three places of the width of the channel that was formed. Further, with regard to the crack length generated from the edge of the channel, the maximum length in the width direction of the channel with the crack was measured as the longest crack length. Each result was represented in Table 17.

As shown in Table 17, sample No. 501 beyond the range of the invention had a very great rate of change in resistance of 13.2%. This was supposed to be responsible for the following: because a rotational acceleration of a movable mirror 29 was great when the laser processing was terminated and started, the edge of the channel was an acute angle, and stress caused by a thermal expansion difference generated by the cold heat cycle was concentrated on the edge of the channel, and thereby the crack was generated and propagated. And, it could be assumed that this resulted in disconnection of the resistance heating element 5.

In contrast, it could be found that sample Nos. 502 to 509 of the invention had a small rate of change in resistance of 4.3% and was excellent in durability.

Further, it could be found that the rate of change in resistance of sample Nos. 502 and 503, where the diameter of the arc on the edge of the part was within a range of 0.5 to 3 times the width of the channel, was rather greater, i.e. 4.2 to 4.3%. In addition, in sample Nos. 504 to 509 where the diameter of the arc on the edge of the part was within a range of 0.5 to 3 times the width of the channel, they were found to be more preferable in that the rate of change in resistance after a durability test was small, i.e. 3.8% or less. Further, when the crack was less than five as in sample Nos. 506 to 509, the rate of change in resistance was very small, i.e. in a range of 0.2 to 1.3%, this was found to be more preferable. Moreover, it could be found from the evaluation of durability that the length of the crack was more preferably set to 100 μm or less. Besides, in sample No. 508, when the passivation layer was formed on the resistance heating element of the edge of the channel, it was possible to restrain propagation of the crack, the rate of change in resistance was small, i.e. 0.4%, and thereby the durability was greatly improved. In addition, in sample No. 509, when the passivation layer was formed on the resistance heating element around the air outlet, the rate of change in resistance was smallest, i.e. 0.2%, and thereby the durability was more improved. This was supposed to be responsible for the following. It was possible to prevent the crack generated by thermal shock and erosion of the resistance heating element caused by a high pressure of air flow as well.

TABLE 17

| Sample No. | Laser processing speed (mm/s) | Laser output (W) | Shape of edge | Diameter of arc on the edge/width of channel | Number of cracks of initial edge | Length of initial longest crack (μm) | Existence of edge pattern skort | Existence of glass court around air outlet | Rate of change in resistence (%) |
|---|---|---|---|---|---|---|---|---|---|
| 501 | 20 | 0.5 | Acute angle | — | 18 | 178 | No | No | 13.2 |
| 502 | 17 | 0.5 | Arc | 0.4 | 14 | 120 | No | No | 4.3 |
| 503 | 3 | 1.0 | ↑ | 3.2 | 7 | 112 | No | No | 4.3 |
| 504 | 15 | 0.5 | ↑ | 0.5 | 9 | 105 | No | No | 3.8 |
| 505 | 4 | 0.8 | ↑ | 3 | 8 | 82 | No | No | 3.4 |
| 506 | 4 | 0.7 | ↑ | 2.8 | 5 | 79 | No | No | 1.3 |
| 507 | 5 | 0.8 | ↑ | 2.6 | 4 | 66 | No | No | 1.2 |
| 508 | 10 | 0.5 | ↑ | 1.5 | 3 | 35 | Yes | No | 0.4 |
| 509 | 10 | 0.5 | ↑ | 1.2 | 0 | 0 | Yes | Yes | 0.2 |

The invention claimed is:

1. A heater comprising:
   a plate shaped body and
   a belt-like resistance heating element formed on a surface of the plate shaped body,
   wherein the belt-like resistance heating element is provided with channels,
   wherein the plate shaped body is provided with positioning marks located at a position that has no influence on a heating characteristic on the surface thereof,
   wherein the positioning marks are formed on a position corresponding to the channels, and wherein each of the positioning marks is not connected to the resistance heating element, or the one terminal of each of the positioning marks is connected to the resistance heating element and the other terminal thereof is not connected to the resistance heating element.

2. The heater according to claim 1, wherein the channels are provided in the belt-like resistance for adjusting a resistance value of the resistance heating element.

3. The heater according to claim 1, wherein the plate shaped body is made of ceramics.

4. The heater according to claim 1, wherein the positioning mark is a protrusion protruded from the belt like resistance heating element in a lateral direction.

5. The heater according to claim 1, wherein the resistance heating element is made of a composite material of an insulating composition and a conductive composition, and the conductive composition on the surface of the channel has a density less than that of an interior of the resistance heating element.

6. The heater according to claim 5, wherein the conductive composition has an average particle size of 1 to 20 μm on the surface of the channel.

7. The heater according to claim 5, wherein the resistance heating element has the insulating composition enclosed by conductive particles made of the conductive composition.

8. The heater according to claim 1, wherein the resistance heating element is formed in an approximately concentric circular shape on the circular plate shaped body, and the resistance heating element is provided with a group of channels at a substantially center in a width direction thereof.

9. The heater according to claim 1, wherein the resistance heating element is formed in an approximately concentric circular shape on a circular plate shaped body, and the channel is unilaterally distributed on the inner side in the radial direction of the plate shaped body or the outer side in the radial direction of the plate shaped body on the resistance heating element.

10. The heater according to claim 1, wherein the resistance heating element is provided with a plurality of channels extended along a length direction thereof and arranged in a direction substantially perpendicular to the length direction or in the width direction thereof.

11. The heater according to claim 10, wherein some of the plurality of channels have a length different from the others.

12. The heater according to claim 10, wherein among the plurality of channels, the channel located on the outer side in the width direction of the resistance heating elements has a length different from the others.

13. The heater according to claim 1, wherein the channel has an edge of an arc shape.

14. The heater according to claim 13, wherein the arc shaped portion on the edge of the channel has a radius of curvature corresponding to the circle diameter of 0.5 to 3 times a width of the channel.

15. The heater according to claim 13, wherein the edge of the channel is formed with a passivation layer.

16. The heater according to claim 1, wherein the channel is formed by means of a laser.

17. A heater comprising:
   a plate shaped body and a belt-like resistance heating element formed on a surface of the plate shaped body,
   wherein the belt-like resistance heating element is provided with channels,
   wherein the plate shaped body is provided with positioning marks on the surface thereof,
   wherein the positioning marks are formed on a position corresponding to the channels, and wherein the resistance heating element has a plurality of groups consisting of a plurality of channels that are formed in a substantially equal length along a length direction of the resistance heating element and also arranged in a direction substantially perpendicular to the length direction, and an interval between adjacent groups is smaller than width of the resistance heating element.

18. The heater according to claim 17, wherein the interval between the adjacent groups of channels is 1 mm or less.

19. A wafer heating device comprising:
   a heater comprising a plate shaped body having a pair of main surfaces; one main surface being provided with a plurality of resistance heating elements thereon and the other serving as a mounting surface for mounting a wafer wherein the belt-like resistance heating element is provided with channels,
   wherein the plate shaped body is provided with positioning marks on the surface thereof, and
   wherein the positioning marks are formed on a position corresponding to the channels; a power supply part for independently supplying electric power to the plurality of resistance heating elements; and a metal case enclosing the power supply part,
   wherein the plurality of resistance heating elements are provided with a circular resistance heating element zone formed at the center of the plate shaped body, and a plurality of annular resistance heating element zones formed in a shape of a concentric circle on an outer side thereof, and
   wherein the annular resistance heating element zones located at least at the outermost circumference have a plurality of positioning marks located on a plurality of straight lines extending from a center with a substantially equal center angle therebetween on the concentric circle.

20. A wafer heating device comprising:
   a heater comprising a plate shaped body having a pair of main surfaces, one main surface being provided with a plurality of resistance heating elements thereon and the other main surface serving as a mounting surface for mounting a wafer wherein the belt-like resistance heating element is provided with channels,
   wherein the plate shaped body is provided with positioning marks on the surface thereof, and
   wherein the positioning marks are formed on a position corresponding to the channels, and further wherein the positioning mark is a protrusion protruded from the belt-like resistance heating element in a lateral direction; a power supply part for independently supplying electric power to the plurality of resistance heating elements; and a metal case enclosing the power supply part,
   wherein the plurality of resistance heating elements has a circular resistance heating element zone formed at the center of the plate shaped body, and a plurality of annular resistance heating element zones formed in a shape of a concentric circle on an outer side thereof, and wherein the annual resistance heating element zones located at least at the outermost circumference have a plurality of protrusions located on a plurality of straight lines extending from a center with a substantially equal central angle therebetween on the concentric circle.

21. A heater comprising:

a plate shaped body and a belt-like resistance heating element formed on a surface of the plate shaped body, wherein the belt-like resistance heating element is provided with a plurality of channels being substantially parallel to the length direction of the belt of the resistance heating element and the plurality of channels are continuous in the direction perpendicular to the belt of belt-like resistance heating element, wherein the plate shaped body is provided with positioning marks on the surface thereof, and wherein the positioning marks are formed on a position corresponding to the channels.

22. The heater according to claim 21, wherein the channels are provided in the belt-like resistance for adjusting a resistance value of the resistance heating element.

23. The heater according to claim 21, wherein the plate shaped body is made of ceramics.

24. The heater according to claim 21, wherein the positioning mark is a protrusion protruded from the belt-like resistance heating element in a lateral direction.

25. The heater according to claim 21, wherein the resistance heating element is made of a composite material of an insulating composition and a conductive composition, and the conductive composition on the surface of the channel has a density less than that of an interior of the resistance heating element.

26. The heater according to claim 25, wherein the conductive composition has an average particle size of 1 to 20 µm on the surface of the channel.

27. The heater according to claim 25, wherein the resistance heating element has the insulating composition enclosed by conductive particles made of the conductive composition.

28. The heater according to claim 21, wherein the resistance heating element is provided with a plurality of channels extended along a length direction thereof and arranged in a direction substantially perpendicular to the length direction or in the width direction thereof.

29. The heater according to claim 21, wherein the channel is formed by means of a laser.

30. A wafer heating device comprising:

a heater according comprising a plate shaped body having a pair of main surfaces, one main surface being provided with a plurality of resistance heating elements thereon and the other main surface serving as a mounting surface for mounting a wafer wherein the belt-like resistance heating element is provided with channels, wherein the plate shaped body is provided with positioning marks on the surface thereof, wherein the positioning marks are formed on a position corresponding to the channels, and wherein the positioning mark is a protrusion protruded from the belt-like resistance heating element in a lateral direction;

a power supply part for independently supplying electric power to the plurality of resistance heating elements; and a metal case enclosing the power supply part, wherein the plurality of resistance heating elements has a circular resistance heating element zone formed at the center of the plate shaped body, and a plurality of annular resistance heating element zones formed in a shape of a concentric circle on an outer side thereof, and wherein the annular resistance heating element zones located at least at the outermost circumference have a plurality of protrusions located on a plurality of straight lines extending from a center with a substantially equal central angle therebetween on the concentric circle.

* * * * *